US008749055B2

(12) United States Patent
Yamagishi et al.

(10) Patent No.: US 8,749,055 B2
(45) Date of Patent: Jun. 10, 2014

(54) SEMICONDUCTOR DEVICE WITH RESIN MOLD

(75) Inventors: Tetsuto Yamagishi, Nukata-gun (JP); Tohru Nomura, Kariya (JP); Norihisa Imaizumi, Toyokawa (JP); Yasutomi Asai, Okazaki (JP)

(73) Assignee: DENSO CORPORATION, Kariya (JP)

( * ) Notice: Subject to any disclaimer, the term of this patent is extended or adjusted under 35 U.S.C. 154(b) by 1 day.

(21) Appl. No.: 13/449,484

(22) Filed: Apr. 18, 2012

(65) Prior Publication Data

US 2012/0223444 A1 Sep. 6, 2012

Related U.S. Application Data

(62) Division of application No. 12/314,345, filed on Dec. 9, 2008, now Pat. No. 8,207,607.

(30) Foreign Application Priority Data

| Dec. 14, 2007 | (JP) | ................................. | 2007-323065 |
| Aug. 5, 2008 | (JP) | ................................. | 2008-201839 |
| Aug. 22, 2008 | (JP) | ................................. | 2008-213862 |

(51) Int. Cl.
*H01L 23/28* (2006.01)
*H01L 21/56* (2006.01)

(52) U.S. Cl.
USPC ............ 257/724; 257/E23.116; 257/E23.003; 257/E21.504; 257/680; 257/685; 257/686; 257/723; 257/773; 257/774; 257/777; 257/787

(58) Field of Classification Search
USPC ......... 257/724, 680, 685, 686, 723, 773, 774, 257/777, 787, E21.705, E23.003, E23.116, 257/E21.504

See application file for complete search history.

(56) References Cited

U.S. PATENT DOCUMENTS

| 5,365,107 A | 11/1994 | Kuraishi et al. |
| 5,880,403 A | 3/1999 | Czajkowski et al. |
| 5,924,191 A | 7/1999 | Credle et al. |

(Continued)

FOREIGN PATENT DOCUMENTS

| JP | A-04-277662 | 10/1992 |
| JP | A-04-324963 | 11/1992 |

(Continued)

OTHER PUBLICATIONS

Notice of Reason for Refusal issued on Apr. 6, 2010 by the Japan Patent Office in corresponding Japanese Application No. 2008-201839 (English translation enclosed).

(Continued)

*Primary Examiner* — Alexander Oscar Williams
(74) *Attorney, Agent, or Firm* — Posz Law Group, PLC

(57) ABSTRACT

An electronic device includes: a substrate having first and second surfaces, wherein the first surface is opposite to the second surface; a first electronic element mounted on the first surface of the substrate; a second electronic element mounted on the second surface of the substrate; and a resin mold sealing the first electronic element and the first surface of the substrate. The resin mold further seals the second electronic element on the second surface of the substrate. The second surface of the substrate has a portion, which is exposed from the resin mold. The second electronic element is not disposed on the portion of the second surface.

9 Claims, 30 Drawing Sheets

(56) References Cited

U.S. PATENT DOCUMENTS

| | | | |
|---|---|---|---|
| 6,678,167 | B1 | 1/2004 | Degani et al. |
| 7,208,816 | B2 | 4/2007 | Kawakami et al. |
| 7,294,912 | B2 | 11/2007 | Takeuchi et al. |
| 7,405,469 | B2 * | 7/2008 | Kagii et al. ............ 257/676 |
| 7,416,919 | B2 | 8/2008 | Chou |
| 2002/0179974 | A1 | 12/2002 | Noda et al. |
| 2003/0002260 | A1 * | 1/2003 | Hasebe et al. ............ 361/720 |
| 2007/0148341 | A1 | 6/2007 | Kawakami et al. |
| 2007/0212813 | A1 | 9/2007 | Fay et al. |
| 2008/0170372 | A1 | 7/2008 | Kirigaya |
| 2008/0192447 | A1 | 8/2008 | Koyama et al. |
| 2009/0152714 | A1 * | 6/2009 | Yamagishi et al. ......... 257/724 |
| 2010/0176498 | A1 * | 7/2010 | Lee et al. ............ 257/675 |
| 2010/0240175 | A1 | 9/2010 | Hong |

FOREIGN PATENT DOCUMENTS

| | | |
|---|---|---|
| JP | U-06-38249 | 5/1994 |
| JP | A-09-82883 | 3/1997 |
| JP | A-2001-257306 | 9/2001 |
| JP | A-2001-352185 | 12/2001 |
| JP | A-2003-007933 | 1/2003 |
| JP | A-2006-147918 | 6/2006 |
| JP | A-2006-303217 | 11/2006 |
| JP | A-2007-165585 | 6/2007 |

OTHER PUBLICATIONS

Office Action date Jun. 22, 2010 from Japan Patent Office in corresponding JP Application No. 2008-213862 (English translation enclosed).

* cited by examiner

SEMICONDUCTOR DEVICE WITH RESIN MOLD

CROSS REFERENCE TO RELATED APPLICATIONS

This application is a divisional of U.S. application Ser. No. 12/314,345 filed on Dec. 9, 2008, allowed on Mar. 8, 2012, which is based on and claims priority to Japanese Patent Applications No. 2007-323065 filed on Dec. 14, 2007, No. 2008-201839 filed on Aug. 5, 2008 and No. 2008-213862 filed on Aug. 22, 2008, the disclosures of which are incorporated herein by reference.

FIELD OF THE INVENTION

The present invention relates to a semiconductor device and a method for manufacturing a semiconductor device.

BACKGROUND OF THE INVENTION

An electronic device is proposed in Patent Documents 1, 2, and 3, for example. A first electronic component is mounted on a first surface of a ceramic substrate. A metal plate such as a heat sink is bonded to a second surface opposite to the first surface of the ceramic substrate. A molding resin seals the ceramic substrate and the first electronic component so as to expose a surface opposite to a bonding surface of the metal plate.

Patent Document 1: JP-2003-7933-A
Patent Document 2: JP-2006-147918-A
Patent Document 3: JP-2006-222406-A corresponding to U.S. Pat. No. 7,294,912

Conventionally, as mentioned above, electronic components are mounted on one surface of the ceramic substrate. The inventors came up with the idea of mounting electronic components on the other surface opposite to a metal plate of the ceramic substrate. This makes it possible to improve the density of mounting components on a substrate. We examined prototypes based on that idea.

FIG. 30 is a schematic sectional view showing an electronic device made by the inventors as a proto type according to a related art. In FIG. 30, a metal plate 50 is arranged opposite to one surface of a ceramic substrate 10 via an adhesive J1. The ceramic substrate 10 and the metal plate 50 are bonded to each other.

A first electronic component 20 is mounted on a first surface of the ceramic substrate 10. A second electronic component 30 is mounted on a second surface. A molding resin 80 such as epoxy resin is used to seal the ceramic substrate 10, the first electronic component 20, and the metal plate 50. A bonding surface of the metal plate 50, that is, the surface opposite to the ceramic substrate 10, is exposed from the molding resin 80.

A depressed portion 50a is provided at a portion of the bonding surface on the metal plate 50 corresponding to the second electronic component 30. The second electronic component 30 is inserted into the depressed portion 50a. The second electronic component 30 in the depressed portion 50a is sealed with the adhesive J1.

The adhesive for bonding the ceramic substrate 10 to the metal plate 50 is, for example, silicon resin that is soft and flexible and shows a smaller Young's modulus than the molding resin 80. When the depressed portion 50a is not provided, the adhesive J1 becomes thicker by the height of the second electronic component 30. There may be a possibility of increasing thermal resistance and finally decreasing radiation performance.

A general method is used to manufacture such electronic device. The electronic components 20 and 30 are mounted on the ceramic substrate 10. The metal plate 50 is bonded to the ceramic substrate 10 and is placed in a die. The resin is injected into the die for sealing. This package shows a large mold structure including the ceramic substrate 10. A relatively large pressure (e.g., 7 to 20 MPa) is needed to inject the resin so as to completely fill the molding resin.

The metal plate 50 is bonded to the substrate 10 and is partially exposed from the molding resin 80. The exposed surface of the metal plate 50 is pressed against the die during the mold process. A mold pressure of the resin is applied to the ceramic substrate 10 from the one surface.

According to the above-mentioned prototype, the soft adhesive J1 is filled in the depressed portion 50a of the metal plate 50. The above-mentioned mold pressure may easily warp the ceramic substrate 10 so as to depress a portion of the ceramic substrate 10 corresponding to the depressed portion 50a toward the depressed portion 50a. The warpage of the substrate 10 may cause the substrate 10 to crack.

The above-mentioned problem may apply to not only ceramic substrates but also resin substrates such as printed substrates and metal substrates. It may be well necessary to consider a substrate crack due to the above-mentioned mold pressure applied from one surface of the substrate also in the case of half molding the substrate without bonding the metal plate to the substrate. The above-mentioned problem is considered to be common to electronic devices that half mold electronic components on both surfaces of the substrate.

Further, Patent Document 4 proposes a conventional car electronic circuit device. Specifically, Patent Document 4 proposes a device that is mounted with circuit elements on the surface side of a substrate. A lead frame island is bonded to the reverse side of the substrate. The substrate and the circuit elements are sealed with sealing resin so as to expose the island.

Such structure includes the substrate bonded with the island on the reverse side and is placed at a molding die including an upper mold and a lower mold. A resin is poured from a plunger into the molding die to mold the resin. The structure is so formed that the substrate is sandwiched between the sealing resin and the island.

Patent Document 4: JP-2001-352185 A

According to the conventional technology, however, the substrate is structured to be sandwiched between the sealing resin and the island. The substrate surface is subjected to a molding pressure during resin seal. At this time, the resin molding pressure may deform the substrate depending on a substrate state before the resin seal.

Specifically, the substrate deformation is caused by a void contained in an adhesive for bonding the island to the reverse side of the substrate. The void occurs when the adhesive is applied to the island or the reverse side of the substrate, the adhesive is hardened by hardening reaction gas, or vapor contained in the adhesive expands.

Let us consider the resin seal using the resin that contains voids as mentioned above. The lower mold presses the island. The resin molding pressure is applied to the island from the surface of the substrate. The adhesive is sandwiched between the island and the reverse side of the substrate. A strong compression force is applied to the adhesive. Accordingly, the reverse side of the substrate is subjected to a strong repulsive force.

Part of the adhesive corresponding to the void contains no adhesive and therefore causes no repulsive force of the adhesive. On the other hand, the substrate surface is subjected to a molding pressure of the resin. Unbalanced forces are applied to both sides of the substrate. An excess force is applied to the substrate and components mounted thereon. This warps the substrate, deforms the components, or causes a component failure.

Just a single void, when it is considerably big, may cause the above-mentioned phenomenon. Multiple voids, when gathered, may cause the same result.

As mentioned above, the substrate is deformed due to occurrence of a void when the substrate is so structured as to be sandwiched between the sealing resin and the island. Similarly to the void, the substrate is deformed when resin seal is applied so as to expose the reverse side of the substrate.

In this case, a gap is formed between the lower mold and the substrate. The gap functions like a void. As mentioned above, unbalanced forces are applied to both sides of the substrate to deform or damage the substrate. In particular a ceramic substrate is easily bent at the outer edge. The bent outer edge of the ceramic substrate is pushed toward the lower mold and is destroyed due to a molding pressure of the resin.

SUMMARY OF THE INVENTION

In view of the above-described problem, it is an object of the present disclosure to provide a semiconductor device. It is another object of the present disclosure to provide a method for manufacturing a semiconductor device.

According to a first aspect of the present disclosure, an electronic device includes: a substrate having first and second surfaces, wherein the first surface is opposite to the second surface; a first electronic element mounted on the first surface of the substrate; a second electronic element mounted on the second surface of the substrate; and a resin mold sealing the first electronic element and the first surface of the substrate. The resin mold further seals the second electronic element on the second surface of the substrate. The second surface of the substrate has a portion, which is exposed from the resin mold. The second electronic element is not disposed on the portion of the second surface.

According to this configuration, it is possible to prevent the substrate from cracking during a mold process. Thus, a molding resin stress applied on the substrate from one surface of the substrate during a mold process is reduced.

According to a second aspect of the present disclosure, an electronic device includes: a ceramic substrate having first and second surfaces, wherein the first surface is opposite to the second surface; a first electronic element mounted on the first surface of the ceramic substrate; a metal plate bonded to a first portion of the second surface of the ceramic substrate via an adhesive; a second electronic element mounted on a second portion of the second surface of the ceramic substrate; and a resin mold sealing the ceramic substrate and the first and second electronic elements so as to expose the metal plate. The first portion of the second surface is different from the second portion of the second surface.

According to this configuration, it is possible to prevent the ceramic substrate from cracking during a mold process.

According to a third aspect of the present disclosure, a manufacturing method of an electronic device includes: mounting a first electronic element on a first surface of a ceramic substrate; bonding a metal plate to a first portion of a second surface the ceramic substrate, wherein the second surface is opposite to the first surface; mounting a second electronic element on a second portion of the second surface of the ceramic substrate, wherein the second portion of the second surface is different from the first portion of the second surface; and sealing the ceramic substrate and the first and second electronic elements with a resin mold so as to expose the metal plate. The metal plate is bonded to the ceramic substrate via an adhesive. The second portion of the second surface is different from the first portion of the second surface, and the first and second electronic elements are simultaneously sealed with the resin mold.

According to this configuration, it is possible to prevent the ceramic substrate from cracking during a mold process.

According to a fourth aspect of the present disclosure, a manufacturing method of an electronic device includes: mounting a first electronic element on a first surface of a ceramic substrate; bonding a metal plate to a first portion of a second surface of the ceramic substrate, wherein the second surface is opposite to the first surface; mounting a second electronic element on a second portion of the second surface of the ceramic substrate, wherein the second portion of the second surface is different from the first portion of the second surface; sealing the ceramic substrate and the first electronic element with a first resin mold so as to expose the metal plate; and sealing the second electronic element with a second resin mold at a molding temperature equal to a molding temperature of the first resin mold. The second resin mold has Young's modulus equal to or larger than 100 MPa, and the metal plate is bonded to the ceramic substrate via an adhesive.

According to this configuration, it is possible to prevent the ceramic substrate from cracking during a mold process.

According to a fifth aspect of the present disclosure, a manufacturing method of an electronic device includes: mounting a first electronic element on a first surface of a ceramic substrate; bonding a metal plate to a first portion of a second surface of the ceramic substrate, wherein the second surface is opposite to the first surface; mounting a second electronic element on a second portion of the second surface of the ceramic substrate, wherein the second portion of the second surface is different from the first portion; sealing the ceramic substrate, the metal plate and the first and second electronic elements with a resin mold; and removing a portion of the resin mold to expose the metal plate. The metal plate is bonded to the ceramic substrate via an adhesive.

According to the above configuration, it is possible to prevent the ceramic substrate from cracking during a mold process.

According to a sixth aspect of the present disclosure, an electronic device includes: a substrate that includes a first surface and a second surface opposite to the first surface; an electronic element mounted on a first portion of the first surface of the substrate; a metal plate bonded to the second surface of the substrate so as to expose a second portion of the second surface of the substrate opposite to the electronic element; and a resin mold that seals the first surface of the substrate and seals the second surface of the substrate so as to expose the metal plate. The resin mold sandwiches the first portion of the first surface and the second portion of the second surface of the substrate.

According to the above device, it is possible to prevent deformation of the substrate and the electronic element. Thus, a structure is provided such that the structure prevents the substrate from being deformed due to a molding pressure of resin mold.

According to a seventh aspect of the present disclosure, an electronic device includes: a substrate that includes a first surface and a second surface opposite to the first surface; an electronic element disposed in the substrate; wherein the first surface includes a first portion corresponding to the electronic element; a metal plate bonded to a second surface of the substrate so as to expose a second portion of the second surface of the substrate opposite to the first portion of the first surface; and a resin mold that seals the first surface of the substrate and seals the second surface of the substrate so as to expose the metal plate. The resin mold sandwiches the first portion of the first surface and the second portion of the second surface of the substrate.

According to the above device, it is possible to prevent deformation of the substrate and the electronic element. Thus, a structure is provided such that the structure prevents the substrate from being deformed due to a molding pressure of resin mold.

According to an eighth aspect of the present disclosure, an electronic device includes; a ceramic substrate having a first surface and a second surface opposite to the first surface; an electronic element is mounted on the first surface; and a resin mold that seals the first surface of the ceramic substrate and seals the second surface of the ceramic substrate so as to expose an inner portion of the second surface. The first surface has an outer edge, and the second surface has an outer edge, and the resin mold sandwiches the outer edge of the first surface and the outer edge of the second surface.

According to the above structure, it is possible to prevent deformation of the ceramic substrate and the electronic element.

According to a ninth aspect of the present disclosure, an electronic device includes: a ceramic substrate having a first surface and a second surface opposite to the first surface; an electronic element mounted on an inner portion of the second surface; and a resin mold that seals the first surface of the ceramic substrate and seals the second surface of the ceramic substrate so as to expose the electronic element and the inner portion of the second surface. The first surface has an outer edge ($391a$), and the second surface has an outer edge ($392b$), and the resin mold sandwiches the outer edge of the first surface and the outer edge of the second surface.

According to the above structure, the electronic element inappropriate for molding can be prevented from characteristic degradation or failure due to a molding pressure of the resin mold.

According to a tenth aspect of the present disclosure, a manufacturing method of an electronic device includes: mounting an electronic element on a first portion of a first surface of a substrate; bonding a metal plate on a second surface of the substrate so as to expose a second portion of the second surface of the substrate opposite to the electronic element; wherein the second surface is opposite to the first surface; and sealing the first surface of the substrate and the second surface of the substrate with a resin mold so as to expose the metal plate. The resin mold sandwiches the first portion of the first surface and the second portion of the second surface of the substrate.

According to the above method, the structure can prevent a deflected force from being applied to the substrate and prevent deformation of the substrate and the electronic element.

According to an eleventh aspect of the present disclosure, a manufacturing method of an electronic device includes: forming an electronic element in a substrate; wherein the substrate includes a first surface and a second surface opposite to the first surface; and the first surface includes a first portion corresponding to the electronic element; bonding a metal plate to the second surface of the substrate so as to expose a second portion of the second surface of the substrate opposite to the first portion of the first surface; and sealing the first surface of the substrate and the second surface of the substrate with a resin mold so as to expose the metal plate. The resin mold sandwiches the first portion of the first surface and the second portion of the second surface of the substrate.

According to the above method, the structure can prevent a deflected force from being applied to the substrate and prevent deformation of the substrate and the electronic element.

According to a twelfth aspect of the present disclosure, a manufacturing method of an electronic device includes: mounting an electronic element on a first surface of a ceramic substrate; wherein the ceramic substrate has the first surface and a second surface opposite to the first surface; and sealing the first surface of the ceramic substrate and the second surface of the ceramic substrate with a resin mold so as to expose an inner portion of the second surface. The first surface has an outer edge ($391a$), and the second surface has an outer edge ($392b$), and the resin mold sandwiches the outer edge of the first surface and the outer edge of the second surface.

According to the structure, it is possible to prevent deformation of the ceramic substrate and the electronic element.

According to a thirteenth aspect of the present disclosure, a manufacturing method of an electronic device includes: mounting an electronic element on an inner portion of a second surface of a ceramic substrate; wherein the ceramic substrate has a first surface and the second surface opposite to the first surface; sealing the first surface of the ceramic substrate and the second surface of the ceramic substrate with a resin mold so as to expose the electronic element and the inner portion of the second surface. The first surface has an outer edge ($391a$), and the second surface has an outer edge ($392b$), and the resin mold sandwiches the outer edge of the first surface and the outer edge of the second surface.

The ceramic substrate can be prevented from deformation. Since the electronic element inappropriate for molding is not sealed with the resin mold, it is possible to prevent the electronic element from characteristic degradation or failure due to a molding pressure of the resin mold.

BRIEF DESCRIPTION OF THE DRAWINGS

The above and other objects, features and advantages of the present invention will become more apparent from the following detailed description made with reference to the accompanying drawings. In the drawings:

FIGS. 1A and 1B show an electronic device according to a first embodiment, in which FIG. 1A is a schematic sectional view and FIG. 1B is a schematic plan view viewed from the bottom of FIG. 1A;

FIGS. 18A and 18B show an electronic device according to an eighth embodiment, in which FIG. 18A is a schematic sectional view and FIG. 18B is a schematic plan view viewed from the bottom of FIG. 18A;

FIGS. 20A and 20B are schematic sectional views showing still another example of the electronic device according to the eighth embodiment, in which FIG. 20A shows an example of wire bonding connection and FIG. 20B shows an example of tape connection;

FIGS. 22A and 22B show a first example of an electronic device according to a tenth embodiment, in which FIG. 22A is a schematic sectional view and FIG. 22B is a schematic plan view viewed from the bottom of FIG. 22A;

FIGS. 23A and 23B show a second example of the electronic device according to the tenth embodiment, in which FIG. 22A is a schematic sectional view and FIG. 22B is a schematic plan view viewed from the bottom of FIG. 22A;

FIGS. 24A and 24B show a first example of an electronic device according to an eleventh embodiment, in which FIG. 24A is a schematic sectional view and FIG. 24B is a schematic plan view viewed from the bottom of FIG. 24A;

FIGS. 25A and 25B show a second example of the electronic device according to the eleventh embodiment, in which FIG. 25A is a schematic sectional view and FIG. 25B is a schematic plan view viewed from the bottom of FIG. 25A;

FIGS. 26A and 26B show an electronic device according to a twelfth embodiment, in which FIG. 26A is a schematic sectional view and FIG. 26B is a schematic plan view viewed from the bottom of FIG. 26A;

FIGS. 27A and 27B show an electronic device according to a thirteenth embodiment, in which FIG. 27A is a schematic sectional view and FIG. 27B is a schematic plan view viewed from the bottom of FIG. 27A;

FIGS. 28A and 28B show an electronic device according to a fourteenth embodiment, in which FIG. 28A is a schematic sectional view and FIG. 28B is a schematic plan view viewed from the bottom of FIG. 28A;

FIGS. 31A and 31B show an electronic device according to a sixteenth embodiment, in which FIG. 31A is a sectional view and FIG. 31B is a schematic plan view of the electronic device viewed from the bottom of FIG. 31A;

FIGS. 35A and 35B show an electronic device according to a nineteenth embodiment, in which FIG. 35A is a sectional view and FIG. 35B is a schematic plan view of the electronic device viewed from the bottom of FIG. 35A;

DETAILED DESCRIPTION OF THE PREFERRED EMBODIMENTS

First Embodiment

Figure 1A:
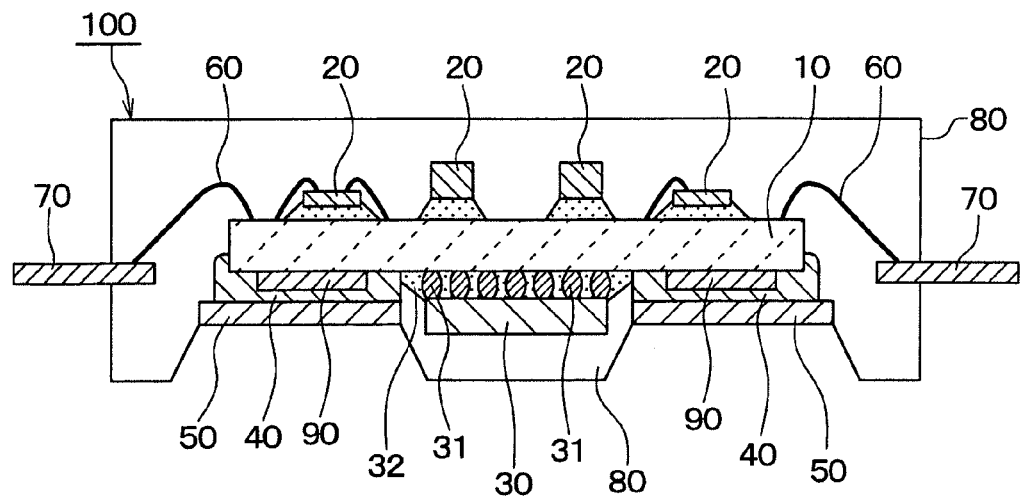
Figure 1B:
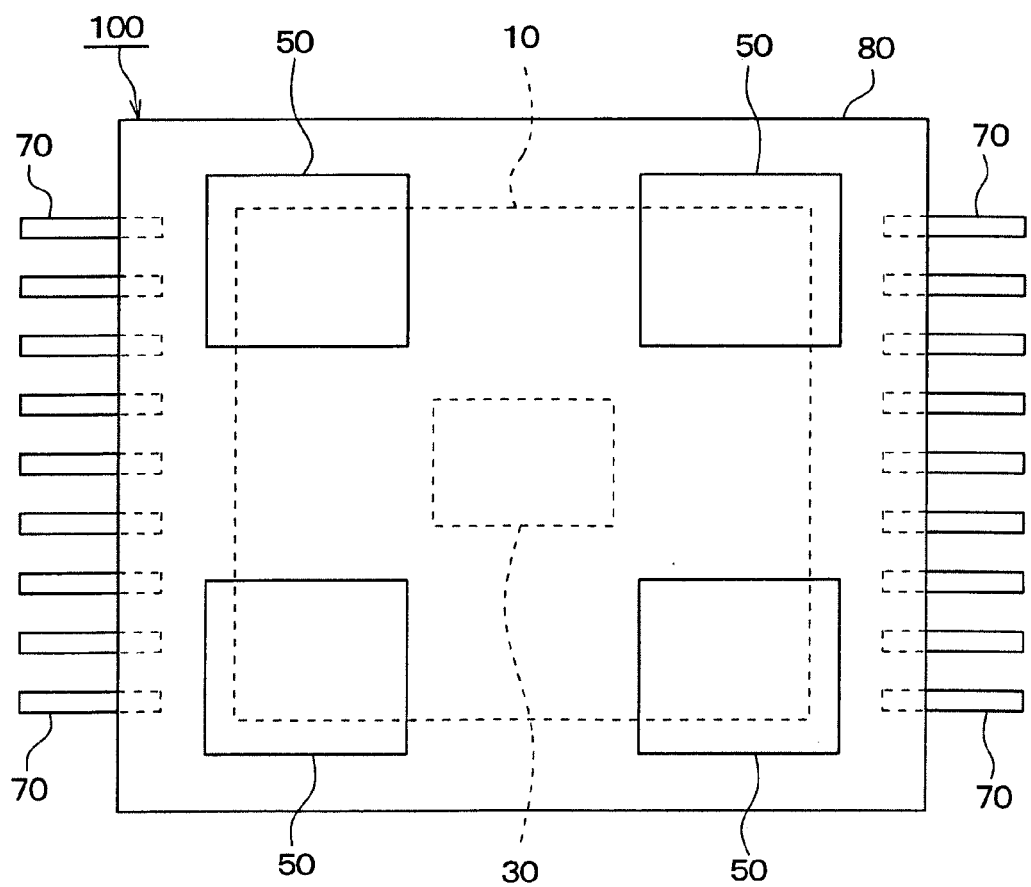

FIGS. 1A and 1B show an electronic device 100 according to a first embodiment, in which FIG. 1A is a schematic sectional view and FIG. 1B is a schematic plan view viewed from the bottom of FIG. 1A.

The electronic device 100 according to the embodiment mainly includes a ceramic substrate 10, a first electronic component 20, a second electronic component 30, a metal plate 50, a lead frame 70, and a molding resin 80. The first electronic component 20 is mounted on a first surface of the ceramic substrate 10. The second electronic component 30 is mounted on a second surface of the ceramic substrate 10. The metal plate 50 is bonded to the second surface of the ceramic substrate 10 through an adhesive 40. The lead frame 70 is connected to the ceramic substrate 10 through a wire 60. The molding resin 80 seals the components 10 through 70.

As shown in FIGS. 1A and 1B, the electronic device 100 is a square plate-shaped mold package. For example, the package size is approximately 50×50×6.6 mm depending on mounted electronic components, a circuit scale, or types of the electronic components.

The ceramic substrate 10 is a single-layer or multilayer substrate made of ceramics such as alumina and is configured as a wiring substrate having a wiring (not shown). The ceramic substrate 10 is shaped into a square plate in plan view. A first surface of the ceramic substrate 10 corresponds to a first surface of the substrate 10 and a second surface thereof corresponds to a second surface of the substrate 10.

Preferably, the ceramic substrate 10 is an alumina laminate substrate indicating linear expansion coefficient al between 5 and 8 ppm/° C. The ceramic substrate 10 is preferably sized 40 by 40 mm or smaller and is 0.8 mm thick or more.

The first electronic component 20 is mounted on a first surface (upper surface in FIG. 1A) of the ceramic substrate 10. The first electronic component 20 is electrically connected to the ceramic substrate 10 via a bonding wire such as Al or Au or a die mount material such as solder or electrically conductive adhesive. The first electronic component 20 includes components such as a coil, power device, control device, capacitor, and oscillator.

The second electronic component 30 is mounted on a second surface (lower surface in FIG. 1A) opposite to the first surface and represents a control device or a resistor, for example. In FIGS. 1A and 1B, the second electronic component 30 is a flip chip as a control device and is electrically connected to the substrate 10 via a bump 31. An underfill 32 of epoxy resin, for example, is filled between the second electronic component 30 and the substrate 10.

The adhesive 40 is used to bond the metal plate 50 to a portion of the second surface of the ceramic substrate 10 except a portion for mounting the second electronic component 30. According to the embodiment, the metal plate 50 is made by processing the same plate material as the lead frame 70, that is, a lead frame material, and is configured as an island for the lead frame material. In this embodiment, the thickness of the metal plate 50 is equivalent to that of the lead frame 70.

A Cu lead frame material is widely used for the metal plate 50 and the lead frame 70 in consideration for radiation performance. However, the Cu material causes a large difference in linear expansion coefficients from the ceramic substrate 10. A Fe material may be used for the purpose of consistency in the linear expansion coefficients.

Specifically, a preferable lead frame material indicates linear expansion coefficient $\alpha$ of smaller than or equal to 11 and Young's modulus E of smaller than 200 GPa in consideration for consistency of the linear expansion coefficient with the substrate 10 and a stress at the substrate edge. More preferably, the lead frame material may be conditioned to be $\alpha<9$ GPa and E<150 GPa.

In consideration for weldability, the lead frame material may be plated with PPF (Ni/Pd/Au) such as electrolytic nickel, Sn, and Au. The material surface may be roughened to prevent the molding resin 80 from peeling off.

The metal plate 50 is positioned correspondingly to a heater element such as a power element belonging to the first electronic component 20 mounted on the first surface 311 of the ceramic substrate 10. The heater element is connected to the first surface of the ceramic substrate 10 via Ag paste. For reliable heat transfer, the Ag paste preferably indicates a thermal conductivity of greater than or equal to 4 W/m·K.

According to the embodiment, a resistor 90 is provided at a portion of the second surface of the ceramic substrate corresponding to the metal plate 50. The metal plate 50 is provided via the adhesive 40 so as to cover the resistor 90.

The adhesive 40 for bonding the metal plate 50 uses silicone resin as a main component, for example. The adhesive 40 preferably indicates 4 w/m·K or more so as to transfer heat on the ceramic substrate 10. The adhesive 40 is also used to seal the resistor 90. The adhesive 40 preferably indicates Young's modulus E of smaller than 8 GPa to protect the resistor 90.

The wire 60 is provided as an Au or Al bonding wire and is formed by ordinary wire bonding. The molding resin 80 uses a mold material made of epoxy resin generally used for the field of such electronic devices. Transfer mold technique is used to form the molding resin 80.

The molding resin 80 often uses a resin with heat expansion coefficient $\alpha$ ranging between 8 and 14 for consistency of heat expansion coefficient $\alpha$ between each member and the ceramic substrate 10. The resin needs to feature a long gel time and low viscosity in consideration for filling efficiency of the molding resin 80 on the second surface of the ceramic substrate 10. The molding resin 80 preferably indicates a high glass transition point Tg for use under a high temperature.

The following shows a preferred example of the molding resin 80. For use with the metal plate 50 and the lead frame 70 made of Cu, the molding resin 80 preferably indicates such properties as linear expansion coefficient $\alpha1<17$, Young's modulus E1<20 GPa, minimum melt viscosity<30 Pa·s (175° C.), gel time>20 seconds, and spiral flow>80 cm. The molding resin 80 preferably indicates Tg<150° C. or more preferably Tg<175° C. Further, the molding resin 80 preferably indicates $10<\alpha1<14$, E1<17 GPa, and the minimum melt viscosity of 20 (Pa·s) or less. Moreover, the molding resin 80 preferably indicates the gel time of shorter than 25 seconds and the spiral flow of 100 cm.

The lead frame 70 is partially protrudes as an outer lead from the molding resin 80. The outer leads enable electric connection between the electronic device 100 and the outside.

According to the electronic device 100, the molding resin 80 seals the second electronic component 30 on the second surface of the ceramic substrate 10. The surface opposite to the bonding surface of the metal plate 50 is exposed from the molding resin 80. As shown in FIG. 1A, the molding resin 80 for sealing the second electronic component 30 protrudes outward (downward in FIG. 1A) from the surface exposed from the molding resin 80 for the metal plate 50.

As shown in FIG. 1B, the metal plate 50 is not provided for a portion of the second surface of the ceramic substrate 10 corresponding to the second electronic component 30. The metal plate 50 is provided for a portion of the second surface of the ceramic substrate 10 outside the second electronic component 30 so as to avoid the second electronic component 30.

According to the example in FIG. 1B, the metal plate 50 is divided into four portions. Each metal plate 50 is arranged around the second electronic component 30. According to this arrangement, the molding resin 80 for sealing the second electronic component 30 is exposed from the metal plate 50 on the second electronic component 30.

Figure 2A:
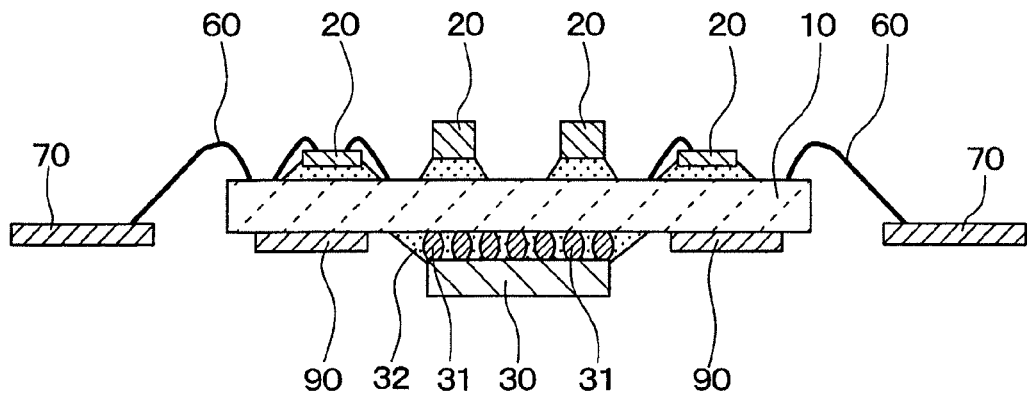
FIGS. 2A to 2C are process diagrams showing a manufacturing method of the electronic device according to the first embodiment.
Figure 2B:
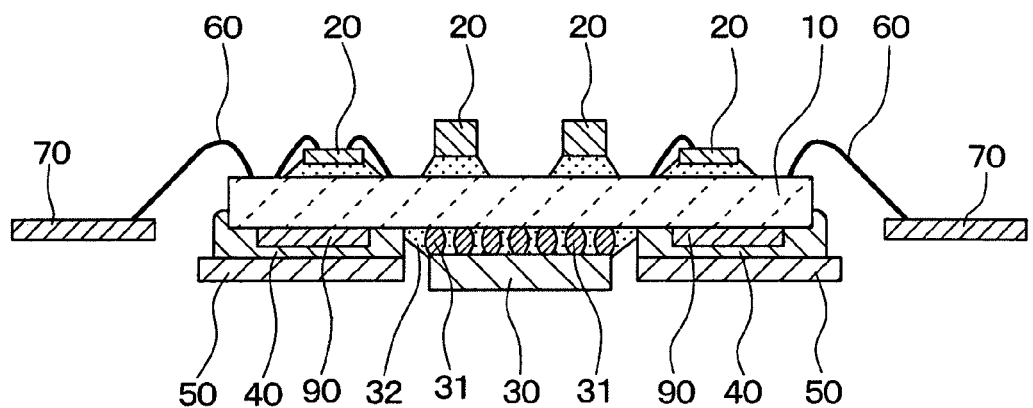
Figure 2C:
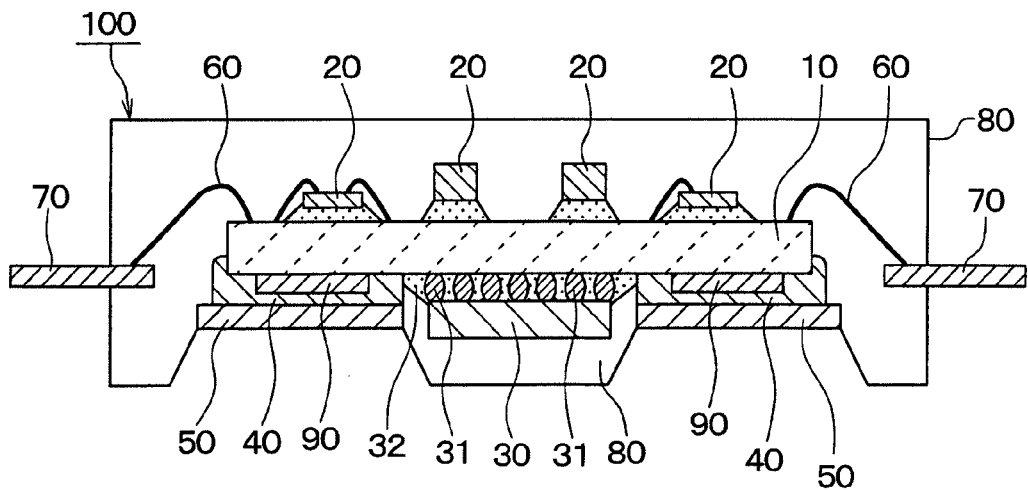

The following describes a manufacturing method of the electronic device 100 according to the embodiment with reference to FIGS. 2A to 2C. FIGS. 2A to 2C are process diagrams showing the manufacturing method and provides sectional views of a work corresponding to processes.

As shown in FIG. 2A, the first electronic component 20 and the second electronic component 30 are mounted on the first and second surfaces of the ceramic substrate 10, respectively. Wire bonding is conducted as necessary. The wire bonding is used to connect the ceramic substrate 10 with the lead frame 70 through the wire 60.

As shown in FIG. 2B, the adhesive 40 is used to bond the metal plate 50 to a portion of the second surface of the ceramic substrate 10 other than the second electronic component 30. As shown in FIG. 2C, the molding resin 80 is used to seal the work.

In this mold process, the work as shown in FIG. 2B is placed on a die (not shown). The molding resin 80 is injected into the die. The surface opposite to the bonding surface of the metal plate 50 is closely attached to the die so as not to be sealed by the molding resin 80.

In the mold process, the molding resin 80 is used to seal the ceramic substrate 10, the first electronic component 20, and the second electronic component 30 at a time. Specifically, the molding resin 80 injected into the die flows over the first and second surfaces of the ceramic substrate 10. Accordingly, both the electronic components 20 and 30 are molded simultaneously (see FIG. 2C). Completing the sealing completes the electronic device 100 according to the embodiment as shown in FIGS. 1A and 1B.

According to the embodiment, the first electronic component 20 is mounted on the first surface of the ceramic substrate. The second electronic component 30 is mounted on the second surface thereof. The first electronic component 20 and the second electronic component 30 are both sealed with the molding resin 80.

In the mold process, the molding resin 80 seals the first and second electronic components 20 and 30 simultaneously. The molding resin 80 is injected to both the first and second surfaces of the ceramic substrate 10.

The embodiment decreases a stress of the molding resin 80 on the ceramic substrate 10 from the first surface of the same in comparison with a conventional technique that provides sealing by applying an adhesive softer than a molding resin to the second surface of a ceramic substrate. As a result, the embodiment can prevent the ceramic substrate 10 from cracking during the mold process.

According to the embodiment, the adhesive 40 is used to bond the metal plate 50 to a portion other than the portion of the second surface of the ceramic substrate 10 corresponding to the second electronic component 30. The surface opposite to the bonding surface of the metal plate 50 is exposed from the molding resin 80. This makes it possible to appropriately ensure a heat dissipation function of the metal plate 50.

Figure 3:
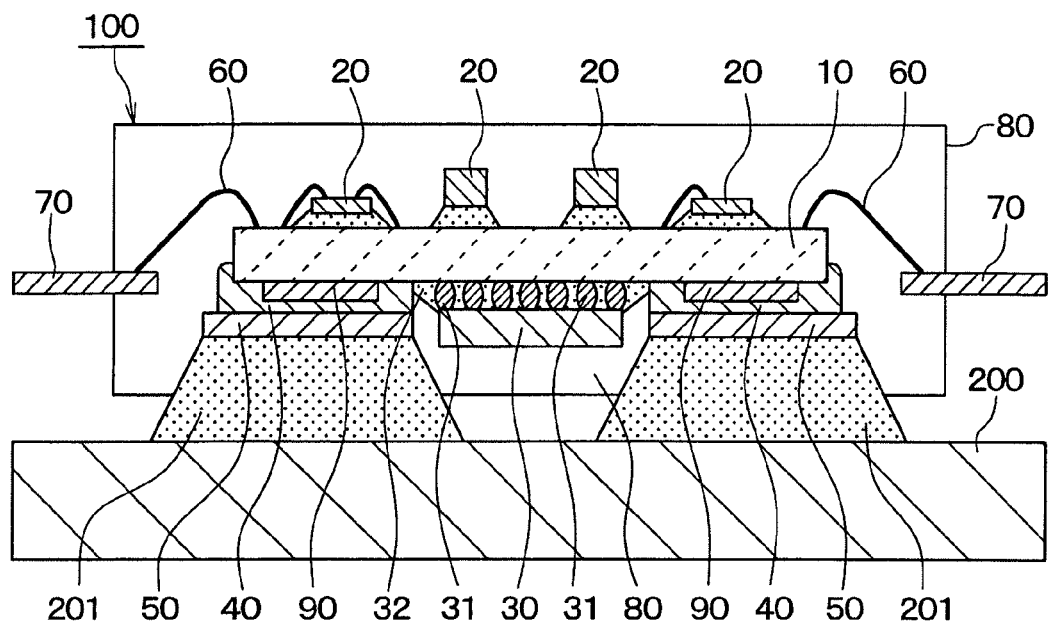
FIG. 3 is a schematic sectional view showing an example of mounting the electronic device according to the first embodiment on a housing.

FIG. 3 is a schematic sectional view showing an example of mounting the electronic device 100 according to the first embodiment on a housing 200. The housing 200 represents a metal container or plate. A bonding member 201 is used to bond the electronic device 100 to the housing 200 on the surface of the metal plate 50 exposed from the molding resin 80. The bonding member 201 represents solder or electrically conductive adhesive excellent in heat conductivity.

Contact efficiency of the bonding member 201 may be improved by welding the electronic device 100 and the housing 200, pressing both using a springy member, or screwing both.

Figure 4:
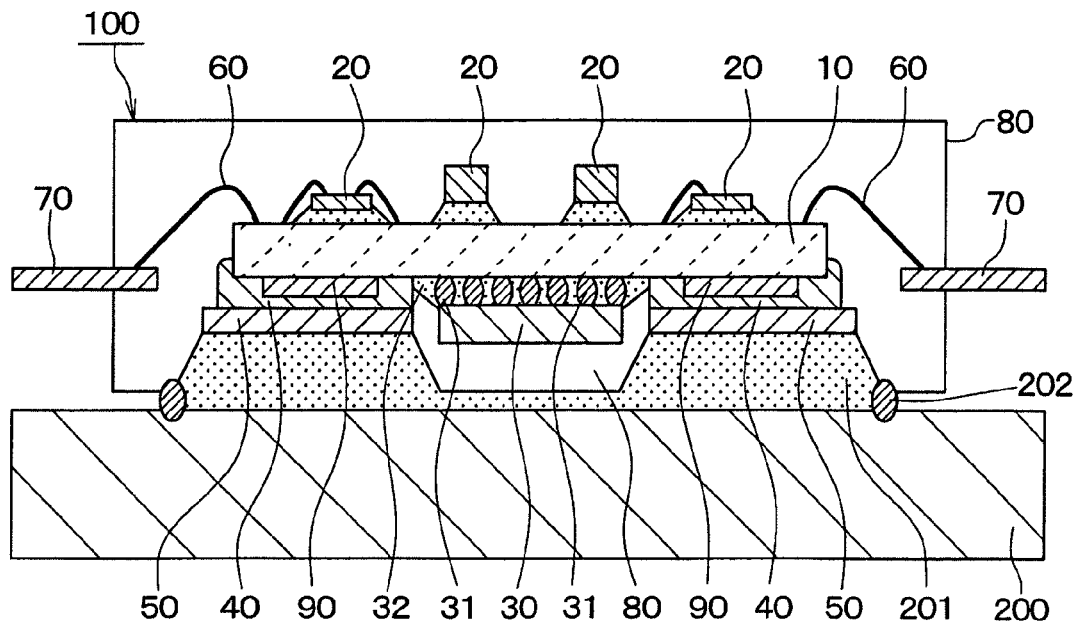
FIG. 4 is a schematic sectional view showing another example of mounting the electronic device according to the first embodiment on a housing.

FIG. 4 is a schematic sectional view showing another example of mounting the electronic device 100 according to the first embodiment on the housing 200. When a gel excellent in heat conductivity is used as the bonding member 201, for example, it may be preferable to provide a sealing member 202 such as an O ring for sealing the bonding member 201. In this case, the electronic device 100 may be mounted on the housing 200 by providing the bonding member 201 between the electronic device 100 and the housing 200 and providing the sealing member 202 around the bonding member 201.

Figure 5:
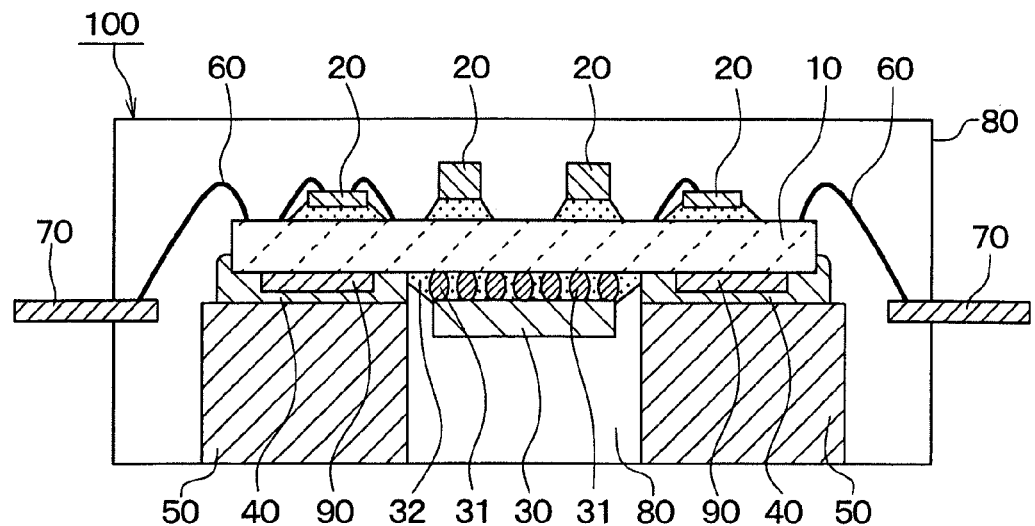
FIG. 5 is a schematic sectional view showing another example of the electronic device according to the first embodiment.

FIG. 5 is a schematic sectional view showing another example of the electronic device 100 according to the first embodiment. In the example of FIGS. 1A and 1B, the metal plate 50 and the lead frame 70 are formed by using the same plate material with the same thickness. In the example of FIG. 5, the metal plate 50 may use a plate material such as a heat think different from the lead frame 70 and may be thicker than the lead frame 70.

Figure 6A:
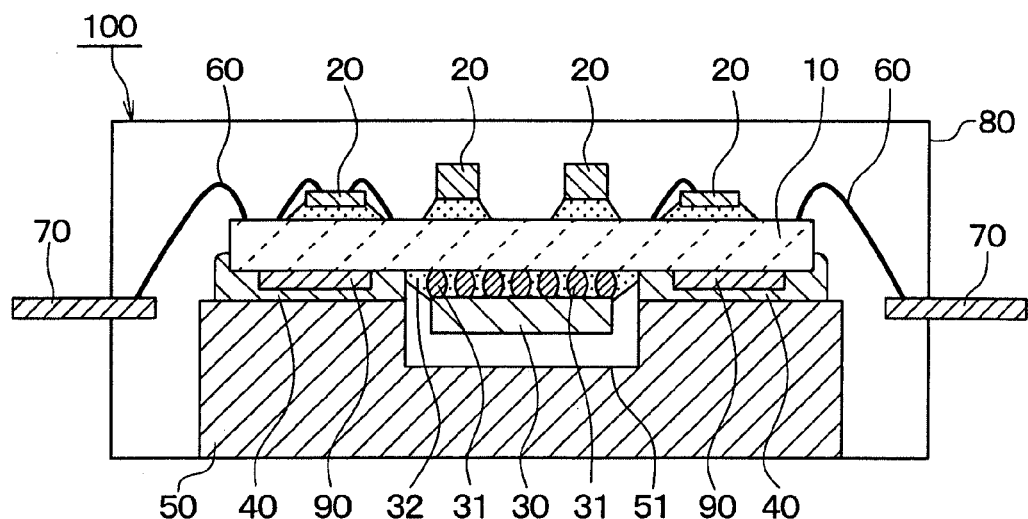
FIG. 6A is a schematic sectional view showing still another example of the electronic device according to the first embodiment.
Figure 6B:
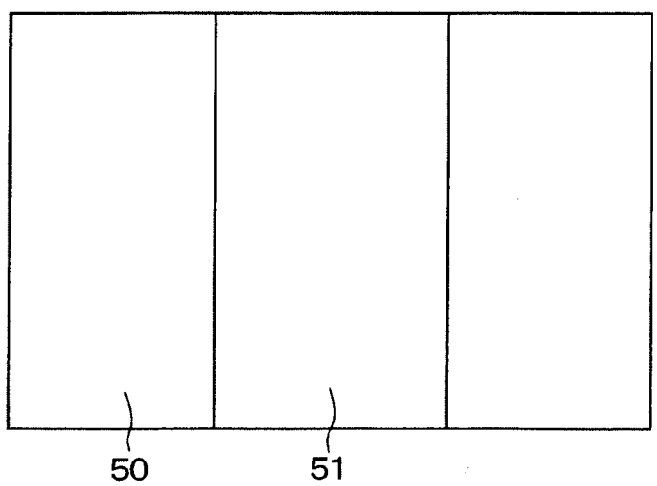
FIG. 6B is a schematic sectional view showing a bonding surface of the metal plate in FIG. 6A.

FIG. 6A is a schematic sectional view showing still another example of the electronic device 100 according to the first embodiment. FIG. 6B is a schematic sectional view showing bonding surface of the metal plate 50 for the electronic device 100 in FIG. 6A.

In the example of FIGS. 1A and 1B, the metal plate 50 is provided at the portion of the second surface of the ceramic substrate 10 so as to avoid the second electronic component 30. In the example of FIG. 6, the metal plate 50 covers the second electronic component 30 via the molding resin 80 on the second surface of the ceramic substrate 10.

A groove 51 is provided on the surface of the metal plate 50 for covering the second electronic component 30 in order to ensure the height of the second electronic component 30. The groove 51 is formed across one end to the other of the metal plate 50 in order to seal the second electronic component 30 with the molding resin 80 in the mold process. The molding resin 80 injected into the die during the mold process flows in the groove 51 and seals the second electronic component 30.

Second Embodiment

Figure 7A:
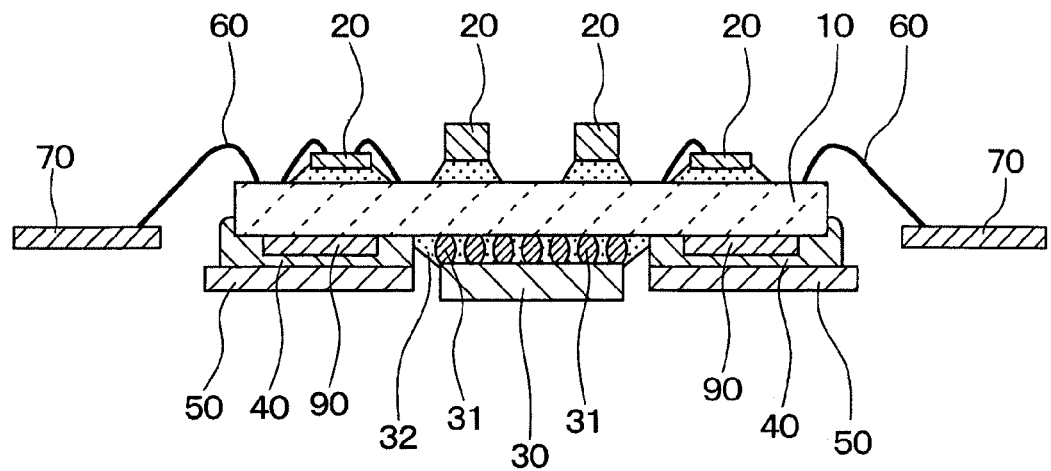
FIGS. 7A to 7C are process diagrams showing a manufacturing method of an electronic device according to a second embodiment.
Figure 7B:
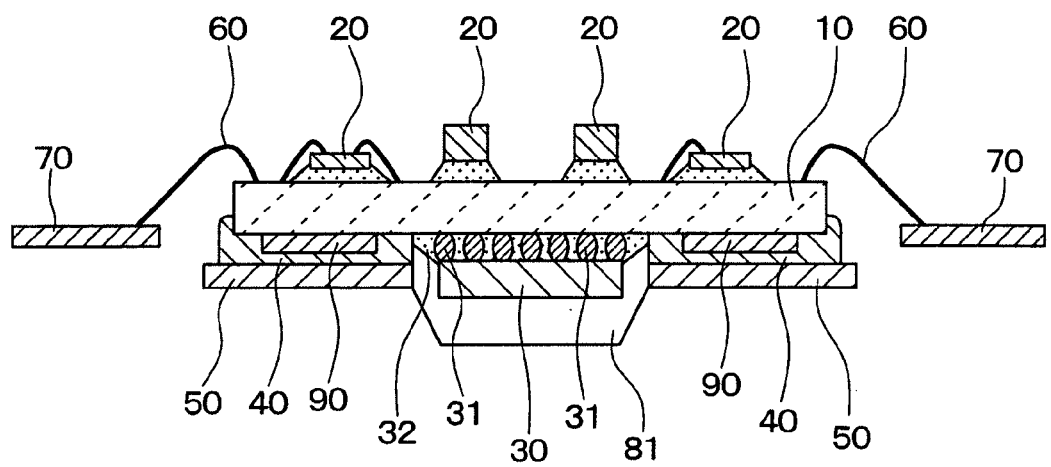
Figure 7C:
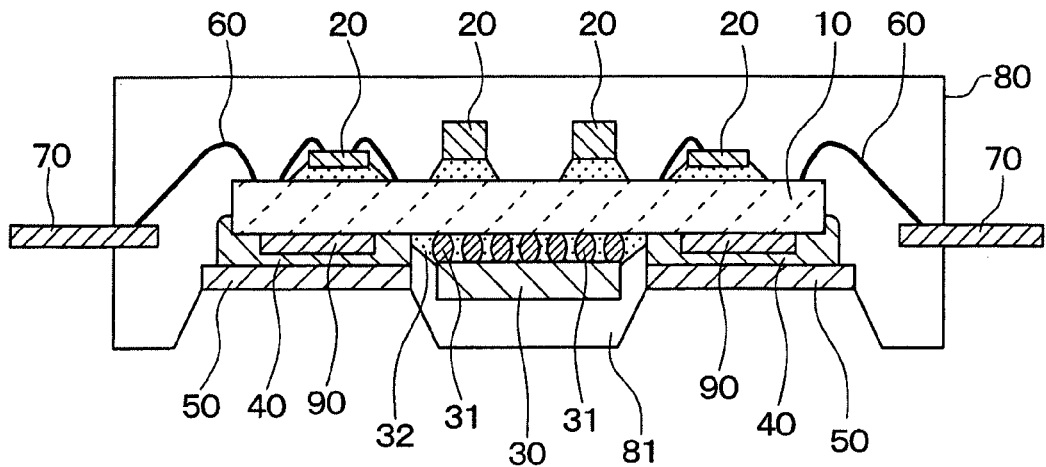

FIGS. 7A to 7C are process diagrams showing a manufacturing method of an electronic device according to the second embodiment and provides sectional views of a work corresponding to processes. The manufacturing method is used to finally manufacture the electronic device as shown in FIG. 7C. The following mainly describes differences from the manufacturing method according to the first embodiment.

As shown in FIG. 7A, the first electronic component 20 and the second electronic component 30 are mounted on the first and second surfaces of the ceramic substrate 10, respectively. The wire 60 is used to connect the ceramic substrate 10 with the lead frame 70.

According to the embodiment, as shown in FIG. 7B, a second electronic component sealing resin 81 is used to seal the second electronic component 30 on the second surface of the ceramic substrate 10. The second electronic component sealing resin 81 indicates Young's modulus of 100 MPa or more at a molding temperature of the molding resin 80 for sealing. The second electronic component sealing resin 81 is harder than a conventional adhesive made of silicone resin for bonding metal plates and ceramic substrates.

The second electronic component sealing resin 81 may or may not be equivalent to the molding resin 80. Preferably, the second electronic component sealing resin 81 is as hard as or harder than the molding resin 80 and may represent epoxy resin.

The above-mentioned molding temperature of the molding resin 80 for sealing refers to the temperature of the melted molding resin 80 to be injected into the die during the mold process. For example, the molding resin 80 made of general epoxy resin indicates the molding temperature of 175° C.

According to the embodiment, as shown in FIG. 7B, the second electronic component sealing resin 81 is used for sealing. The adhesive 40 is used to bond the metal plate 50 to the portion of the second surface of the ceramic substrate 10 other than the second electronic component 30. The work is sealed with the molding resin 80.

In this mold process, the work as shown in FIG. 7B is placed on a die (not shown). The molding resin 80 is injected into the die. Also in this process, the surface opposite to the bonding surface of the metal plate 50 and the second electronic component sealing resin 81 are closely attached to the die so as not to be sealed by the molding resin 80.

In the mold process, the molding resin 80 is used to seal the ceramic substrate 10 and the first electronic component 20. Completing the sealing completes the electronic device according to the embodiment as shown in FIG. 7C.

Before sealing using the molding resin 80 according to the embodiment, the second electronic component 30 is mounted on the second surface of the ceramic substrate 10. The second electronic component sealing resin 81 is used to seal the second electronic component 30.

When the molding resin 80 is used to seal the first electronic component 20, the second electronic component sealing resin 81 harder than the above-mentioned conventional adhesive is provided at the portion of the second surface of the ceramic substrate 10 corresponding to the second electronic component 30. The resin 81 supports the ceramic substrate 10. The embodiment decreases a stress on the ceramic substrate 10 from the first surface of the same. As a result, the embodiment can prevent the ceramic substrate 10 from cracking during the mold process.

Also according to the embodiment, the adhesive 40 is used to bond the metal plate 50 to a portion other than the portion of the second surface of the ceramic substrate 10 corresponding to the second electronic component 30. The surface opposite to the bonding surface of the metal plate 50 is exposed from the molding resin 80. This makes it possible to appropriately ensure a heat dissipation function of the metal plate 50.

Third Embodiment

Figure 8A:
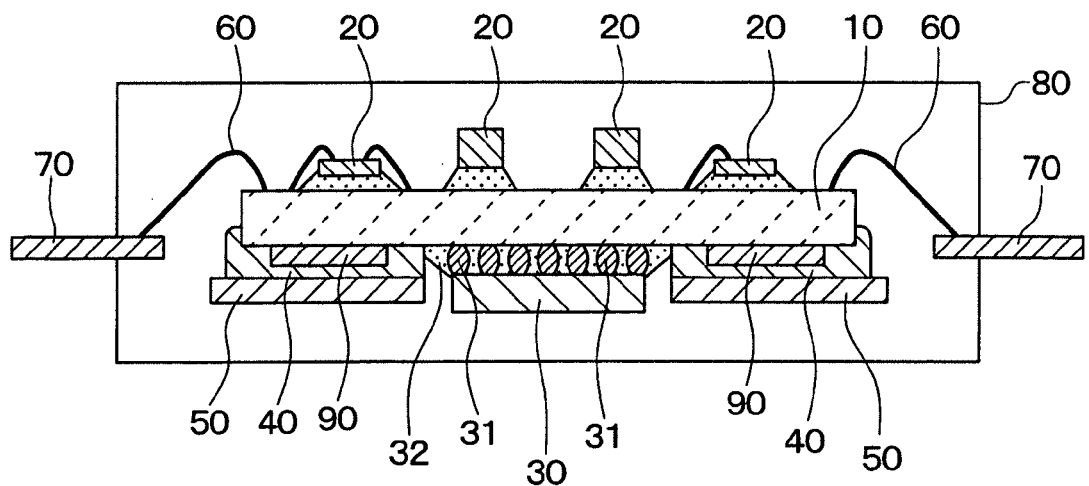
FIGS. 8A and 8B are process diagrams showing a manufacturing method of an electronic device according to a third embodiment.
Figure 8B:
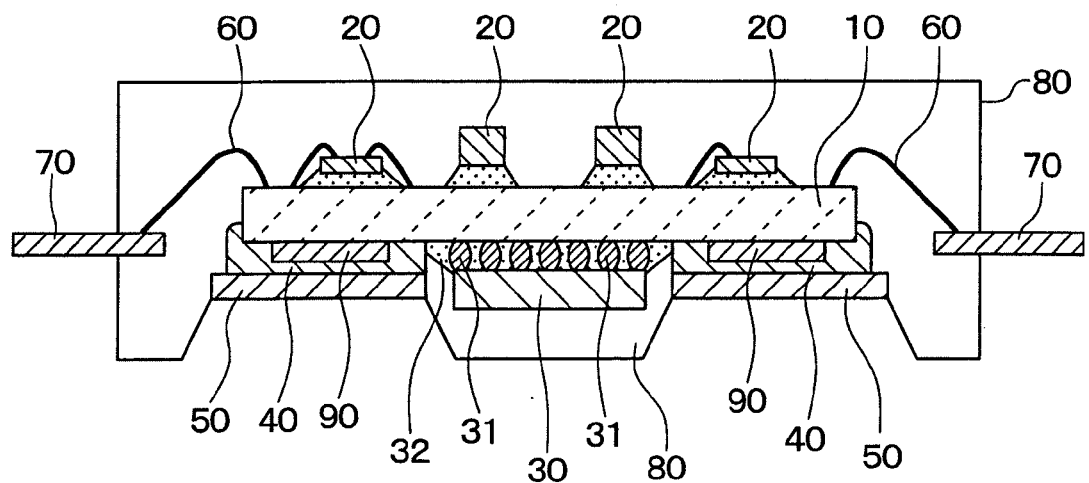

FIGS. 8A and 8B are process diagrams showing a manufacturing method of an electronic device according to a third embodiment and provides sectional views of a work corresponding to processes. The manufacturing method is used to finally manufacture the electronic device as shown in FIG. 8B. The following mainly describes differences from the manufacturing method according to the first embodiment.

The first electronic component 20 and the second electronic component 30 are mounted on the first and second surfaces of the ceramic substrate 10, respectively. The wire 60 is used to connect the ceramic substrate 10 with the lead frame 70. The adhesive 40 is used to bond the metal plate 50 to the portion of the second surface of the ceramic substrate 10 other than the second electronic component 30.

The embodiment uses the molding resin 80 to seal the work as shown in FIG. 8A. During the mold process based on the transfer mold method, the molding resin 80 is used to seal the whole of the second electronic component 30 and the metal plate 50 as well as the ceramic substrate 10 and the first electronic component 20.

As shown in FIG. 8B, a technique of cutting, grinding, or sandblasting is used to remove the portion of the molding resin 80 for sealing the surface opposite to the bonding surface of the metal plate 50. As a result, the surface opposite to the bonding surface of the metal plate 50 is exposed from the molding resin 80 to complete the electronic device according to the embodiment as shown in FIG. 8B.

According to the embodiment, the molding resin 80 is used to seal the whole of the ceramic substrate 10 during the mold process. The molding resin 80 is injected to both the first and second surfaces of the ceramic substrate 10. The embodiment decreases a stress of the molding resin 80 on the ceramic substrate 10 from the first surface of the same. As a result, the embodiment can prevent the ceramic substrate 10 from cracking during the mold process.

Fourth Embodiment

Figure 9:
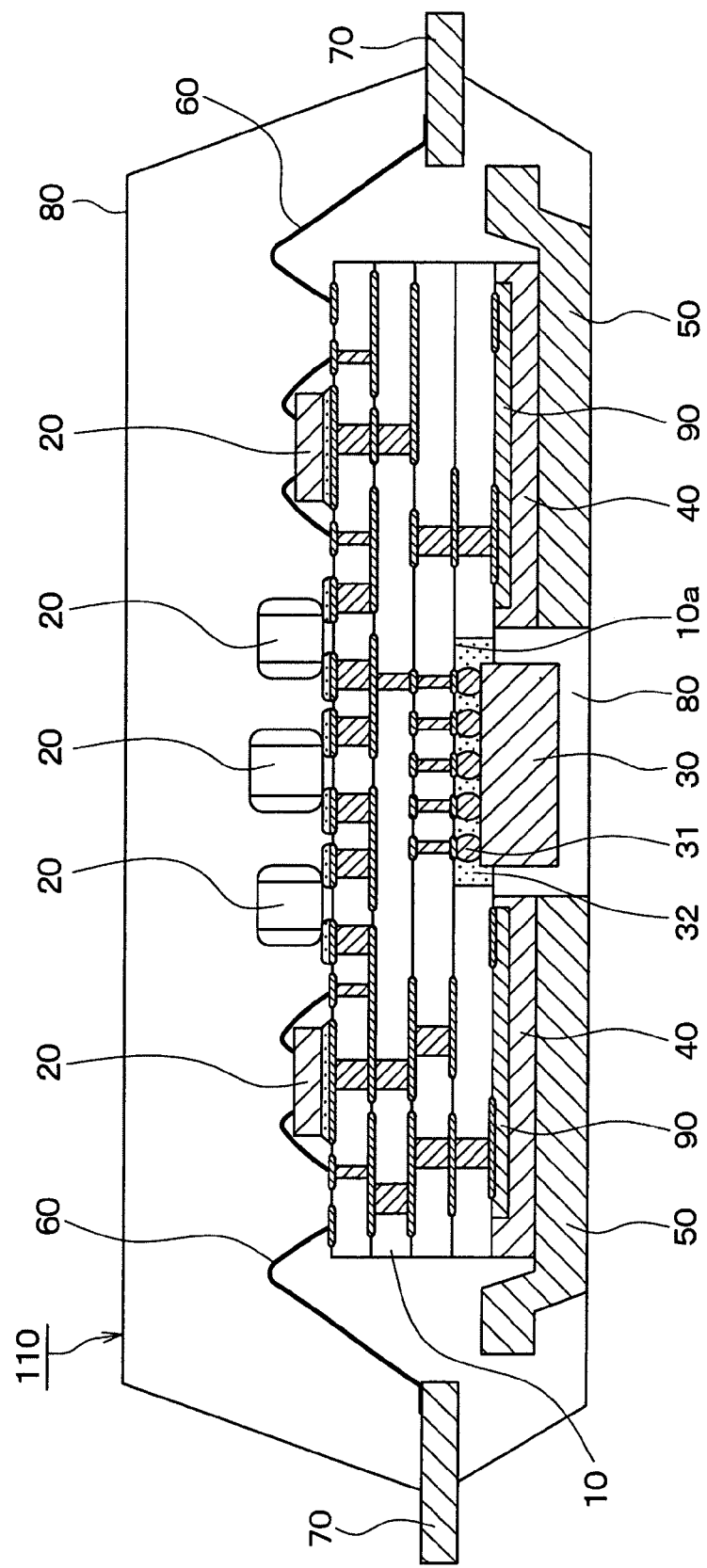
FIG. 9 is a schematic sectional view showing a manufacturing method of an electronic device according to a fourth embodiment.
Figure 10:
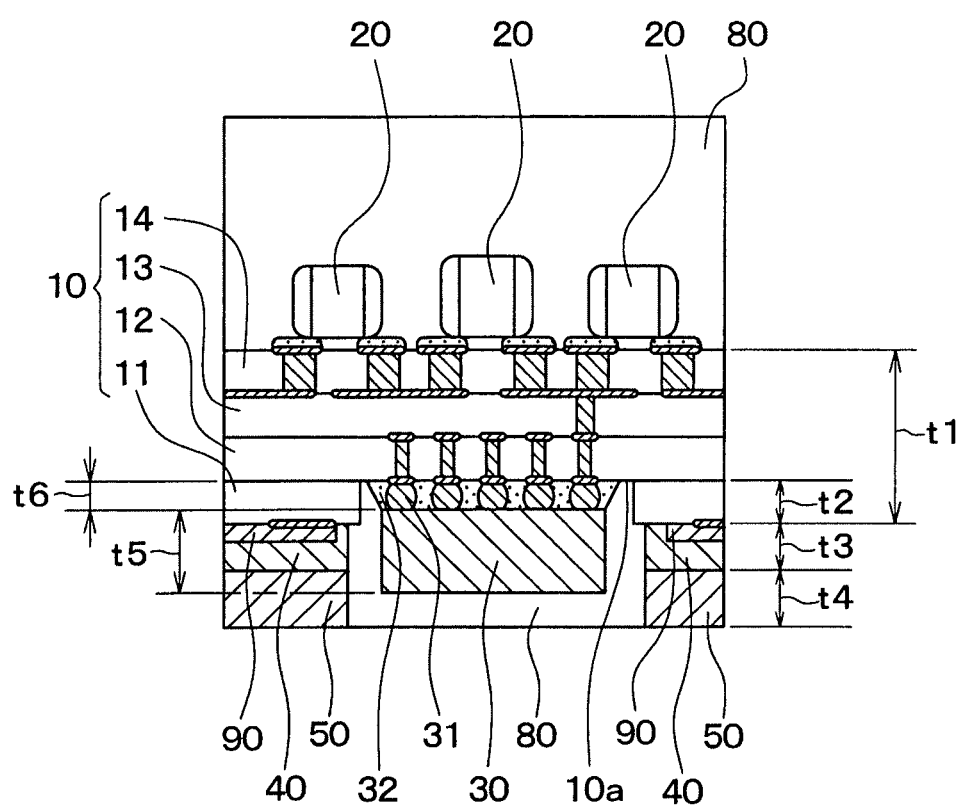
FIG. 10 is an enlarged view near a second electronic component of the electronic device in FIG. 9.

FIG. 9 is a schematic sectional view showing a manufacturing method of the electronic device 110 according to the fourth embodiment. FIG. 10 is an enlarged view near the second electronic component 30 of the electronic device 110 in FIG. 9. The electronic device 110 according to the embodiment is provided by partially modifying the electronic device according to the first embodiment. The following mainly describes differences from the first embodiment.

As shown in FIG. 9, the electronic device 110 according to the embodiment includes a depressed portion 10a. The depressed portion 10a is formed on the second surface of the ceramic substrate 10 so as to position the second electronic component 30 on the second surface of the ceramic substrate 10. The second electronic component 30 is mounted at the bottom of the depressed portion 10a.

The molding resin 80 is also used to seal the second electronic component 30 of the electronic device 110. Instead of the molding resin 80, the second electronic component sealing resin 81 may be used to seal the second electronic component 30.

The embodiment can provide the same effect as the first embodiment and decrease the protrusion of the second electronic component 30 on the second surface of the ceramic substrate 10. The embodiment can minimize the size of the electronic device 110 along the thickness direction of the ceramic substrate 10.

As seen from the electronic device according to the first embodiment (see FIGS. 1A and 1B), the molding resin 80 for sealing the second electronic component 30 protrudes from the surface of the metal plate 50 exposed from the molding resin 80. The fourth embodiment not only decreases the amount of protrusion but also retracts the second electronic component 30 from the exposed surface of the metal plate 50 to level the molding resin 80 for sealing the second electronic component 30 with the exposed surface of the metal plate 50.

According to the embodiment as shown in FIGS. 9 and 10, the ceramic substrate 10 is configured to be multilayer having ceramic layers 11 through 14. Of the four ceramic layers 11 through 14, the ceramic layer 11 forms the second surface of the ceramic substrate 10. According to the embodiment, the depressed portion 10a is formed by making a hole in the ceramic layer 11.

The following shows examples of dimensions t1 through t6 in FIG. 10. In this example, thickness t1 of the ceramic substrate 10 is 0.8 mm equivalent to the four ceramic layers 11 through 14 each of which is 0.2 mm thick. Therefore, depth t2 of the depressed portion 10a is 0.2 mm. Thickness t3 of the adhesive 40 is 0.15 mm. Thickness t4 of the metal plate 50 is 0.25 mm. Thickness t5 of the second electronic component 30 is 0.4 mm. Height t6 of the bump 31 is 0.08 mm.

With reference to FIGS. 11A to 11C and 12A to 12C, the following describes the manufacturing method of the electronic device 110 shown in FIG. 9 according to the embodiment. FIGS. 11A to 11C and 12A to 12C are process diagrams showing an example process of fabricating the ceramic substrate 10 having the depressed portion 10a in the electronic device 110.

Figure 11A:
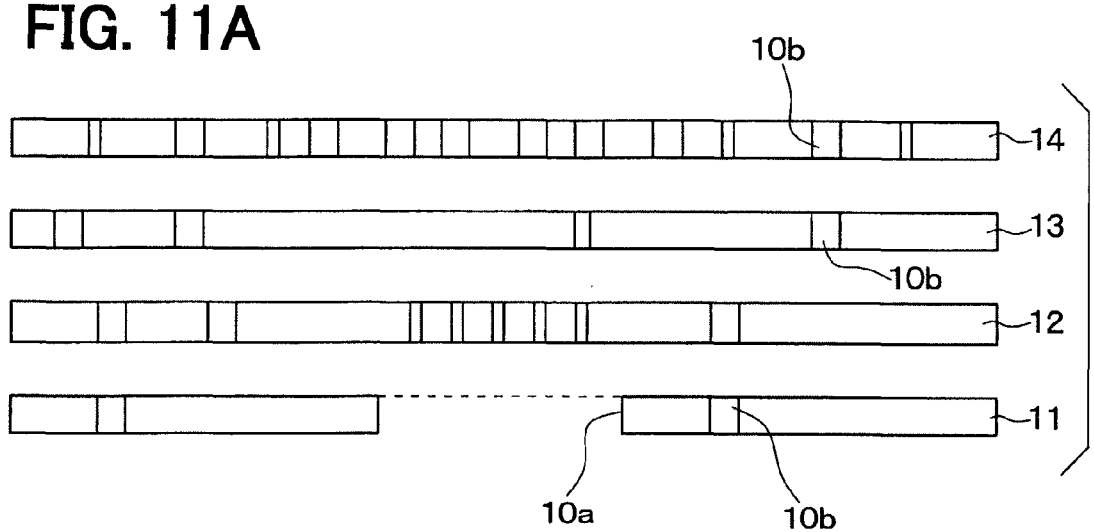
FIGS. 11A to 11C are process diagrams showing a manufacturing process of a ceramic substrate having a depressed portion of the electronic device according to the fourth embodiment.

As shown in FIG. 11A, the ceramic layers 11 through 14 are prepared as a green sheet made of alumina. A drilling process such as punching is conducted to form a hole 10b as a via hole and the hole for the depressed portion 10a in the ceramic layers 11 through 14.

Figure 11B:
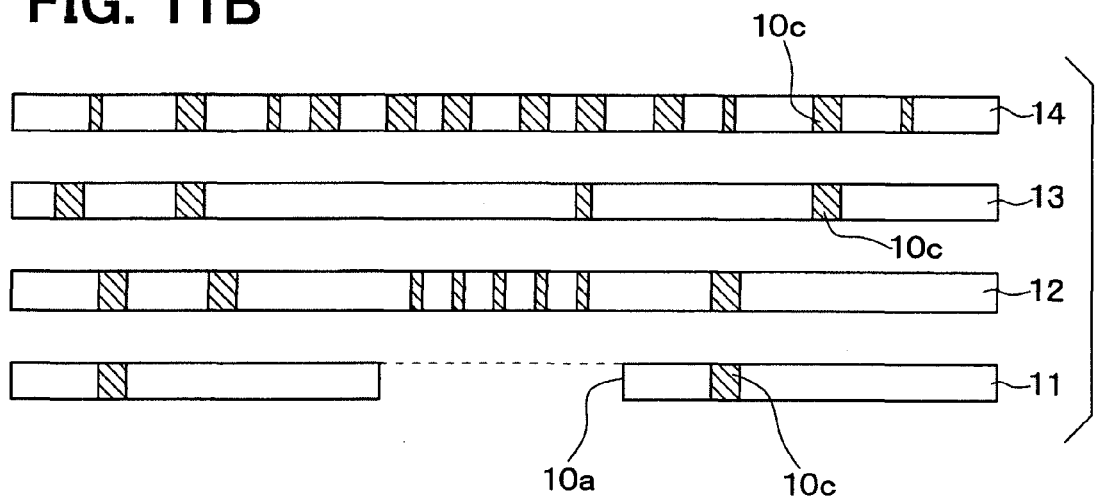
Figure 11C:
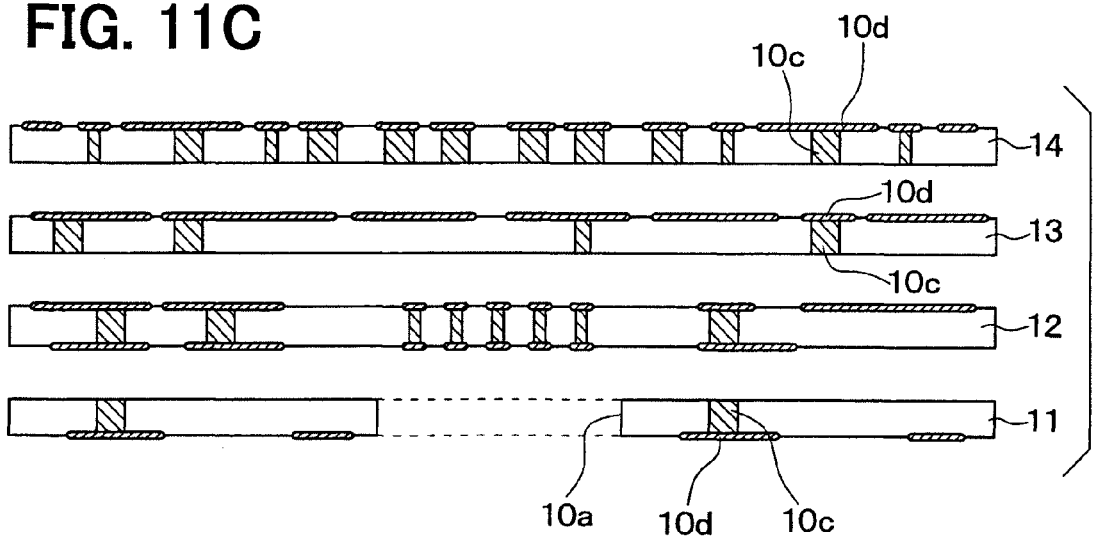

As shown in FIG. 11B, the hole 10b as a via hole is filled with an electrically conductive paste 10c that is then dried. The electrically conductive paste 10c is a mixture of molybdenum and alumina, for example. As shown in FIG. 11C, necessary portions on the surfaces of the ceramic layers 11 through 14 are printed with an electrically conductive paste 10d that is then dried. The electrically conductive paste 10d is made of tungsten, for example.

Figure 12A:
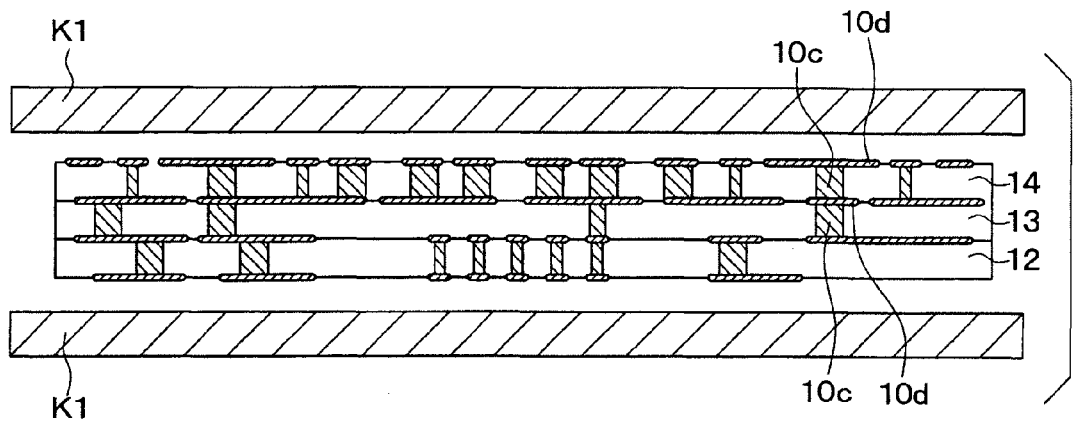
FIGS. 12A to 12C are process diagrams showing the manufacturing process of the ceramic substrate continued from FIGS. 11A to 11C.
Figure 12B:
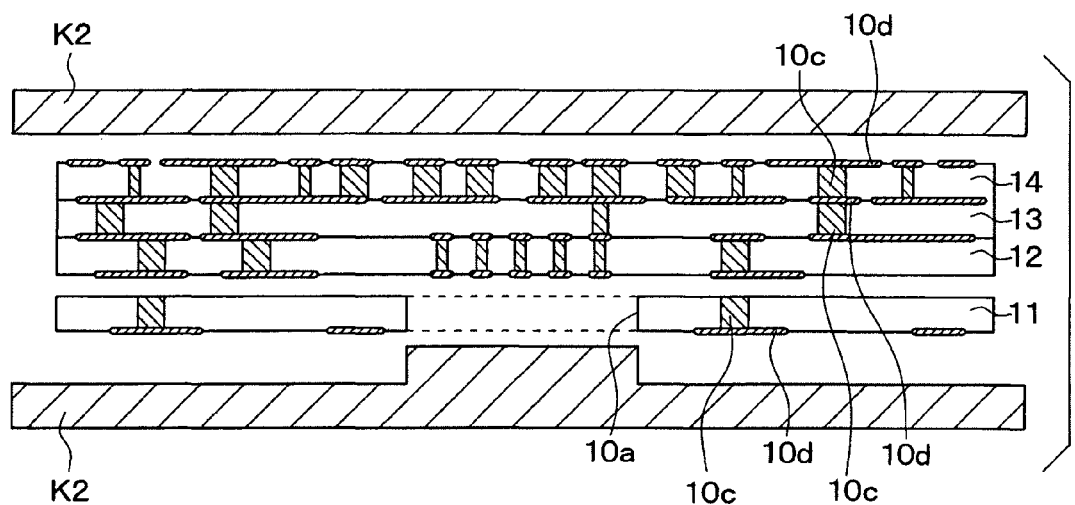
Figure 12C:
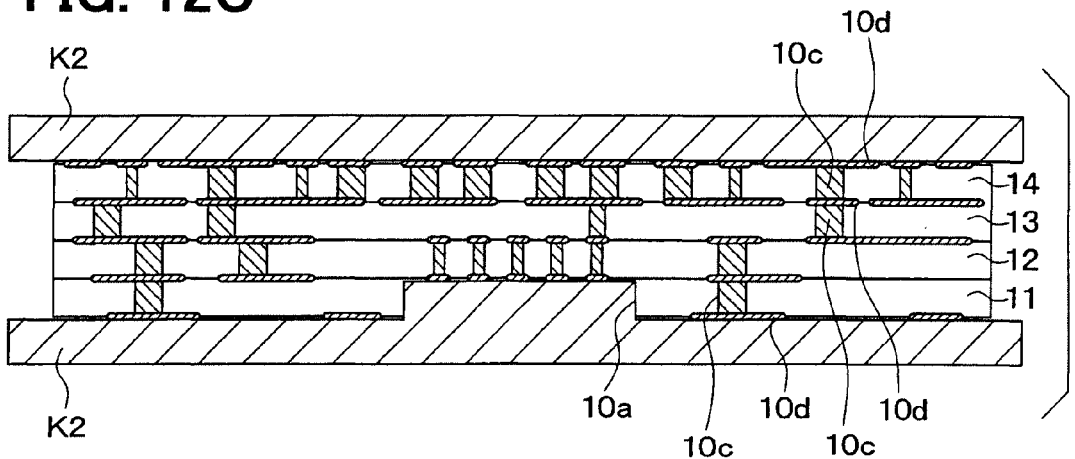

As shown in FIG. 12A, the ceramic layers 12 through 14 are layered except the ceramic layer 11 having the depressed portion 10a and are sandwiched between a die K1 to be unified. As shown in FIGS. 12B and 12C, the ceramic layer 11 having the depressed portion 10a is also layered to be unified.

The bottom part of a die K2 may be flat or shaped in accordance with the depressed portion 10a as shown in FIG. 12B in order to apply more uniform pressure. A layered product of the ceramic layers 11 through 14 is then burnt in the reduction atmosphere of 1600° C. The layered product is burnt to shrink approximately 18% as a whole.

Though the subsequent processes are not shown, nonelectrolytic plating using Cu or Au is applied to a conductive portion of the surface of the ceramic substrate 10. The resistor 90 is formed on the second surface of the ceramic substrate 10 by printing and burning. The resistor 90 is covered with protective glass or resin. Finally, the ceramic substrate 10 having the depressed portion 10a is completed.

The second electronic component 30 is mounted on the depressed portion 10a of the second surface of the ceramic substrate 10 via the bump 31 made of solder. The underfill 32 is filled between the second electronic component 30 and the ceramic substrate 10.

The metal plate 50 is bonded to the second surface of the ceramic substrate 10 via the adhesive 40 made of silicone rubber, for example. The first electronic component 20 is mounted on the first surface of the ceramic substrate 10. As shown in FIG. 9, wire bonding is conducted between the ceramic substrate 10 and the lead frame 70 to connect both using the wire 60.

Similarly to the first embodiment, the molding resin 80 is then used to seal the second electronic component 30 as well as the ceramic substrate 10 and the first electronic component 20 at a time. Completing the sealing completes the electronic device 110 according to the embodiment as shown in FIG. 9.

The mold process of this embodiment may be equal to that of the third embodiment. In this case, the same method may be used except the use of the ceramic substrate 10 having the depressed portion 10a.

As mentioned above, the second electronic component sealing resin 81 may be used to seal the second electronic component 30 of the electronic device 110. The manufacturing method described in the second embodiment may be used to fabricate the electronic device 110 according to the fourth embodiment. That is, the fourth embodiment can be combined with the other embodiments mentioned above.

In the example of FIG. 9, the embodiment uses the multilayer ceramic substrate 10 to form the depressed portion 10a. The ceramic substrate 10 may be single-layer when applicable.

Fifth Embodiment

Figure 13A:
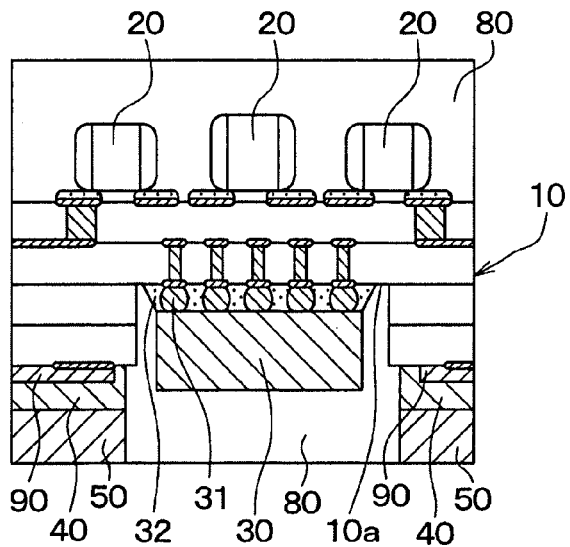
FIGS. 13A to 13C are schematic sectional views showing examples of an electronic device according to a fifth embodiment.
Figure 13B:
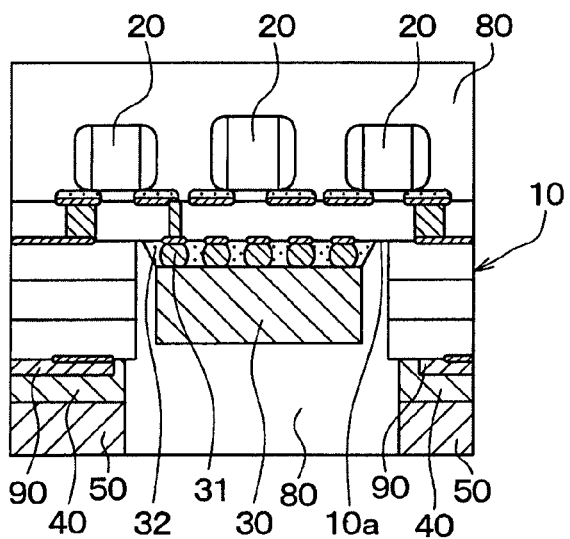
Figure 13C:
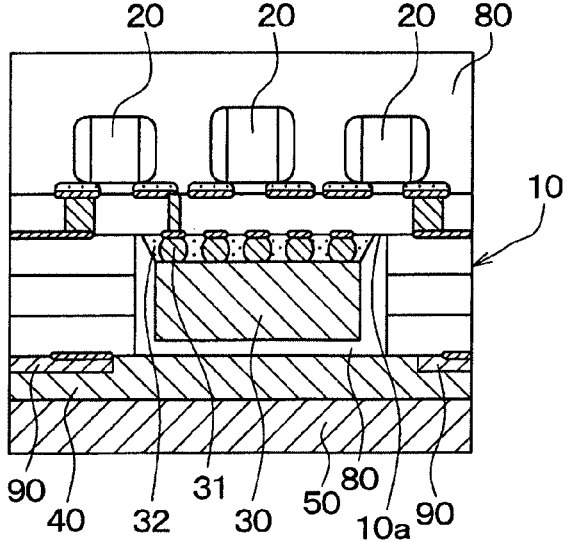

FIGS. 13A to 13C are schematic sectional views showing examples of an electronic device according to the fifth embodiment. FIGS. 13A, 13B, and 13C show first, second, and third examples of the embodiment, respectively.

As shown in FIG. 10, the fourth embodiment configures the depressed portion 10a on the second surface of the ceramic substrate 10 by holing the single ceramic layer 11 that forms the second surface of the ceramic substrate 10. In addition, the depressed portion 10a may be configured by holing the two ceramic layers 11 and 12 as shown in FIG. 13A. The depressed portion 10a may be configured by holing the three ceramic layers 11 through 13 as shown in FIG. 13B.

FIG. 13C shows a configuration of mounting the second electronic component 30 on the depressed portion 10a. Similarly to FIG. 6, the metal plate 50 may cover the second electronic component 30 via the molding resin 80.

Instead of the molding resin 80, the second electronic component sealing resin 81 or the underfill 32 may be used to seal the second electronic component 30. In this case, the metal plate 50 may be bonded after the second electronic component 30 is sealed with the second electronic component sealing resin 81 or the underfill 32.

Sixth Embodiment

Figure 14A:
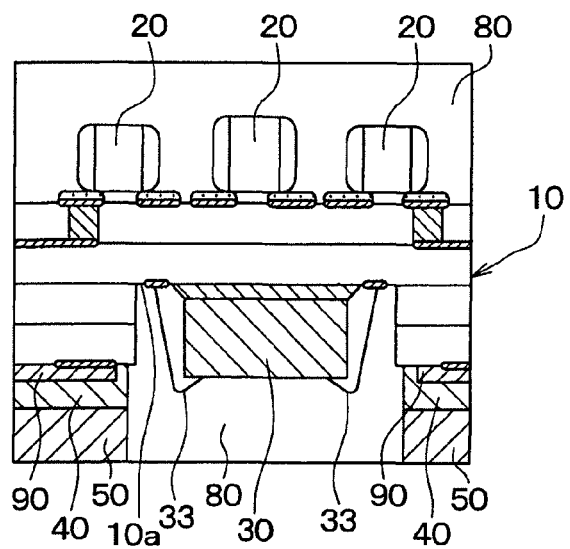
FIGS. 14A to 14C are schematic sectional views showing examples of an electronic device according to a sixth embodiment.
Figure 14B:
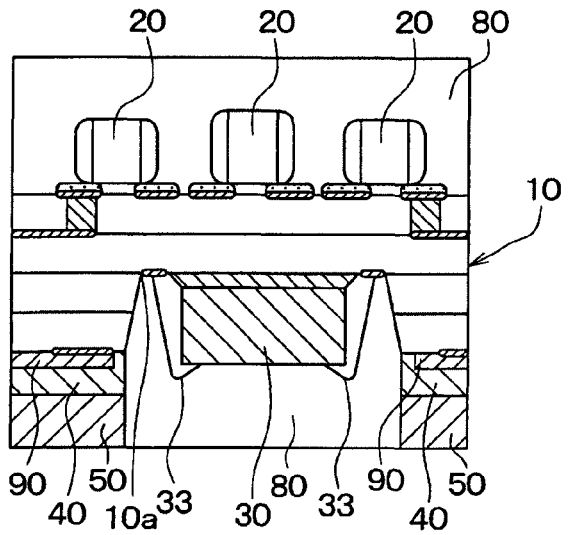
Figure 14C:
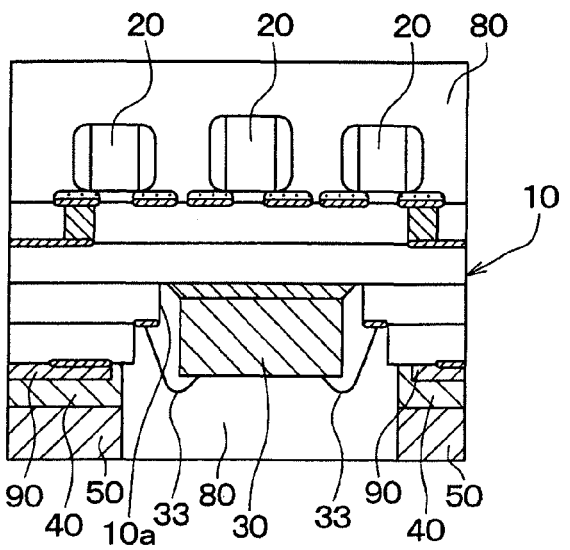

FIGS. 14A to 14C are schematic sectional views showing examples of an electronic device according to the sixth embodiment. FIGS. 14A, 14B, and 14C show first, second, and third examples of the embodiment, respectively.

The fourth and fifth embodiments use a flip chip for the second electronic component 30 mounted at the depressed portion 10a on the second surface of the ceramic substrate 10. The second electronic component 30 may be a semiconductor device mounted through the use of a wire 33 such as gold according to the sixth embodiment.

The side of the depressed portion 10a is not limited to be straight and may be tapered as shown in FIG. 14B or stepped as shown in FIG. 14C. The shape of the depressed portion 10a can be easily changed by means of the above-mentioned drilling process such as punching.

Seventh Embodiment

Figure 15:
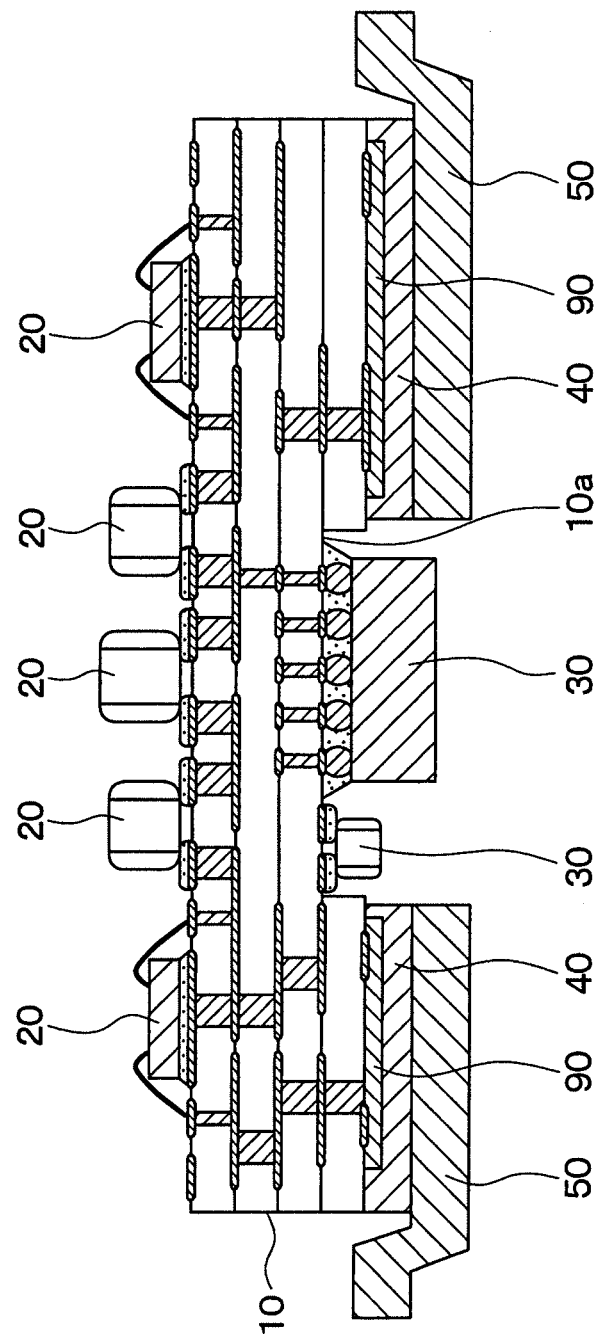
FIG. 15 is a schematic sectional view showing a first example of an electronic device according to a seventh embodiment.
Figure 16:
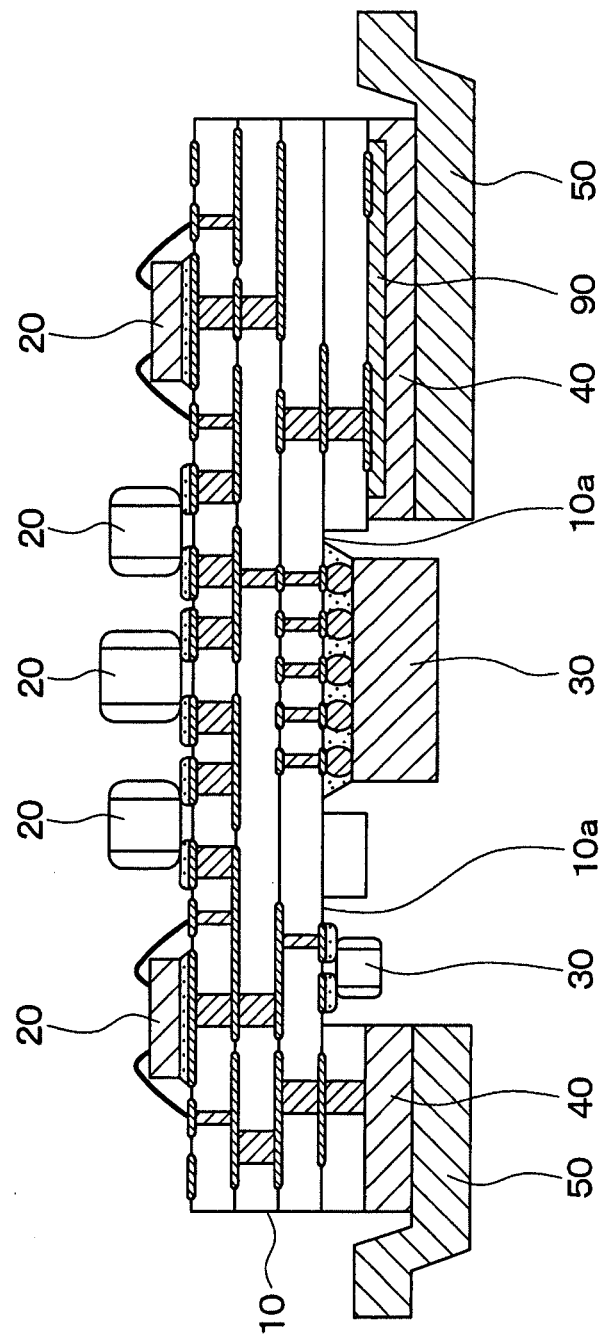
FIG. 16 is a schematic sectional view showing a second example of the electronic device according to the seventh embodiment.
Figure 17:
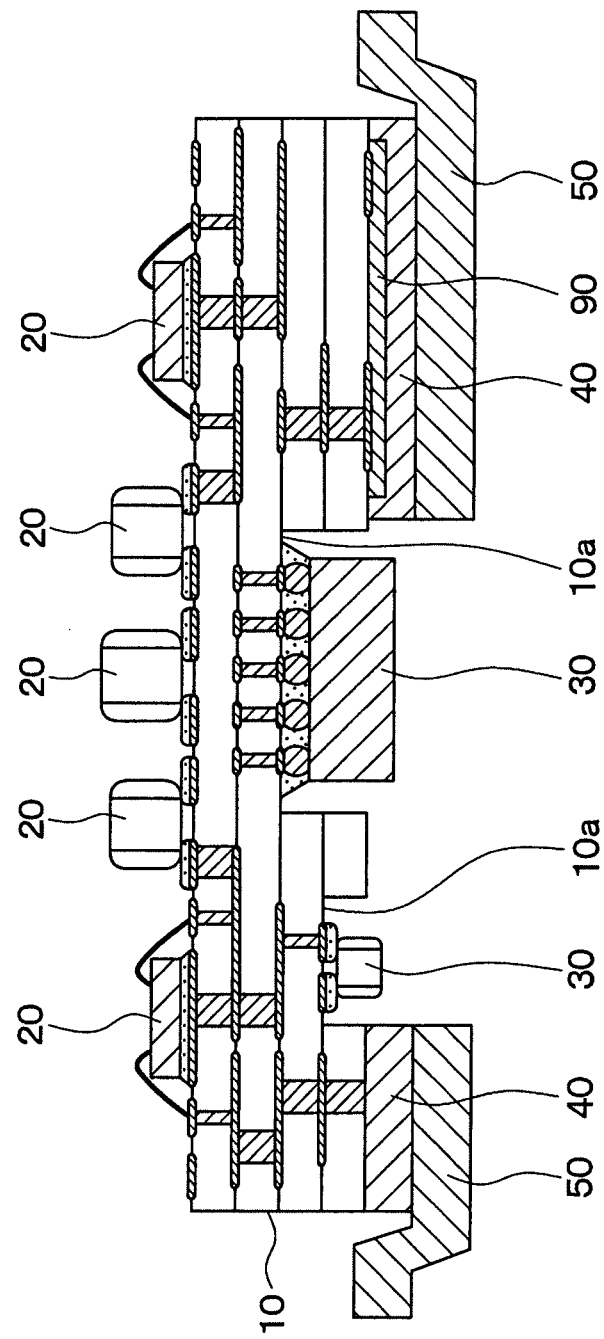
FIG. 17 is a schematic sectional view showing a third example of the electronic device according to the seventh embodiment.

FIGS. 15, 16, and 17 are schematic sectional views showing first, second, and third examples of an electronic device according to the seventh embodiment, respectively. The single second electronic component 30 is mounted on the second surface of the ceramic substrate 10 according to the above-mentioned embodiments. Further, multiple second electronic components 30 may be mounted.

FIGS. 15 to 17 show examples of mounting the second electronic component 30 on the depressed portion 10a. FIGS. 15 to 17 omit the molding resin 80 for sealing the second electronic component 30 and the second electronic component sealing resin 81. The examples use a flip chip and a capacitor as the second electronic component 30.

As shown in FIG. 15, the single depressed portion 10a may be mounted with multiple second electronic components 30. As shown in FIG. 16, the single depressed portion 10a may be provided for one of second electronic components 30. As shown in FIG. 17, the multiple depressed portions 10a may have different depths.

Eighth Embodiment

Figure 18A:
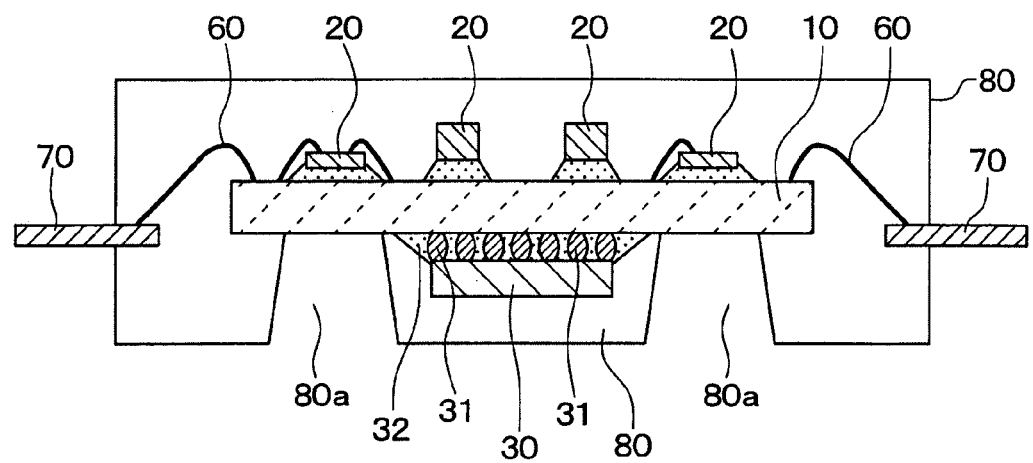
Figure 18B:
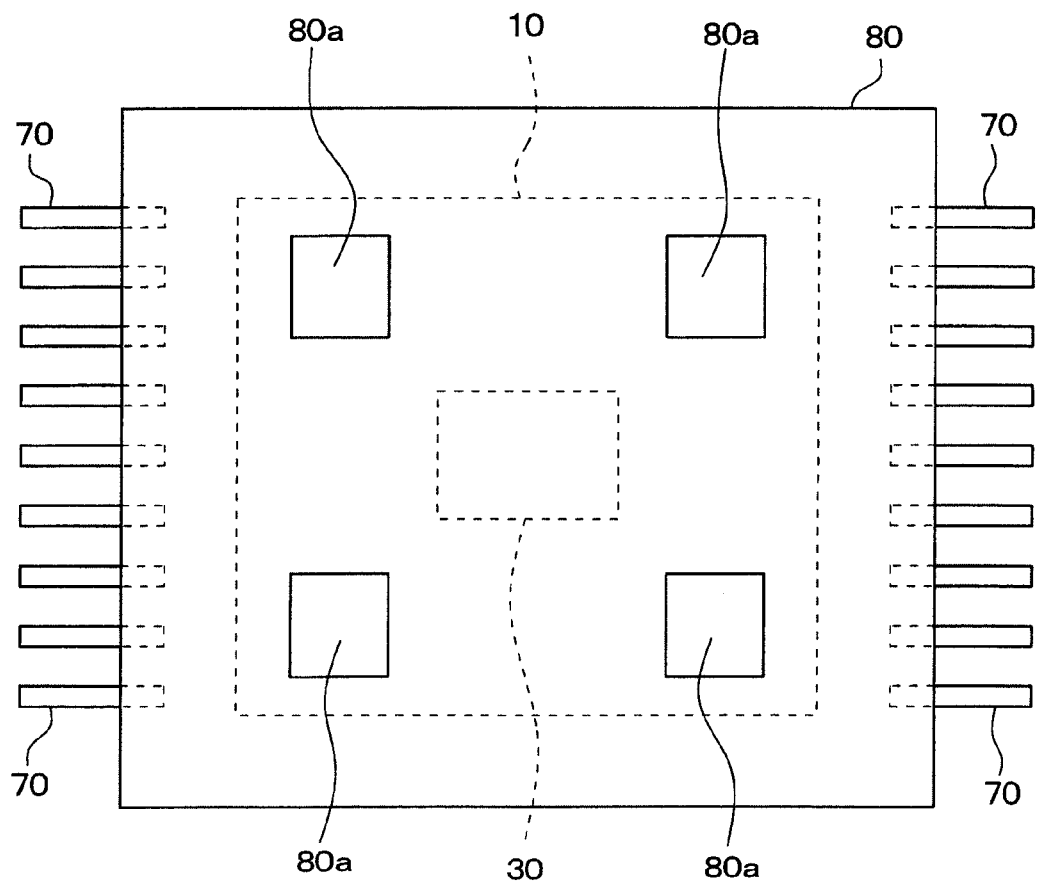

FIGS. 18A and 18B show an electronic device according to the eighth embodiment. FIG. 18A is a schematic sectional view. FIG. 18B is a schematic plan view viewed from the bottom of FIG. 18A. The embodiment mainly describes differences from the electronic device 100 (see FIGS. 1A and 1B) according to the first embodiment.

The electronic device according to the embodiment mainly includes the ceramic substrate 10, the first electronic component 20, the second electronic component 30, the lead frame 70, and the molding resin 80. The first electronic component 20 is mounted on the first surface of the ceramic substrate 10. The second electronic component 30 is mounted on the second surface of the ceramic substrate 10. The lead frame 70 is connected to the ceramic substrate 10 through the wire 60. The molding resin 80 seals the components 10 through 70.

The electronic device according to the embodiment is configured by omitting the metal plate from the first embodiment. The eighth embodiment exposes a portion other than the portion of the second surface of the ceramic substrate 10 corresponding to the second electronic component 30 from the molding resin 80. That exposed portion of the second surface of the ceramic substrate 10 is therefore void of the molding resin 80 and is provided as an opening 80a.

The following describes a manufacturing method of the electronic device according to the embodiment. Similarly to the first embodiment, the first electronic component 20 and the second electronic component 30 are mounted on the first and second surfaces of the ceramic substrate 10, respectively. The wire 60 is used to connect the ceramic substrate 10 with the lead frame 70 according to the wire bonding.

The work is placed on a die (not shown) and is sealed with the molding resin 80. The portion of the second surface of the ceramic substrate 10 other than the portion corresponding to the second electronic component 30 is closely attached to the die so as not to be sealed by the molding resin 80.

In the mold process, similarly to the first embodiment, the molding resin 80 is used to seal the ceramic substrate 10, the first electronic component 20, and the second electronic component 30 at a time. The molding resin 80 injected into the die flows over the first and second surfaces of the ceramic substrate 10. Accordingly, both the electronic components 20 and 30 are molded simultaneously. Completing the sealing with the molding resin 80 completes the electronic device according to the embodiment.

According to the embodiment, the first electronic component 20 is also mounted on the first surface of the ceramic substrate. The second electronic component 30 is mounted on the second surface thereof. The first electronic component 20 and the second electronic component 30 are both sealed with the molding resin 80. In the mold process, the molding resin 80 is injected to both the first and second surfaces of the ceramic substrate 10.

The embodiment also decreases a stress of the molding resin 80 on the ceramic substrate 10 from the first surface of the same in the mold process. As a result, the embodiment can prevent the ceramic substrate 10 from cracking in the mold process.

In the electronic device according to this embodiment and the first embodiment, the substrate 10 is not limited to a ceramic substrate and may represent a printed substrate made of resin or a metal substrate.

Figure 19:
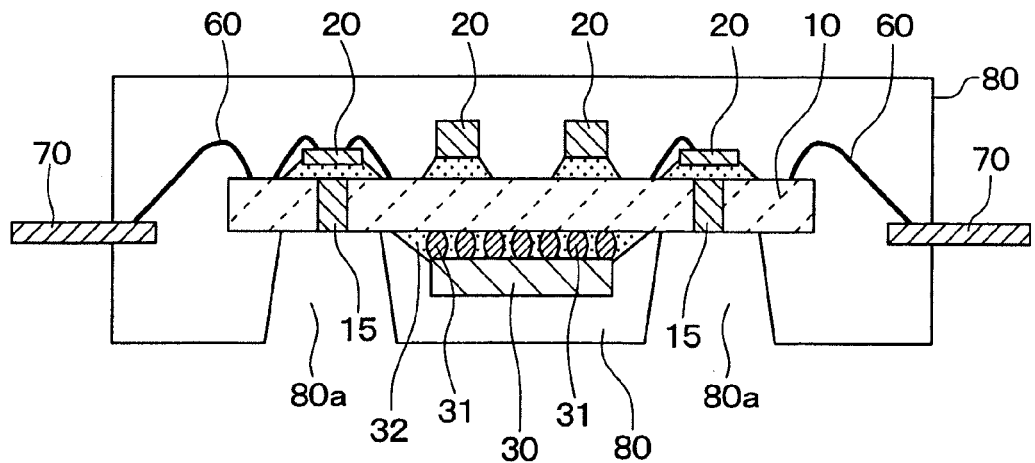
FIG. 19 is a schematic sectional view showing another example of the electronic device according to the eighth embodiment.

FIG. 19 is a schematic sectional view showing another example of the electronic device according to the eighth embodiment. This example uses a printed substrate for the substrate 10. A thermal via hole 15 is provided for the portion of the second surface of the substrate 10 exposed from the opening 80a of the molding resin 80. The exposed portion is provided so as to avoid the other portion corresponding to the second electronic component 30.

The thermal via hole 15 is formed through the first and second surface of the substrate 10 and is filled with metal paste such as Cu by means of printing or plating. The thermal via hole 15 is used for heat dissipation of the substrate 10. In this example, the thermal via hole 15 is exposed from the molding resin 80 to improve the radiation performance of the substrate 10 through the thermal via hole 15.

Figure 20A:
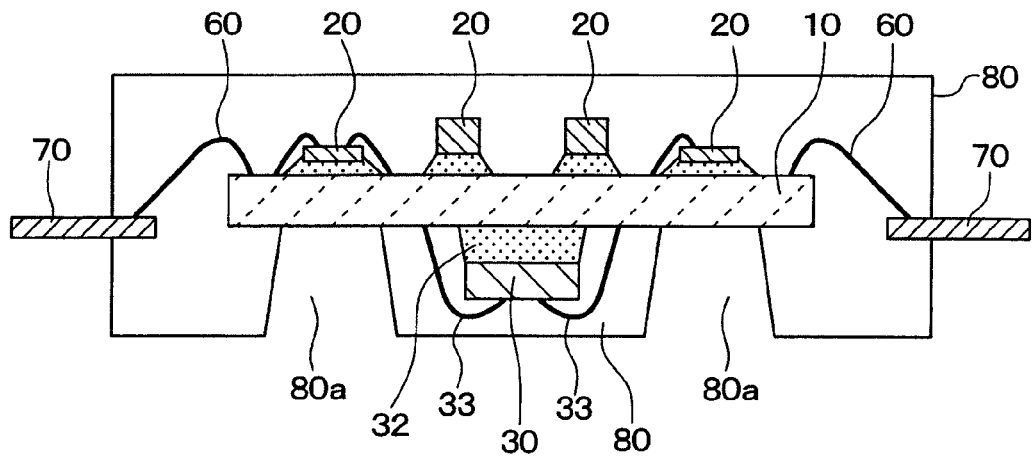
Figure 20B:
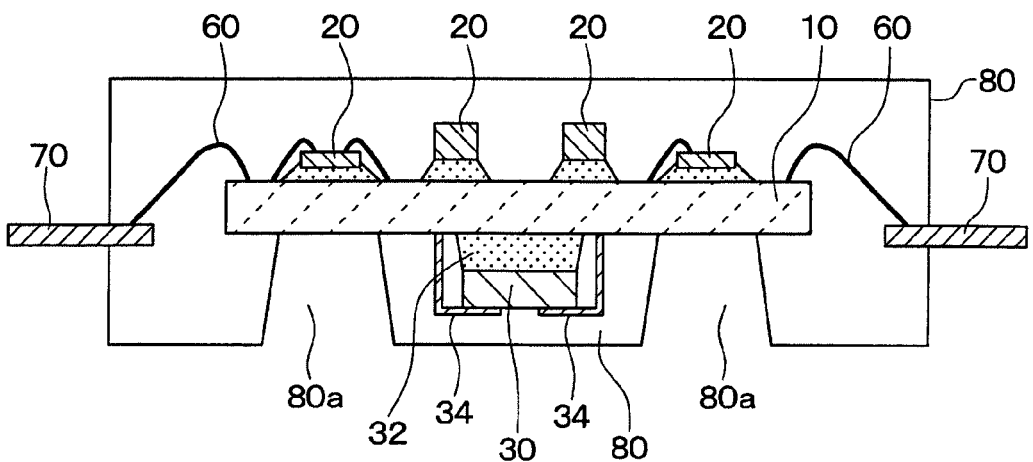

FIGS. 20A and 20B are schematic sectional views showing still another example of the electronic device according to the eighth embodiment. FIG. 20A shows an example of wire bonding connection for the second electronic component 30. FIG. 20B shows an example of tape connection for the same. According to the embodiment, the wire 33 made of gold or aluminum or a tape member 34 such as a flexible printed substrate or ribbon-shaped wiring may be used for connection with the second electronic component 30.

The electronic device according to the embodiment is configured by excluding the metal plate from the electronic device according to the first embodiment. The electronic device according to the eighth embodiment may be fabricated by the same procedure as the second or third embodiment. The eighth embodiment may use the ceramic substrate 10 having the depressed portion 10a as described in the fourth embodiment or may be combined with the other embodiments mentioned above.

According to the embodiment, the adhesive 40 may be used to bond the metal plate 50 to the portion of the substrate 10 exposed from the molding resin 80 other than the portion corresponding to the second electronic component 30. The surface opposite to the bonding surface of the metal plate 50 may be exposed from the molding resin 80. This configuration is the same as that of the electronic device according to the first embodiment.

Ninth Embodiment

Figure 21A:
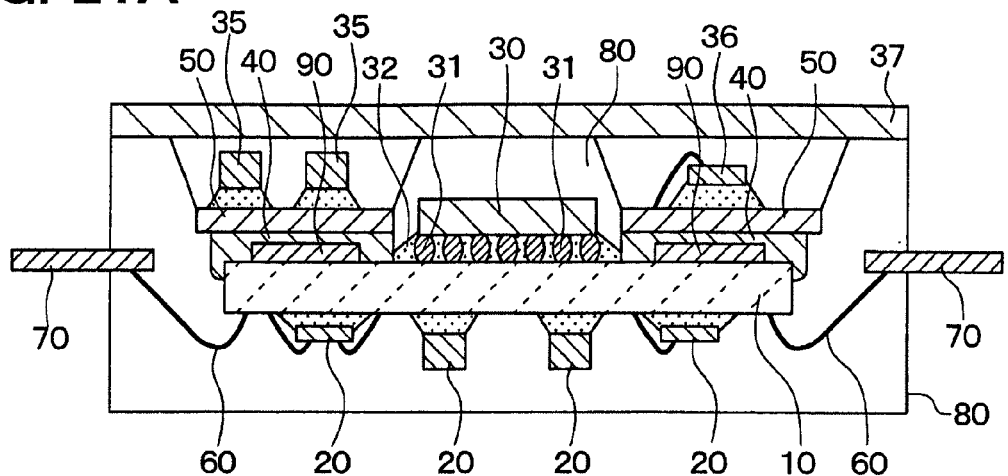
FIGS. 21A to 21C are schematic sectional views of an electronic device according to a ninth embodiment.
Figure 21B:
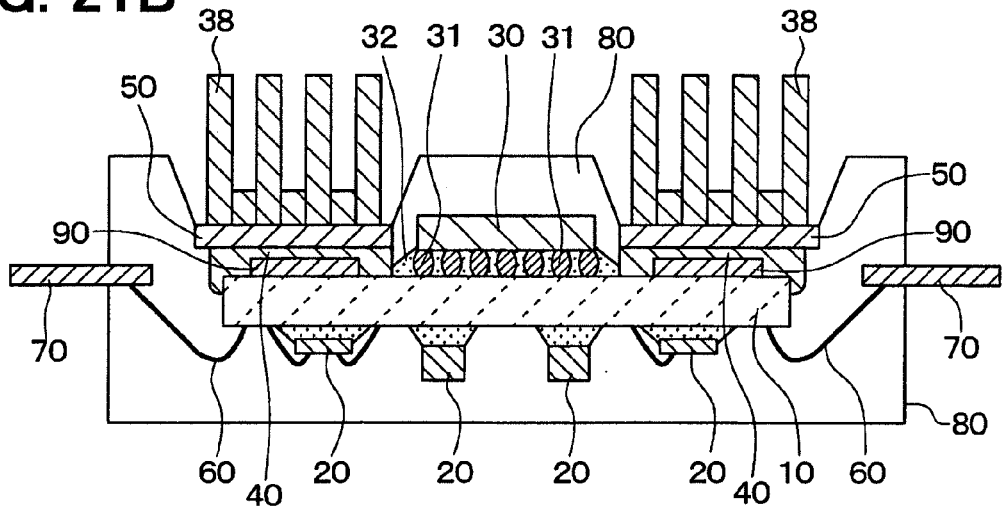
Figure 21C:
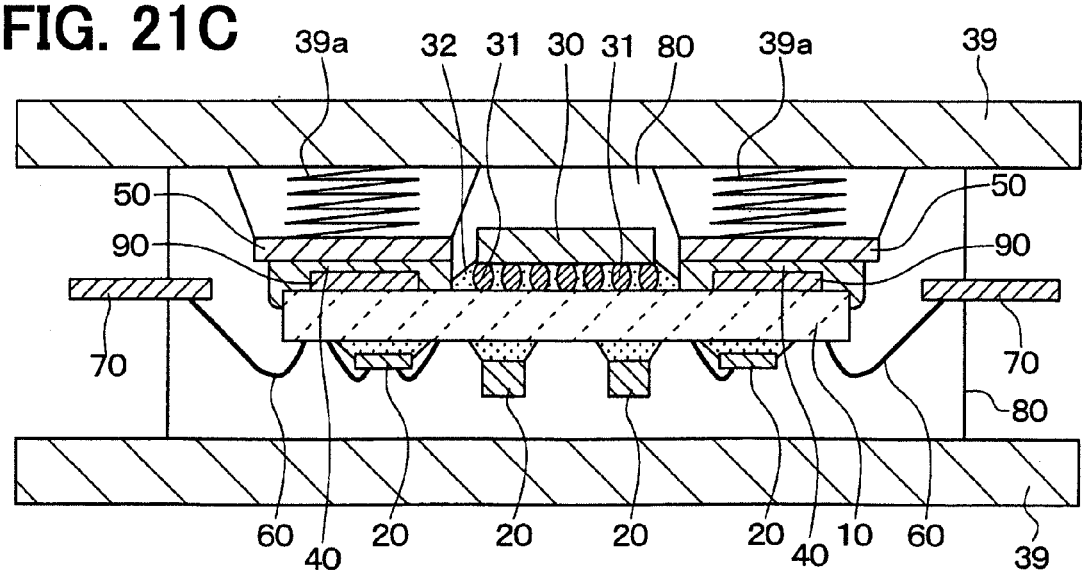

FIGS. 21A to 21C are schematic sectional views of an electronic device according to the ninth embodiment. FIGS. 21A, 21B, and 21C show first, second, and third examples of the embodiment, respectively. These examples attach additional components 35 through 39 to the electronic devices described in the first through seventh embodiments on surfaces of the metal plate 50 exposed from the molding resin 80.

FIG. 21A shows a sensor device 35 such as a pressure sensor, angle sensor, or temperature sensor and a passive device 36 mounted on surfaces of the metal plate 50 exposed from the molding resin 80. The devices may be bonded. A protective plate 37 such as a glass plate is bonded to seal the components 35 and 36. According to this example, the electronic device is preferably used as a sensor assembly.

FIG. 21B shows a heat dissipation fin 38 made of aluminum or copper attached to the surface of the metal plate 50 exposed from the molding resin 80 so as to improve the radiation performance. The heat dissipation fin 38 contacts with the metal plate 50 via heat dissipation grease (not shown).

FIG. 21C shows a heat dissipation block 39 attached to the surface of the molding resin on the first and second surfaces of the substrate 10 of the electronic device. The heat dissipation block 39 is made of aluminum or copper and is fixed by means of bonding or caulking. In this case, the electronic device is sandwiched between inner flat opposing surfaces of both heat dissipation blocks 39 so as to prevent the electronic device from warping.

The heat dissipation block 39 near the metal plate 50 is thermally connected with the metal plate 50 to improve the radiation performance. A spring member 39a is fixed between the metal plate 50 and the heat dissipation block 39 for the thermal connection. Instead of the spring member 39*a*, it may be preferable to use gel such as silicon gel featuring the radiation performance.

It is to be distinctly understood that the electronic device according to the embodiment may be combined with the manufacturing methods and configurations of the above-mentioned embodiments.

Tenth Embodiment

The tenth embodiment describes various examples of arranging the second electronic component 30 on the second surface of the substrate 10.

Figure 22A:
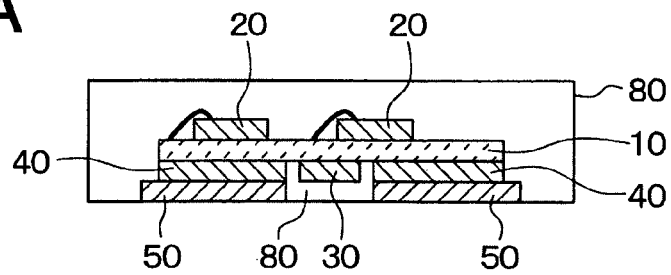
Figure 22B:
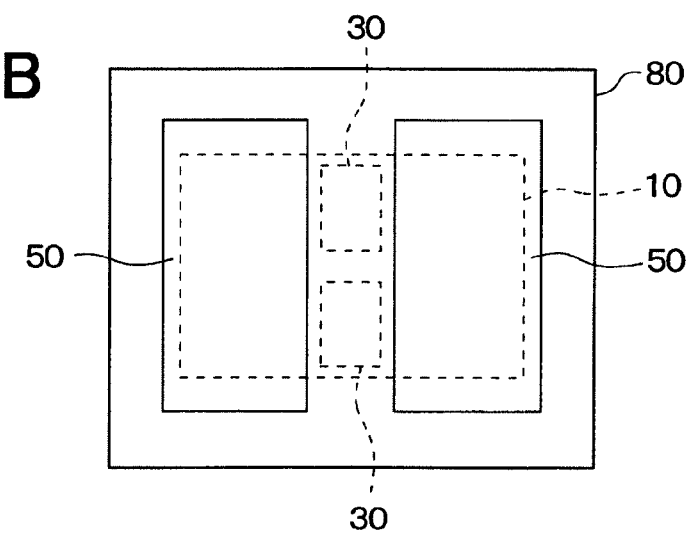
Figure 23A:
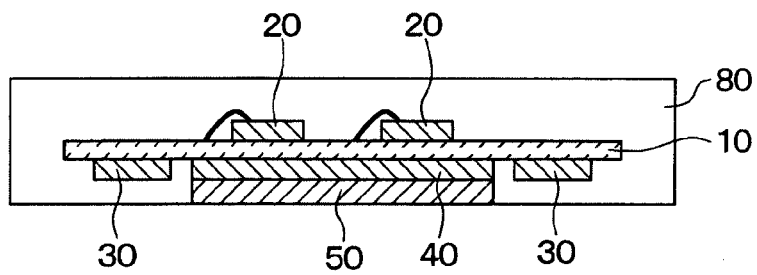
Figure 23B:
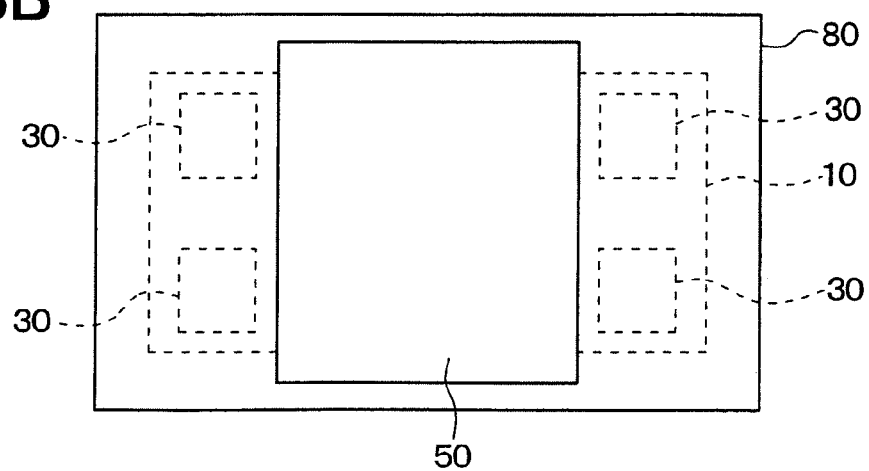

FIGS. 22A and 22B show a first example of an electronic device according to a tenth embodiment. FIG. 22A is a schematic sectional view. FIG. 22B is a schematic plan view viewed from the bottom of FIG. 22A. FIGS. 23A and 23B show a second example of the electronic device according to the tenth embodiment. FIG. 23A is a schematic sectional view. FIG. 23B is a schematic plan view viewed from the bottom of FIG. 23A.

The first example of the embodiment in FIGS. 22A and 22B shows the second electronic component 30 arranged at the center of the second surface of the substrate 10. The metal plate 50 is bonded to a periphery of the second surface of the substrate 10. The metal plate 50 is exposed from the molding resin 80.

The second example of the embodiment in FIGS. 23A and 23B shows the second electronic component 30 arranged at the periphery of the second surface of the substrate 10. The metal plate 50 is bonded to the center of the second surface of the substrate 10. The metal plate 50 is exposed from the molding resin 80.

According to both examples of the embodiment as shown in FIGS. 22A and 22B and 23A and 23B, the surface of the molding resin 80 is level with the surface of the metal plate 50 exposed from the molding resin 80 over the second surface of the substrate 10. This is advantageous for the following reason. An external heat dissipation member more easily contacts with the surface of the metal plate 50 than the case of protruding the surface of the molding resin 80 from the surface of the metal plate 50 (e.g., see FIGS. 1A and 1B).

Eleventh Embodiment

The eleventh embodiment describes various heat dissipation modes for the surface of the metal plate 50 exposed from the molding resin 80 over the second surface of the substrate 10. Heat dissipation modes are available to the surface of the metal plate 50 by exchanging heat with heat dissipation members such as solid for solid heat dissipation, gas for gas heat dissipation, and liquid for liquid heat dissipation.

Figure 24A:
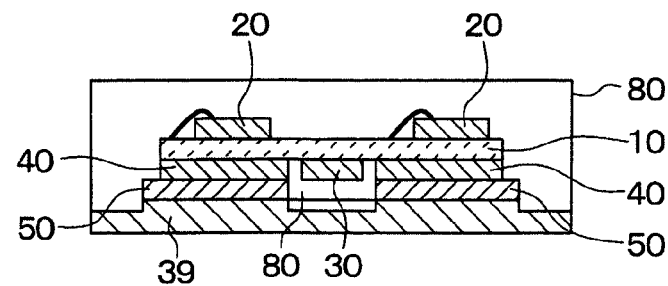
Figure 24B:
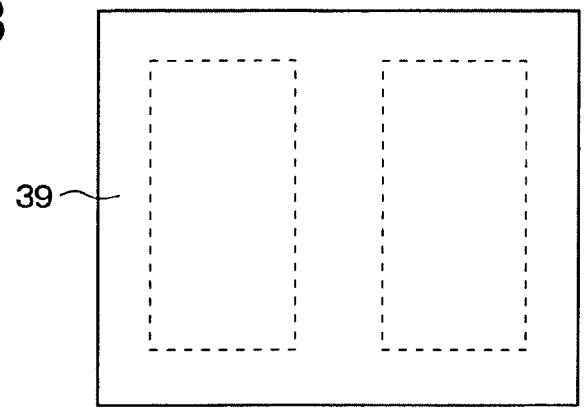
Figure 25A:
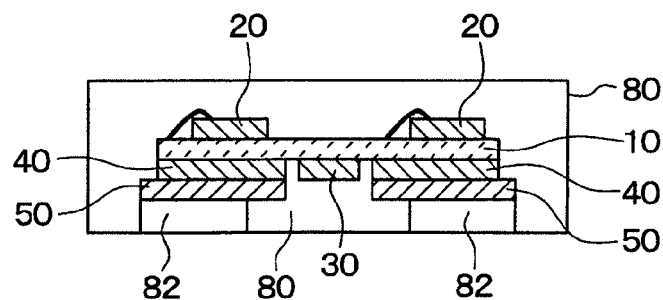
Figure 25B:
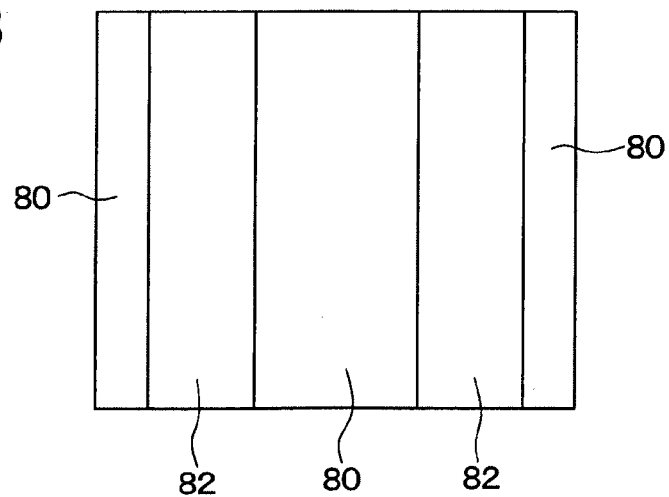

FIGS. 24A and 24B show a first example of an electronic device according to the eleventh embodiment. FIG. 24A is a schematic sectional view. FIG. 24B is a schematic plan view viewed from the bottom of FIG. 24A. FIGS. 25A and 25B show a second example of the electronic device according to the eleventh embodiment. FIG. 25A is a schematic sectional view. FIG. 25B is a schematic plan view viewed from the bottom of FIG. 25A.

The first example of the embodiment in FIGS. 24A and 24B directly contacts the heat dissipation block 39 with the surface of the metal plate 50 exposed from the molding resin 80 over the second surface of the substrate 10 so as to thermally connect the metal plate 50 with the heat dissipation block. Since the exposed surface of the metal plate 50 retracts from the molding resin 80, the heat dissipation block 39 is provided with a protrusion to directly contact with the metal plate 50.

The second example of the embodiment in FIGS. 25A and 25B provides a liquid channel 82 for the surface of the metal plate 50 exposed from the molding resin 80 over the second surface of the substrate 10. The liquid channel 82 is used for liquid refrigerant such as water and oil to flow. The liquid channel 82 is formed by wall surfaces of the molding resin 80 protruding from the exposed surface of the metal plate 50.

It is to be distinctly understood that the embodiment may be combined with the manufacturing methods and configurations of the above-mentioned embodiments. For example, the eleventh embodiment may omit the metal plate 50 and directly expose the second surface of the substrate 10 from the molding resin 80. The heat dissipation modes in FIGS. 24A and 24B and FIGS. 25A and 25B may be applied to this exposed surface.

Twelfth Embodiment

Figure 26A:
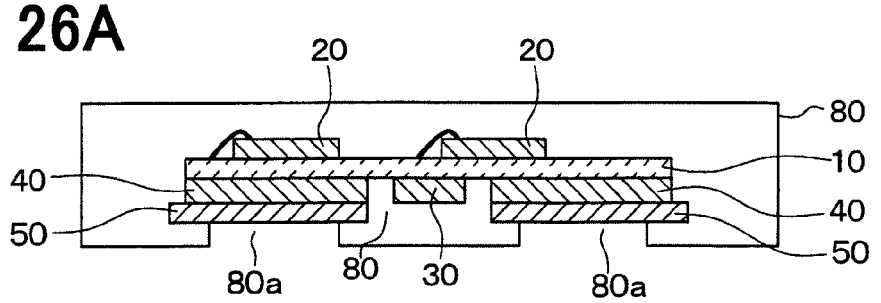
Figure 26B:
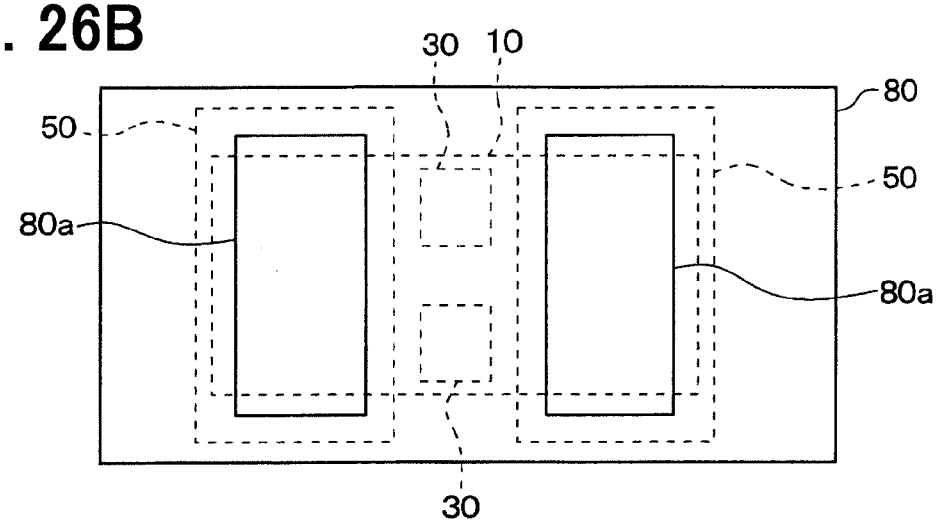

FIGS. 26A and 26B show an electronic device according to the twelfth embodiment. FIG. 26A is a schematic sectional view. FIG. 26B is a schematic plan view viewed from the bottom of FIG. 26A.

Similarly to the first embodiment or elsewhere, the twelfth embodiment uses the adhesive 40 to bond the metal plate 50 to a portion of the second surface of the substrate 10 so as to avoid the portion corresponding to the second electronic component 30. The surface opposite to the bonding surface of the metal plate 50 is exposed from the molding resin 80. According to this configuration, the surface of the molding resin 80 protrudes outward from the surface of the metal plate 50 exposed from the molding resin 80 over the second surface of the substrate 10.

In the configuration of the embodiment as shown in FIGS. 26A and 26B, the molding resin 80 seals the surface of the metal plate 50 along its periphery, that is, adjacent to the surface thereof exposed from the molding resin 80.

In FIGS. 1A and 1B or elsewhere, for example, the periphery of the surface of the metal plate 50 is not sealed with part of the molding resin 80 adjacent to the surface of the metal plate 50 exposed from the molding resin 80 over the second surface of the substrate 10. The molding resin 80 ends at the edge of the metal plate 50.

In this case, the line showing the opening of the molding resin 80 coincides with the outline of the metal plate 50 when viewed from the second surface of the substrate 10. According to the twelfth embodiment, however, the line showing the opening of the molding resin 80 is positioned inside the outline of the metal plate 50 when viewed from the second surface of the substrate 10.

The embodiment can decrease a stress on an interface between the metal plate 50 and the molding resin 80 because the molding resin 80 seals the periphery of the surface of the metal plate 50. As a result, it is possible to more improve an effect of preventing the molding resin 80 from peeling off the metal plate 50.

It is to be distinctly understood that the embodiment may be also combined with the manufacturing methods and configurations of the above-mentioned embodiments. The embodiment may also omit the metal plate 50 and directly expose the second surface of the substrate 10 from the molding resin 80.

Thirteenth Embodiment

Figure 27A:
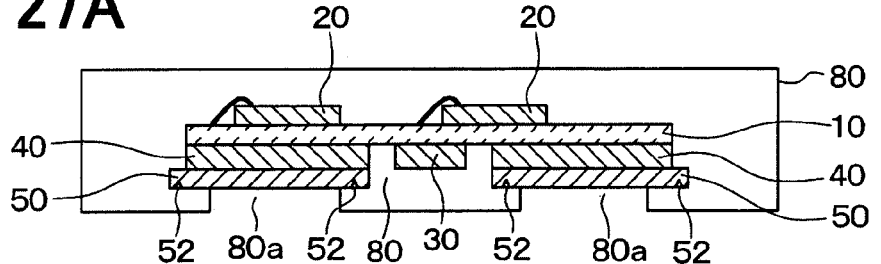
Figure 27B:
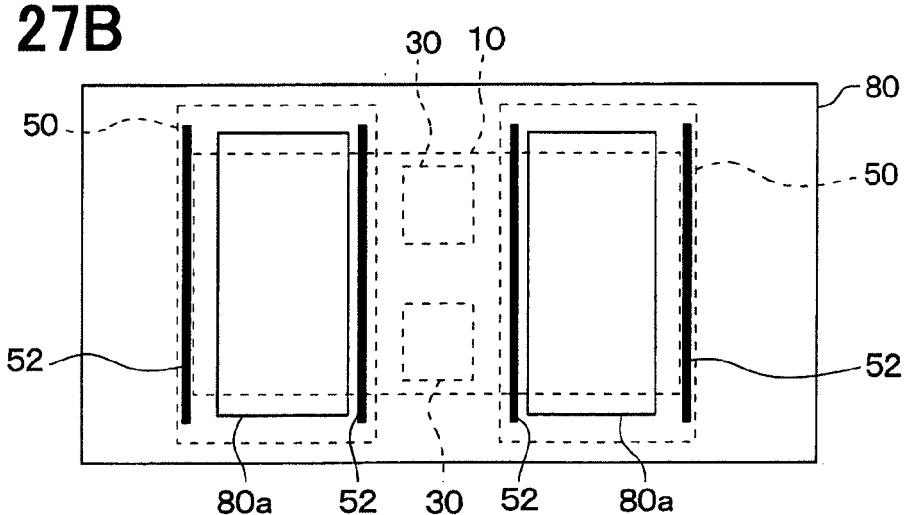

FIGS. 27A and 27B show an electronic device according to the thirteenth embodiment. FIG. 27A is a schematic sectional view. FIG. 27B is a schematic plan view viewed from the bottom of FIG. 27A. The thirteenth embodiment is an improvement of the twelfth embodiment.

As shown in FIGS. 27A and 27B, the molding resin 80 seals the surface of the metal plate 50 along its periphery, that is, adjacent to the surface thereof exposed from the molding resin 80 over the second surface of the substrate 10. In addition, the embodiment forms a groove 52 in the portion of the molding resin 80 that seals the periphery of the surface of the metal plate 50. The groove 52 provides an indentation that prevents the molding resin 80 from peeling off. The groove 52 is formed by pressing or etching, for example.

According to the embodiment, the molding resin 80 engages the indentation formed by the groove 52 at the portion of the molding resin 80 that seals the periphery of the surface of the metal plate 50. That is, the groove 52 provides an anchor effect to prevent the molding resin 80 from peeling off.

The groove 52 may be replaced by a protrusion from the surface of the metal plate 50. Basically, it just needs to form an indentation for providing the anchor effect at the portion of the molding resin 80 that seals the periphery of the surface of the metal plate 50.

Fourteenth Embodiment

Figure 28A:
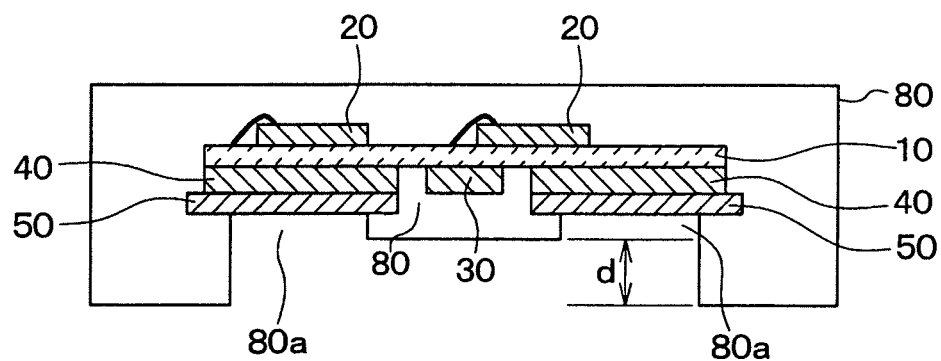
Figure 28B:
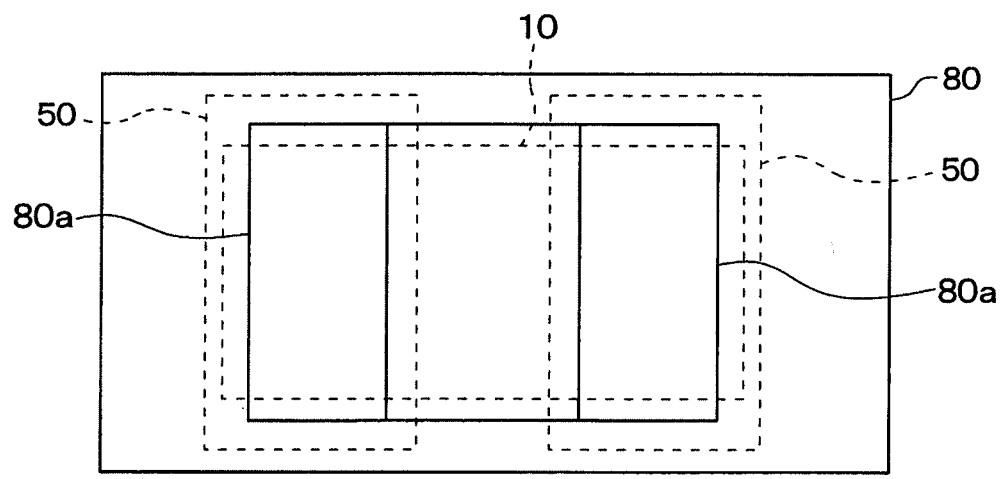

FIGS. 28A and 28B show an electronic device according to the fourteenth embodiment. FIG. 28A is a schematic sectional view. FIG. 28B is a schematic plan view viewed from the bottom of FIG. 28A. According to the embodiment, the surface of the molding resin 80 protrudes outward from the surface of the metal plate 50 exposed from the molding resin 80 over the second surface of the substrate 10.

As shown in FIGS. 28A and 28B, the electronic device according to the embodiment is provided with the molding resin 80 at the center and the periphery of the electronic device over the second surface of the substrate 10. The molding resin at the center of the electronic device seals the second electronic component 30. The molding resin 80 provided for the periphery includes itself only.

The part of the molding resin 80 at the periphery of the electronic device is thicker than the part of the molding resin 80 at the center thereof. In FIGS. 28A and 28B, the thick molding resin 80 at the periphery of the electronic device is shaped like a square frame equivalent to the periphery of the electronic device. The thin molding resin 80 at the center thereof is shaped like an elongated rectangle when viewed in plan.

The thickness of the electronic device is equal to a distance between the surface of the molding resin 80 over the first surface of the substrate 10 and the surface of the molding resin 80 over the second surface thereof. The embodiment provides the electronic device of different thickness partially. The periphery of the electronic device is thicker than the center thereof by dimension d as shown in FIG. 28A.

The embodiment partially changes the thickness of the molding resin 80 provided over the second surface of the substrate 10. The molding resin 80 can be easily provided with different thickness by adjusting a die for the mold process. According to the embodiment, the periphery of the electronic device is thicker than the center thereof, making it possible to prevent the substrate 10 from warping.

Fifteenth Embodiment

The fifteenth embodiment describes various planar shapes of the molding resin 80 provided for the second surface of the substrate 10.

Figure 29A:
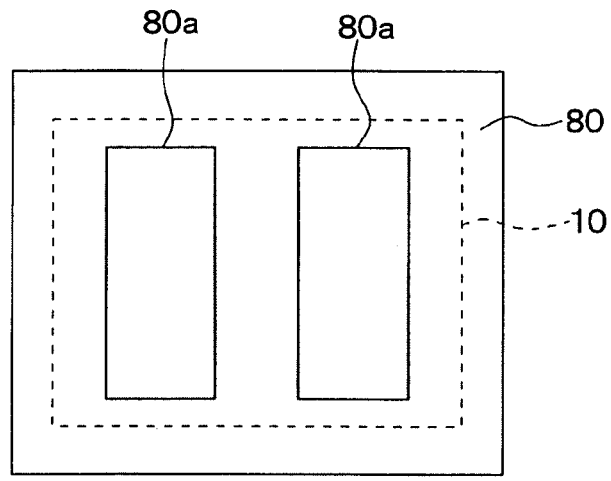
FIGS. 29A to 29C are schematic plan views showing various planar shapes of a molding resin on a second surface of a substrate according to a fifteenth embodiment.
Figure 29B:
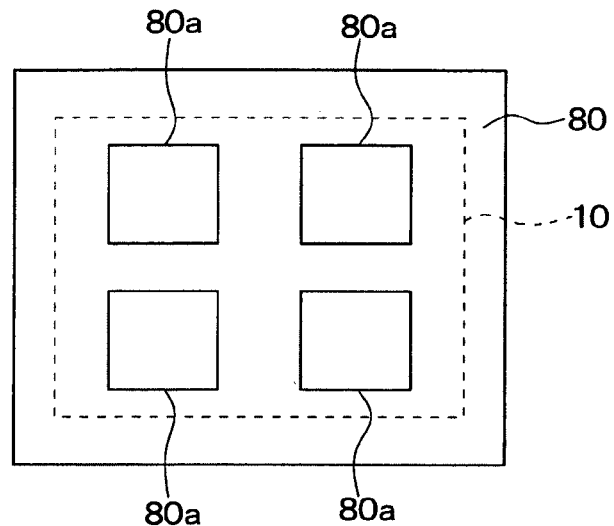
Figure 29C:
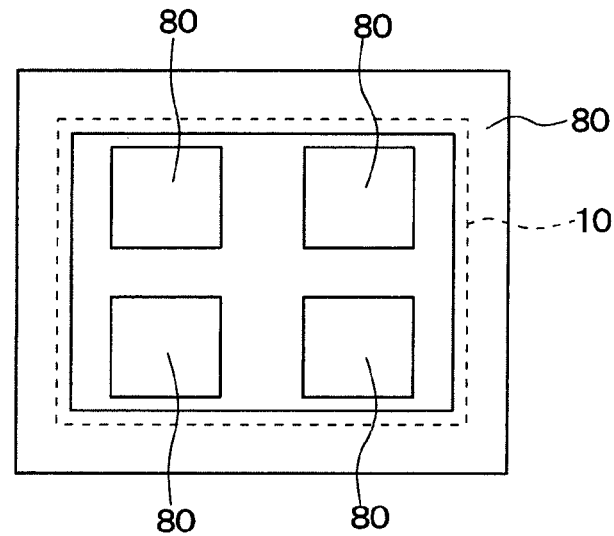
Figure 30:
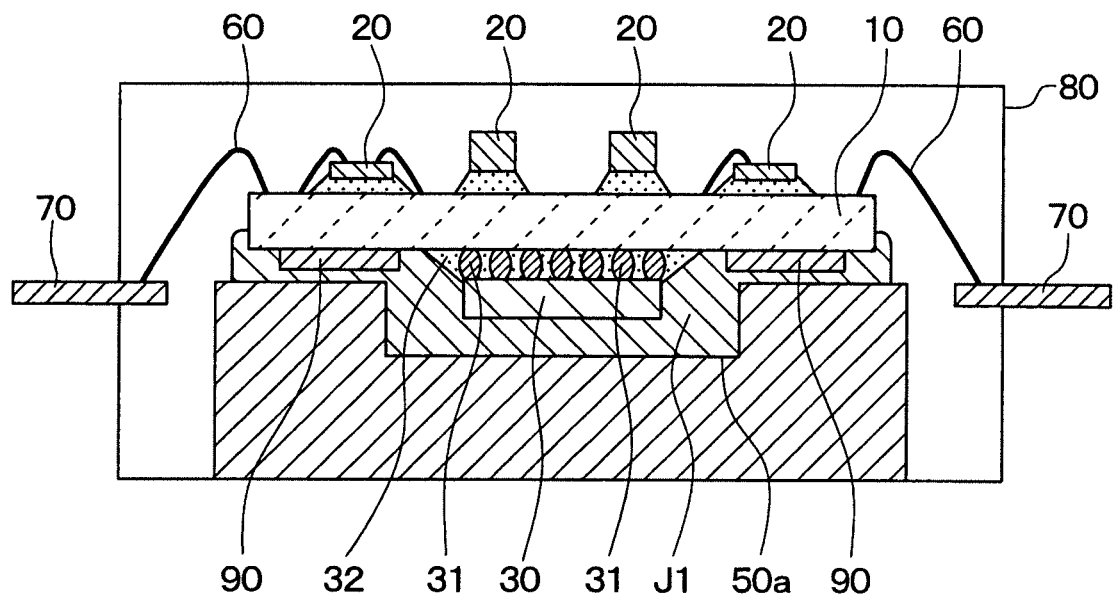
FIG. 30 is a schematic sectional view showing an electronic device as a prototype according to a related art.

FIGS. 29A, 29B, and 29C show first, second, and third examples of planar shapes for the molding resin 80 according to the embodiment. The embodiment provides the planar shapes for the molding resin 80 and is applicable to the above-mentioned embodiments.

As shown in FIGS. 29A to 29C, the substrate 10 according to the embodiment is a square plate in plan view. In FIGS. 29A to 29C, the second surface of the substrate 10 is exposed from the opening 80a where no molding resin 80 is used. The metal plate may be bonded to the exposed portion similarly to FIGS. 1A and 1B.

According to the first example in FIG. 29A, the strip-shaped molding resin 80 is formed at the center and both sides over the second surface of the substrate 10 so as to extend between a pair of top and bottom opposite sides of the second surface of the substrate 10 in the vertical direction.

According to the second example in FIG. 29B, the strip-shaped molding resin 80 is formed like a cross so as to extend between a pair of top and bottom opposite sides of the second surface of the substrate 10 in the vertical direction and between a pair of left and right opposite sides of the second surface of the substrate 10 in the horizontal direction.

As shown in FIGS. 29A and 29B, the molding resin 80 provided on the second surface of the substrate 10 has the strip shape as a planar shape extending between the pair of opposite sides of the second surface. When the molding resin 80 is injected to the second surface of the substrate 10, the molding resin 80 easily flows from one of the pair of opposite sides to the other on the second surface. The molding resin 80 can be injected efficiently.

In addition, the molding resin 80 may have the planar shape according to the third example as shown in FIG. 29C. It is to be distinctly understood that the molding resin 80 may have the other planar shapes than those shown in the above-mentioned examples.

Sixteenth Embodiment

Figure 31A:
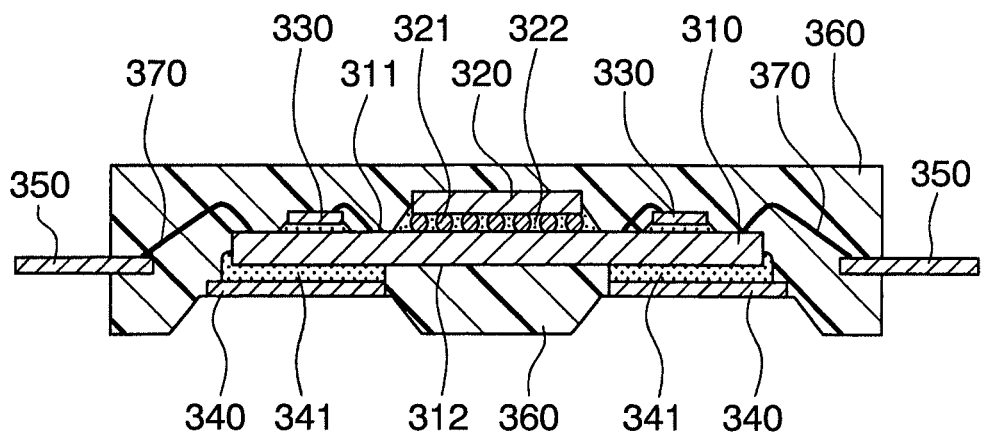
Figure 31B:
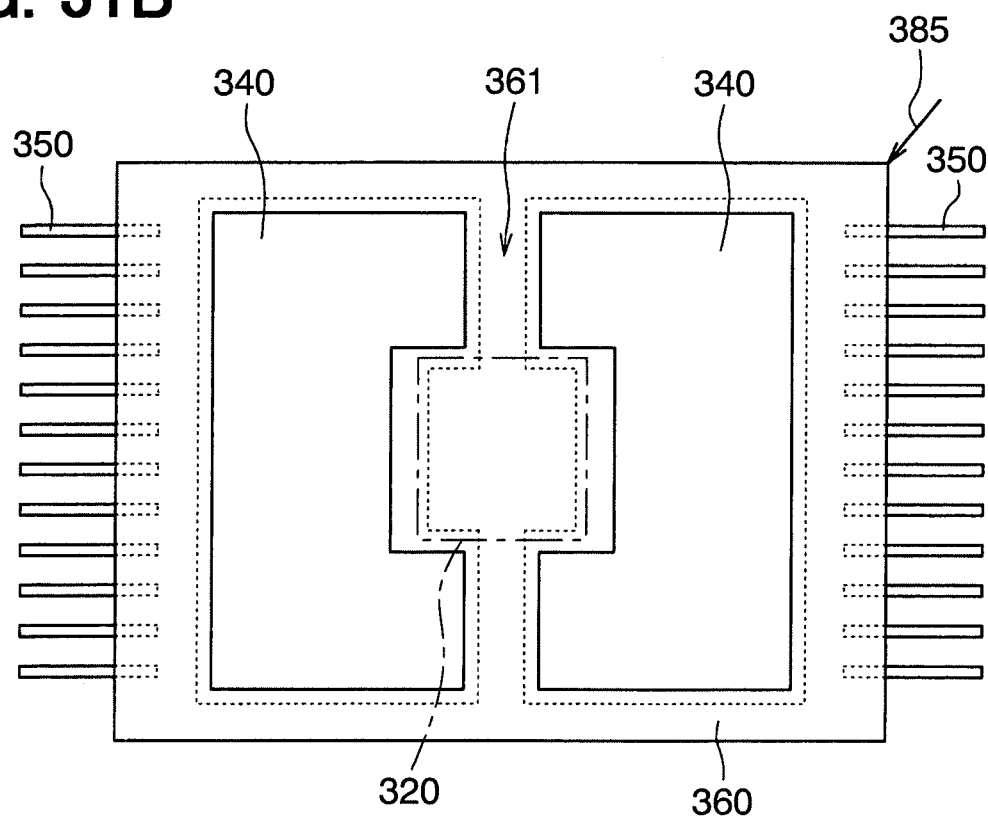

The following describes the sixteenth embodiment with reference to the accompanying drawings. FIGS. 31A and 31B show an electronic device according to the sixteenth embodiment. FIG. 31A is a sectional view. FIG. 31B is a schematic plan view of the electronic device viewed from the bottom of FIG. 31A.

The electronic device according to the embodiment includes a substrate 310, a first electronic component 320, a second electronic component 330, a metal plate 340, a lead frame 350, and a molding resin 360.

As shown in FIGS. 31A and 31B, the electronic device is a square plate-shaped mold package. For example, the package size is approximately 50×50×6.6 mm depending on the first electronic component 320 and the second electronic component 330 mounted, a circuit scale, or types of the electronic components.

The substrate 310 shown in FIG. 31A is a plate-shaped wiring substrate including a first surface 311 and a second surface 312 opposite to the first surface 311. Circuit wiring is provided on the first surface 311 of the substrate 310 and inside the same. The substrate 310 uses a ceramic substrate, printed circuit board, and metal substrate, for example. The electric circuit of the substrate 310 is connected to the lead frame 350 via a wire 370. The wire 370 uses a Au or Al bonding wire and is attached to the substrate 310 using normal wire bonding.

The first electronic component 320 is a precision component such as an LSI or a flip chip device mounted on the first surface 311 of the substrate 310. The first electronic component 320 is electrically connected to the electric circuit of the substrate 310 via a bump 321. An underfill 322 is filled between the first electronic component 320 and the substrate 310. The underfill 322 is made of epoxy resin functioning as reinforcing resin.

The second electronic component 330 includes components such as a coil, power device, control device, capacitor, and oscillator mounted on the first surface 311 of the substrate 310. The second electronic component 330 is electrically connected to the electric circuit of the substrate 310 via a bonding wire such as Al and Au or a die mount material such as solder or electrically conductive adhesive. Unlike the first electronic component 320 as a precision component, the second electronic component 330 is resistive to influence such as deformation of the substrate 310.

The metal plate 340 is bonded to the second surface 312 of the substrate 310 through an adhesive 341 so as to expose a portion of the second surface 312 of the substrate 310 projectively corresponding to the first electronic component 320 on the second surface 312. In other words, the metal plate 340 is bonded to a portion of the second surface 312 of the substrate 310 through the adhesive 341 other than the portion of the second surface 312 of the substrate 310 projecting the first electronic component 320 onto the second surface 312. On the second surface 312 of the substrate 310, the metal plate 340 is not arranged at a position corresponding to the first electronic component 320. The metal plate 340 is arranged so as to avoid the first electronic component 320.

As shown in FIG. 31B, the metal plate 340 is shaped into a squared horseshoe. Two metal plates 340 are provided. Both metal plates 340 are arranged to form a ring. A region is provided between the metal plates 340 and contains no metal plate 340. A portion of the region enclosed in a dash-dot line corresponds to "the portion of the second surface 312 of the substrate 310 projecting the first electronic component 320 onto the second surface 312" mentioned above. This portion contains no metal plate 340.

In FIG. 31B, a dotted line around the metal plate 340 corresponds to an opening edge of the molding resin 360 beneath the electronic component. An arrow in FIG. 31B indicates an example location for a molding resin gate 385 to be described later.

Each metal plate 340 is positioned correspondingly to a heater element such as a power element belonging to the second electronic component 330 mounted on the first surface 311 of the substrate 310. That is, the metal plate 340 also functions as a heat sink. The heater element is connected to the electric circuit on the first surface 311 of the substrate 310 via Ag paste. For reliable heat transfer, the Ag paste preferably indicates a thermal conductivity of greater than or equal to 4 W/m·K.

A gap is provided between the two metal plates 340. The gap is used as an injection channel 361 for injecting resin to the above-mentioned portion when the molding resin 360 is molded.

The adhesive 341 bonds the metal plate 340 to the second surface 312 of the substrate 310. For example, the adhesive 341 uses silicone resin as a main component. In particular, the adhesive 341 preferably indicates a thermal conductivity of greater than or equal to 4 W/m·K to reliably transfer the heat of the substrate 310 to the metal plate 340.

The metal plate 340 and the lead frame 350 are made by pressing or etching a lead frame material. The metal plate 340 is configured as an island for the lead frame material. The lead frame 350 is configured as wiring for electric connection to the outside. A thickness of the metal plate 340 is essentially equal to that of the lead frame 350.

The metal plate 340 and the lead frame 350 are mainly made of a Cu lead frame material in consideration for heat dissipation. However, there is a large difference between linear expansion coefficients for the Cu lead frame material and the substrate 310. A Fe material may be used for the purpose of matching the linear expansion coefficients.

Specifically, a preferable lead frame material indicates linear expansion coefficient $\alpha$ of smaller than or equal to 11 and Young's modulus E of smaller than 200 GPa in consideration for consistency of the linear expansion coefficient with the substrate 310 and a stress at the substrate edge. More preferably, the lead frame material may be conditioned to be $\alpha<9$ GPa and E<150 GPa.

In consideration for weldability, the lead frame material may be plated with PPF (Ni/Pd/Au) such as electrolytic nickel, Sn, and Au. The material surface may be roughened to prevent the molding resin 360 from peeling off.

The molding resin 360 is a resin member for sealing the substrate 310, the first electronic component 320, and the second electronic component 330. Transfer mold technique is used to form the molding resin 360.

Specifically, the molding resin 360 seals not only the first surface 311 of the substrate 310 but also the second surface 312 thereof so as to expose the metal plate 340 as shown in FIG. 31B. The molding resin 360 also seals a portion of the first surface 311 of the substrate 310 for mounting the first electronic component 320 and a portion of the second surface 312 of the substrate 310 exposed from the metal plate 340 in sandwich fashion.

The molding resin 360 just needs to seal only the portion of the substrate 310 in sandwich fashion so as not to deform the substrate 310 or the first electronic component 320 due to a molding pressure of the resin. The embodiment aims to avoid deformation of the first electronic component 320 as a precision component such as LSI. The molding resin 360 sandwiches the portions of the substrate 310 on the first surface 311 and the second surface 312 projecting the first electronic component 320.

The molding resin 360 uses a mold material such as epoxy resin. The molding resin 360 often uses a resin with heat expansion coefficient $\alpha$ ranging between 8 and 14 for consistency of heat expansion coefficient $\alpha$ between each member and the substrate 310. The resin needs to feature a long gel time and low viscosity in consideration for filling efficiency of the molding resin 360 on the second surface of the substrate 310. The molding resin 360 preferably indicates a high glass transition point Tg for use under a high temperature.

The following shows a preferred example of the molding resin 360. For use with the metal plate 340 and the lead frame 350 made of Cu, the molding resin 360 preferably indicates such properties as linear expansion coefficient $\alpha 1<17$, Young's modulus E1<20 GPa, minimum melt viscosity<30 Pa·s (175° C.), gel time>20 seconds, and spiral flow>80 cm. The molding resin 360 preferably indicates Tg<150° C. or more preferably Tg<175° C. Further, the molding resin 360 preferably indicates $10<\alpha 1<14$, E1<17 GPa, and the minimum melt viscosity of 20 (Pa·s) or less. Moreover, the molding resin 360 preferably indicates the gel time of shorter than 25 seconds and the spiral flow of 100 cm.

The lead frame 350 partially protrudes as an outer lead from the molding resin 360. The outer leads enable electric connection between the electronic device and the outside. There has been described the overall configuration of the electronic device according to the embodiment.

Figure 32:
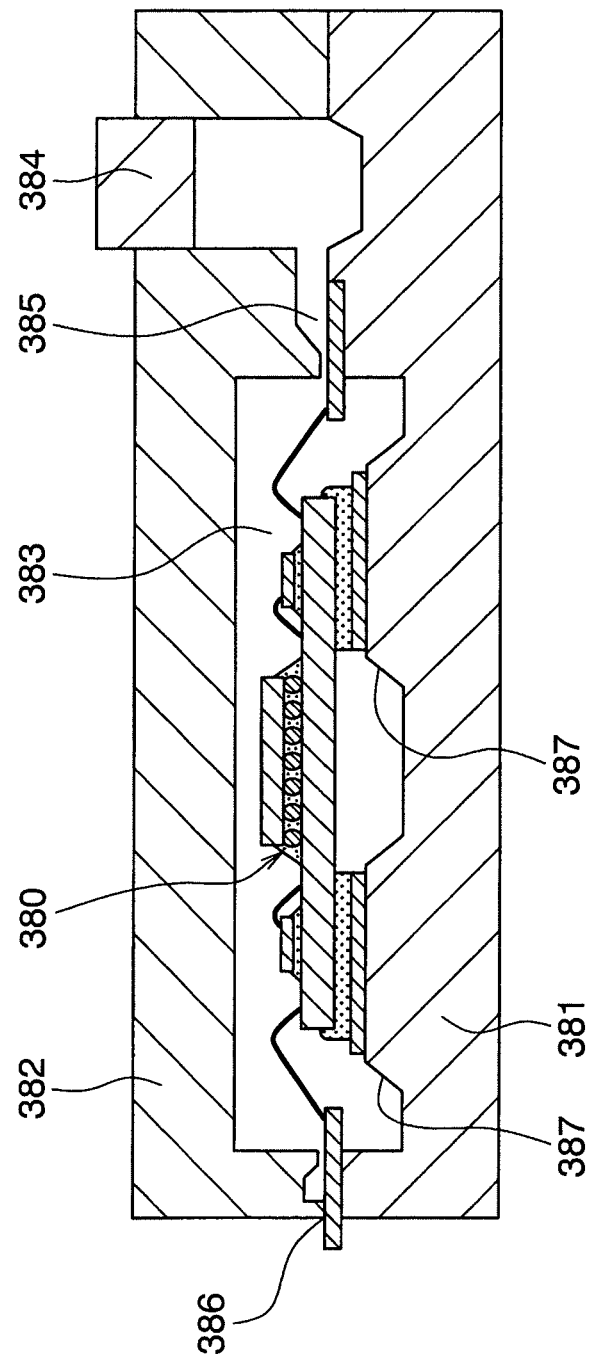
FIG. 32 shows a manufacturing process of the electronic device shown in FIGS. 31A and 31B.

The following describes a manufacturing method of the electronic device shown in FIGS. 31A and 31B with reference to FIG. 32. FIG. 32 shows a manufacturing process of the electronic device shown in FIG. 32.

The first electronic component 320 and the second electronic component 330 are mounted on the first surface 311 of the substrate 310 where an electric circuit is formed. Wire bonding is conducted as needed. A lead frame material is pressed to form the metal plate 340 and the lead frame 350. The metal plate 340 and the lead frame 350 are formed to be continuous through dam bars.

The metal plate 340 is bonded to the second surface 312 of the substrate 310 using the adhesive 341 so as to expose a portion of the second surface 312 of the substrate 310 projectively corresponding to the first electronic component 320. The wire is used to connect the substrate 310 with the lead frame 350 through wire bonding. The process provides a work 380 of the electronic device in FIGS. 31A and 31B excluding the molding resin 360.

A molding apparatus is then used to form the molding resin 360. As shown in FIG. 32, the molding apparatus includes a lower mold 381 and an upper mold 382. The lower mold 381 and the upper mold 382 are combined to form a space 383 equivalent to an outer shape of the electronic device. The upper mold 382 is provided with a plunger 384 for supplying the space 383 with the molding resin 360. The molding resin 360 is introduced into the space 383 from the plunger 384 through a molding resin gate 385. The upper mold 382 and the lower mold 381 are provided with an air vent 386 opposite to the molding resin gate 385 so as to exhaust air in the space 383 to the outside.

The lower mold 381 is provided with a protrusion 387 that contacts with the metal plate 340. The protrusion 387 contacts with the metal plate 340 so that the metal plate 340 can be exposed from the molding resin 360.

The prepared work 380 is placed on the lower mold 381 of the molding apparatus. The lower mold 381 and the upper mold 382 are stacked with each other. Thereafter, the molding resin 360 seals the first surface 311 of the substrate 310. The molding resin 360 seals the second surface 312 of the substrate 310 so as to expose the metal plate 340. To do this, the molding resin 360 is supplied from the plunger 384 and flows toward the first surface 311 and the second surface 312 of the metal plate 310.

The molding resin 360 flows through the second surface 312 of the substrate 310 and also passes through the injection channel 361 as shown in FIG. 31B. The molding resin 360 is also filled in the portion of the second surface 312 of the substrate 310 projectively corresponding to the first electronic component 320.

The molding resin 360 is filled in the space 383 to seal the first surface 311 and the second surface 312 of the substrate 310. A molding pressure of the molding resin 360 is applied to the work 380. At the portion of the substrate 310 provided with the first electronic component 320, the molding resin 360 seals the portion of the first surface 311 of the substrate 310 for mounting the first electronic component 320 and the portion of the second surface 312 of the substrate 310 exposed from the metal plate 340 in sandwich style.

The molding pressure of the molding resin 360 is uniformly applied from both the first surface 311 and the second surface 312 of the substrate 310. Therefore, the substrate 310 is not subjected to a molding pressure deflecting to the first surface 311 or the second surface 312. The substrate 310 or the first electronic component 320 is not deformed by a deflected molding pressure. Subsequently, dam bars are removed to complete the electronic device in FIGS. 31A and 31B.

As mentioned above, the embodiment seals the portion of the first surface 311 of the substrate 310 for mounting the first electronic component 320 and the portion of the second surface 312 of the substrate 310 exposed from the metal plate 340 in sandwich style.

The portion of the substrate 310 provided with the first electronic component 320 is subjected to a molding pressure of the molding resin 360 uniformly from the first surface 311 and the second surface 312 of the substrate 310. The structure can be subjected to the uniform molding pressure. Accordingly, the structure is not subjected to a force deflecting to the first surface 311 or the second surface 312 of the substrate 310. The portion of the substrate 310 provided with the first electronic component 320 can be prevented from deformation of the substrate 310 or the first electronic component 320 as a precision part.

The first electronic component 320 is equivalent to an electronic component.

Seventeenth Embodiment

Figure 33:
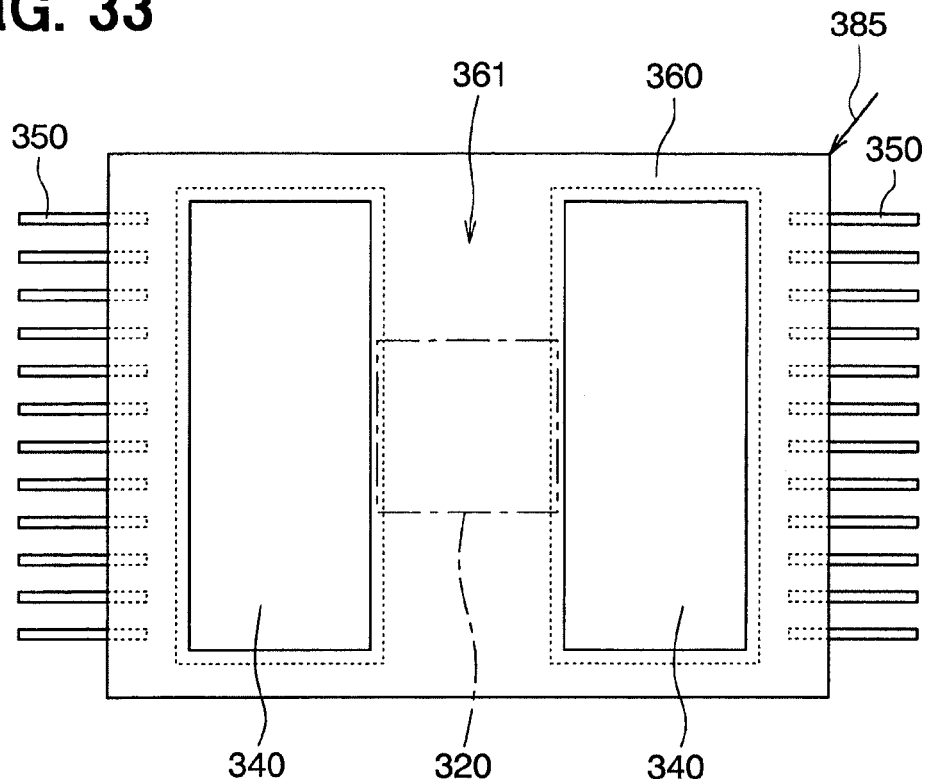
FIG. 33 is a schematic plan view of the electronic device according to a seventeenth embodiment viewed from the bottom of the electronic device.

The following describes only differences between the seventeenth and sixteenth embodiments. FIG. 33 is a schematic plan view of the electronic device according to the seventeenth embodiment viewed from the bottom of the electronic device and corresponds to FIG. 31B. In FIG. 33, a dotted line around the metal plate 340 corresponds to an opening edge of the molding resin 360 beneath the electronic component.

As shown in FIG. 33, the metal plate 340 is rectangular when viewed in plan. The two metal plates 340 are arranged with an interval. The interval is larger than the size of the first electronic component 320. The metal plate 340 is not arranged at a portion of the second surface 312 of the substrate 310 projectively corresponding to the first electronic component 320. That portion is provided with the molding resin 360.

According to the planar shape and the arrangement of the metal plate 340, the injection channel 361 for the molding resin 360 is wider than the injection channel 361 in FIG. 31B. The molding resin 360 can be positively supplied to the second surface 312 of the substrate 310, improving injection efficiency of the molding resin 360.

Eighteenth Embodiment

Figure 34:
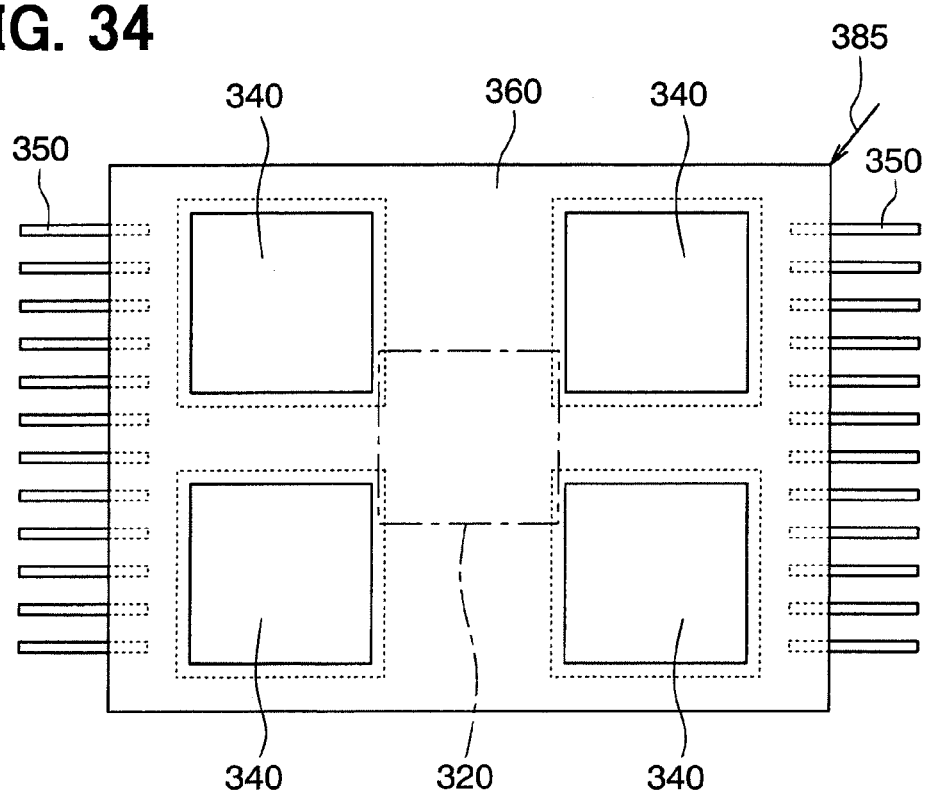
FIG. 34 is a schematic plan view of the electronic device according to an eighteenth embodiment viewed from the bottom of the electronic device.

The following describes differences between the eighteenth embodiment and the sixteenth and seventeenth embodiments. FIG. 34 is a schematic plan view of the electronic device according to the eighteenth embodiment viewed from the bottom of the electronic device and corresponds to FIG. 31B. In FIG. 34, a dotted line around the metal plate 340 corresponds to an opening edge of the molding resin 360 beneath the electronic component.

As shown in FIG. 34, the metal plate 340 is approximately square when viewed in plan. The four metal plates 340 are arranged so as to be positioned to apexes of a virtual quadrangle. None of the metal plates 340 is arranged to a portion of the second surface 312 of the substrate 310 projectively corresponding to the first electronic component 320. Each of the metal plates 340 is bonded to the second surface 312 of the substrate 310 so as to expose the portion of the second surface 312 of the substrate 310 projectively corresponding to the first electronic component 320.

The embodiment separately arranges the four metal plates 340. The molding resin 360 is accordingly arranged between the metal plates 340. The second surface 312 of the substrate 310 can be provided with more molding resins 360 than the examples of FIG. 31B and FIG. 33.

When the molding resin 360 shrinks and reaches a lower temperature, there is available approximately one-to-one correspondence between the amount of the molding resin 360 on the second surface 312 and that of the molding resin 360 on the first surface 311 of the substrate 310 with reference to the lead frame 350 or the substrate 310. The electronic device can be structured to provide reduced warpage.

Nineteenth Embodiment

Figure 35A:
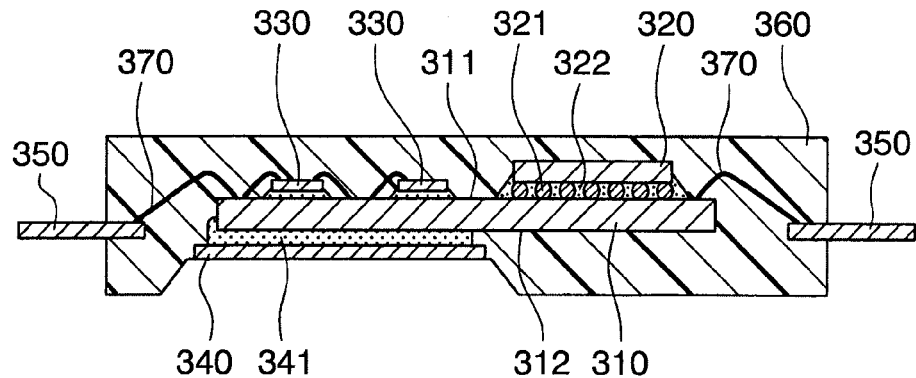
Figure 35B:
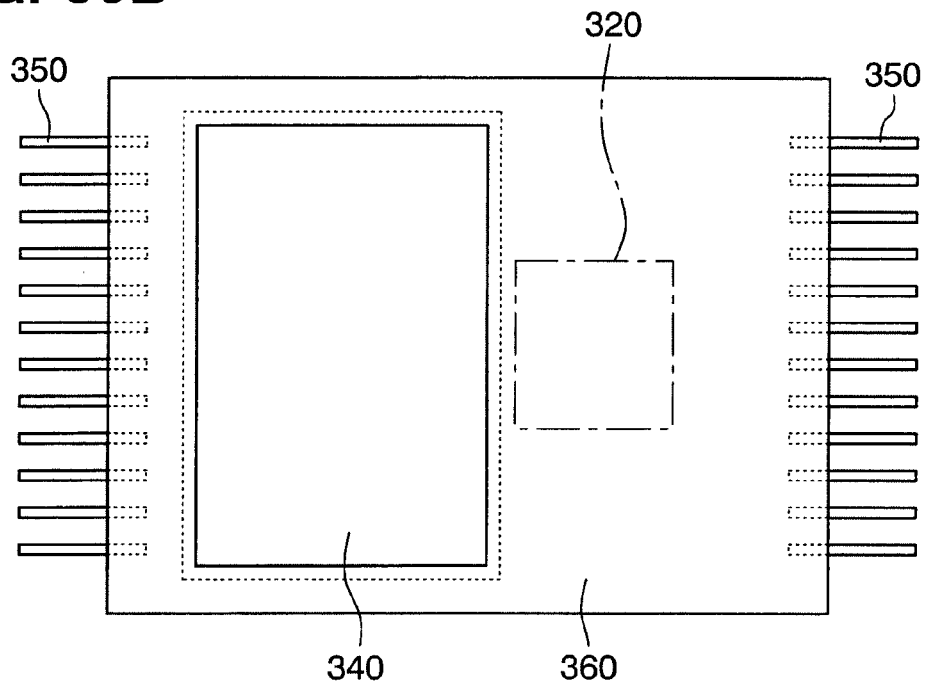

The following describes differences between the nineteenth embodiment and the sixteenth through eighteenth embodiments. FIGS. 35A and 35B show an electronic device according to the nineteenth embodiment. FIG. 35A is a sectional view. FIG. 35B is a schematic plan view of the electronic device viewed from the bottom of FIG. 35A. In FIG. 35B, a dotted line around the metal plate 340 corresponds to an opening edge of the molding resin 360 beneath the electronic component.

As shown in FIG. 35A, the embodiment does not mount the first electronic component 320 on an inner edge of the first surface 311 of the substrate 310 but toward one of the lead frames 350. The second electronic component 330 is accordingly arranged toward the other lead frame 350 opposite to the first electronic component 320 on the first surface 311 of the substrate 310.

As shown in FIG. 35B, the metal plate 340 is not arranged at the portion of the second surface 312 of the substrate 310 projectively corresponding to the first electronic component 320. The metal plate 340 is bonded to the second surface 312 of the substrate 310 corresponding to the arrangement position of the second electronic component 330. According to the embodiment, the metal plate 340 is rectangular when viewed in plan. The metal plate 340 is arranged so as to deflect to the other lead frame 350.

As mentioned above, the metal plate 340 can be freely arranged in accordance with a location on the first surface 311 of the substrate 310 for mounting the first electronic component 320 as a precision part.

Twentieth Embodiment

Figure 36:
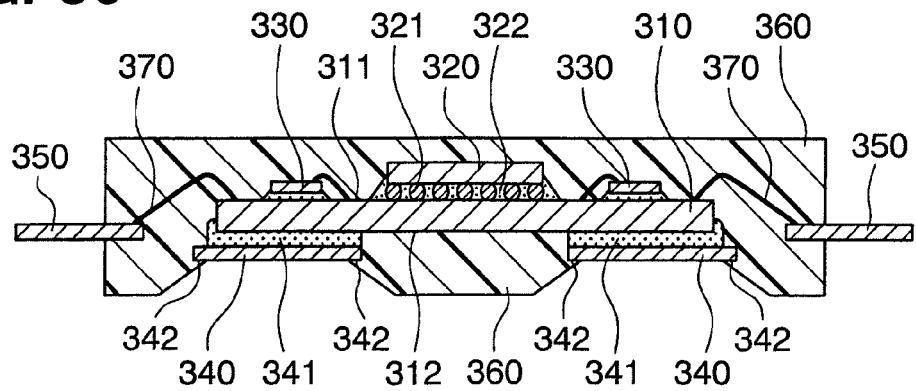
FIG. 36 is a schematic plan view of the electronic device according to a twentieth embodiment.

The following describes differences between the twentieth embodiment and the sixteenth through nineteenth embodiments. FIG. 36 is a schematic plan view of the electronic device according to the twentieth embodiment. As shown in FIG. 36, the molding resin 360 covers an outer edge 342 of the metal plate 340.

The molding resin 360 can cover the outer edge 342 of the metal plate 340 using the protrusion 387 of the lower mold 381 in the molding apparatus such that an area of the protrusion 387 in contact with the metal plate 340 is smaller than the metal plate 340.

As mentioned above, the molding resin 360 can cover the outer edge 342 of the metal plate 340 so as to wrap around the outer edge 342. It is possible to prevent the molding resin 360 from peeling off the metal plate 340.

Twenty-First Embodiment

Figure 37:
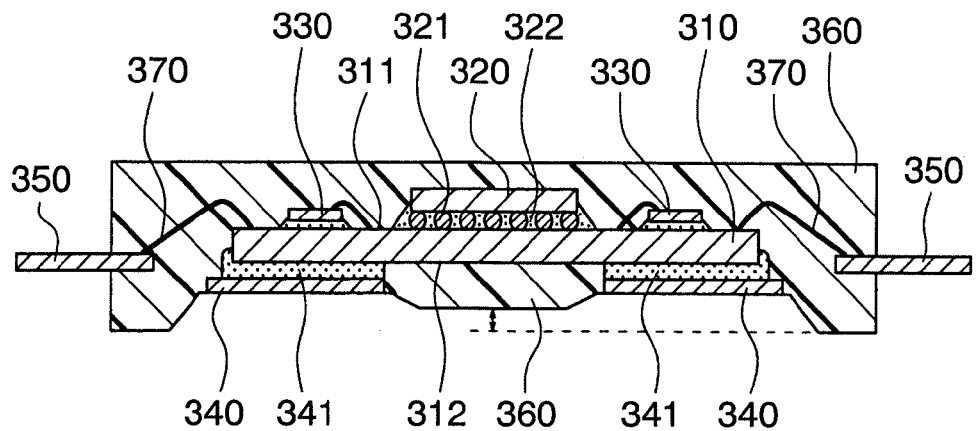
FIG. 37 is a schematic plan view of the electronic device according to a twenty-first embodiment.

The following describes differences between the twenty-first embodiment and the sixteenth through twentieth embodiments. FIG. 37 is a schematic plan view of the electronic device according to the twenty-first embodiment. As shown in FIG. 37, the height of the molding resin 60 differs from that in FIG. 31A on the second surface 312 of the substrate 310.

Specifically, the molding resin 360 is provided at the portion of the second surface 312 of the substrate 310 projectively corresponding to the first electronic component 320. In this case, the molding resin 60 is higher than the metal plate 340 with reference to the second surface 312 of the substrate 310. This portion of the molding resin 360 is lower than the highest portion of the molding resin 360 formed on the second surface 312 of the substrate 310.

The height of the molding resin 360 can be adjusted by changing the shape of the lower mold 381 in the molding apparatus. The height of the molding resin 360 can be changed freely. The structure can minimize possibility of a weld that is otherwise often generated on the second surface 312 where the molding resin 360 is injected inefficiently.

Adjusting the height of the molding resin 360 can also adjust a speed of injecting the molding resin 360 on the second surface 312 of the substrate 310. The work 380 placed in the lower mold 381 and the upper mold 382 can allow the same injection speed of the molding resin 360 on the first surface 311 and the second surface 312 of the substrate 310. It is possible to fill the molding resin 360 in the space 383 between the lower mold 381 and the upper mold 382 without leaving air in the space 383.

Since no air remains in the space 383, a uniform molding pressure can be applied to the first surface 311 and the second surface 312 of the substrate 310 simultaneously during the resin seal.

Twenty-Second Embodiment

Figure 38:
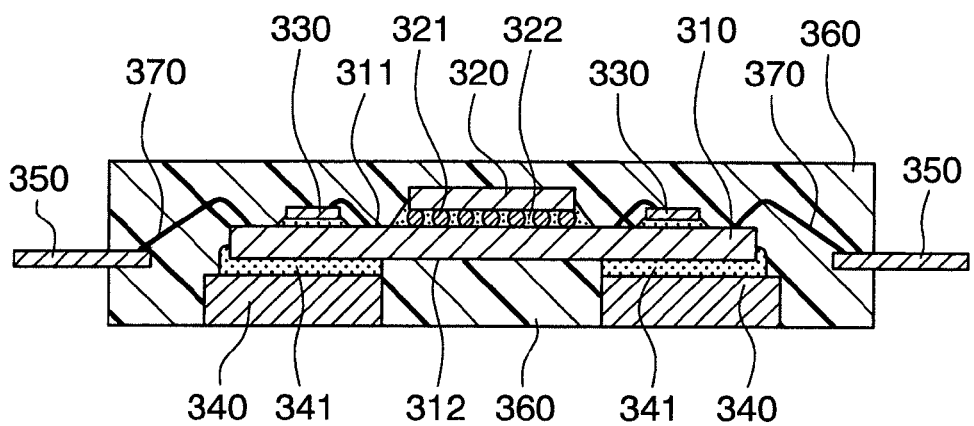
FIG. 38 is a schematic plan view of the electronic device according to a twenty-second embodiment.

The following describes differences between the twenty-second embodiment and the sixteenth through twenty-first embodiments. FIG. 38 is a schematic plan view of the electronic device according to the twenty-second embodiment. As shown in FIG. 38, the molding resin 360 is as high as the metal plate 340 on the second surface 312 of the substrate 310.

Specifically, the molding resin 360 is provided at the portion of the second surface 312 of the substrate 310 projectively corresponding to the first electronic component 320. In this case, the molding resin 360 is as high as the metal plate 340 with reference to the second surface 312 of the substrate 310. This portion of the molding resin 360 is as high as the highest portion of the molding resin 360 formed on the second surface 312 of the substrate 310.

According to the embodiment, the metal plate 340 is thicker than that shown in FIGS. 31A and 31B so that the metal plate 340 is as high as the molding resin 360. For example, a differently shaped material is used as the metal plate 340. Different materials may be used for the metal plate 340 and the lead frame 350.

Since the electronic device has a leveled height on the second surface 312 of the substrate 310, there is no need to conform the shape of another member for mounting the electronic device to the electronic device. The electronic device can be easily attached to the other members.

Twenty-Third Embodiment

Figure 39:
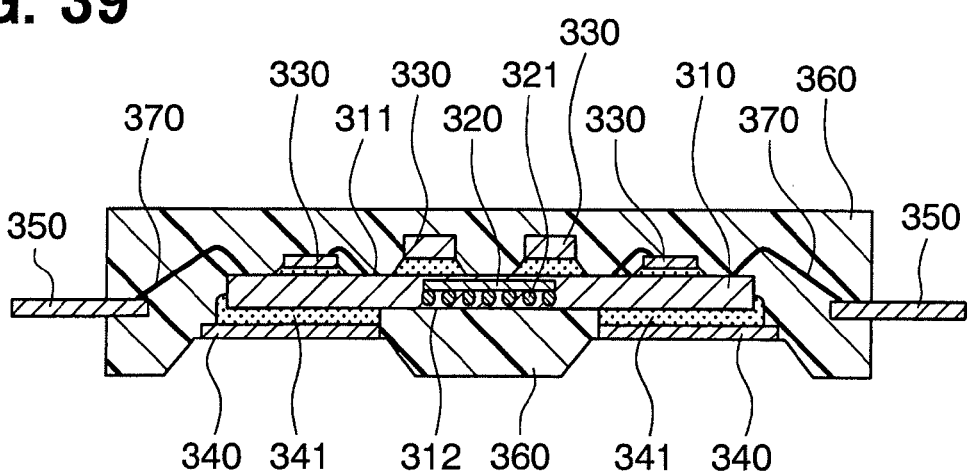
FIG. 39 is a schematic plan view of the electronic device according to a twenty-third embodiment.

The following describes differences between the twenty-third embodiment and the sixteenth through twenty-second embodiments. FIG. 39 is a schematic plan view of the electronic device according to the twenty-third embodiment. As shown in FIG. 39, the substrate 310 contains the first electronic component 320 such as LSI.

The substrate 310 is laminated, for example. The first electronic component 320 contained in the substrate 310 is connected to wiring formed inside the substrate 310 for functioning. The first surface 311 of the substrate 310 is mounted with only the second electronic component 330.

The metal plate 340 is bonded to the second surface 312 of the substrate 310 so as to expose the portion of the second surface 312 of the substrate 310 projectively corresponding to the first electronic component 320. In this case, the metal plate 340 is arranged at a position corresponding to the second electronic component 330 on the second surface 312 of the substrate 310. The metal plate dissipates heat from the second electronic component 330 through the substrate 310.

When the substrate 310 contains the first electronic component 320 as mentioned above, the molding resin 360 also seals the portion of the first surface 311 of the substrate 310 projectively corresponding to the first electronic component 320 and the portion of the second surface 312 of the substrate 310 exposed from the metal plate 340 in sandwich style. A molding pressure is uniformly applied to the portion of the substrate 310 for arranging the first electronic component 320 from the first surface 311 and the second surface 312 of the substrate 310. The substrate 310 is not deformed.

Twenty-Fourth Embodiment

The following describes differences between the twenty-fourth embodiment and the sixteenth through twenty-third embodiments. While there have been described the embodiments that are structured to bond the metal plate 340 to the second surface 312 of the substrate 310 using the adhesive 341, the twenty-fourth embodiment will describe a structure that does not use the metal plate 340.

Figure 40:
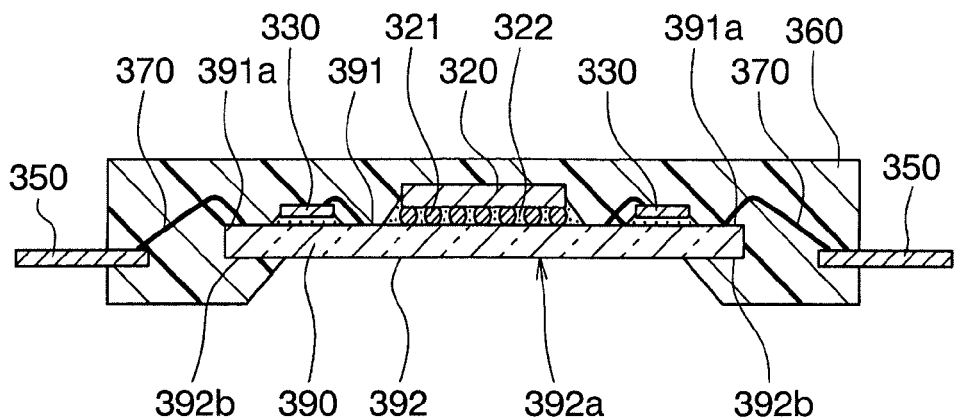
FIG. 40 is a schematic plan view of the electronic device according to a twenty-fourth embodiment.

FIG. 40 is a schematic plan view of the electronic device according to the twenty-fourth embodiment. As shown in FIG. 40, the electronic device includes a ceramic substrate 390, the first electronic component 320, the second electronic component 330, the lead frame 350, and the molding resin 360.

The ceramic substrate 390 includes a first surface 391 and a second surface 392 opposite to the first surface 391 and contains a wiring layer inside. The first electronic component 320 and the second electronic component 330 are mounted on the first surface 391 of the ceramic substrate 390. The metal plate 340 used for the above-mentioned embodiments are unnecessary because the ceramic substrate 390 features high radiation performance. Similarly to the sixteenth embodiment, an electric circuit on the ceramic substrate 390 is connected with the lead frame 350 through the wire 370.

The molding resin 360 seals the first surface 391 and the second surface 392 of the ceramic substrate 390 so as to expose an inner edge 392a of the second surface 392 of the ceramic substrate 390. Further, the molding resin 360 seals an outer edge 391a of the first surface 391 of the ceramic substrate 390 and an outer edge 392b of the second surface 392 of the ceramic substrate 390 in sandwich style.

The sealing is used for the following reason. As mentioned above, the ceramic substrate 390 contains the wiring layer inside. The ceramic substrate 390 warps at the outer edges 391a and 392b where a wiring density is low. A gap occurs between the lower mold 381 and the outer edge 391a of the ceramic substrate 390. When a molding pressure is applied to the outer edges 391a and 392b of the ceramic substrate 390, the outer edges 391a and 392b warp. The lower mold 381 presses the warped outer edges 391a and 392b. The ceramic substrate 390 is finally broken. To solve this problem, the first surface 391 and the second surface 392 of the ceramic substrate 390 seal the outer edges 391a and 392b thereof in sandwich style as described in this embodiment. A molding pressure is uniformly applied to the first surface 391 and the second surface 392 of the ceramic substrate 390, preventing the outer edges 391a and 392b thereof from being deformed and broken. Further, the embodiment solves such problem that the outer edges 391a and 392b of the ceramic substrate 390 slightly warp to let the molding resin 390 ooze onto the second surface 392 of the ceramic substrate 390 and cause a burr to be formed.

As a manufacturing method of the above-mentioned electronic device, a work is prepared so that the first electronic component 320 and the second electronic component 330 are mounted on the first surface 391 of the ceramic substrate 390. Using the molding apparatus, the molding resin 360 seals the first surface 391 and the second surface 392 of the ceramic substrate 390 so as to expose the inner edge 392a of the second surface 392 thereof. For this purpose, the protrusion 387 of the lower mold 381 just needs to contact the inner edge 392a of the second surface 392 of the ceramic substrate 390.

In order to seal the ceramic substrate 390 with the molding resin as mentioned above, the molding resin 360 seals the outer edge 391a of the first surface of the ceramic substrate 390 and the outer edge 392b of the second surface 392 thereof in sandwich style. A molding pressure of the molding resin 360 can be uniformly applied to the outer edges 391a and 392a of the ceramic substrate 390 from both the first surface 391 and the second surface 392 of the ceramic substrate 390. It is possible to prevent: a deflected force from being applied to the outer edges 391a and 392b of the ceramic substrate 390; the outer edges 391a and 392b from being warped; and the ceramic substrate 390 or the first electronic component 320 from being deformed.

As mentioned above, the outer edges 391a and 392b of the ceramic substrate 390 are subjected to warpage. The molding resin 360 may wrap the outer edges 391a and 392b so as to expose the inner edge 392a of the second surface 392 of the ceramic substrate 390 from the molding resin 360 for heat dissipation. The ceramic substrate 390 can be prevented from being deformed or destroyed.

Twenty-Fifth Embodiment

Figure 41:
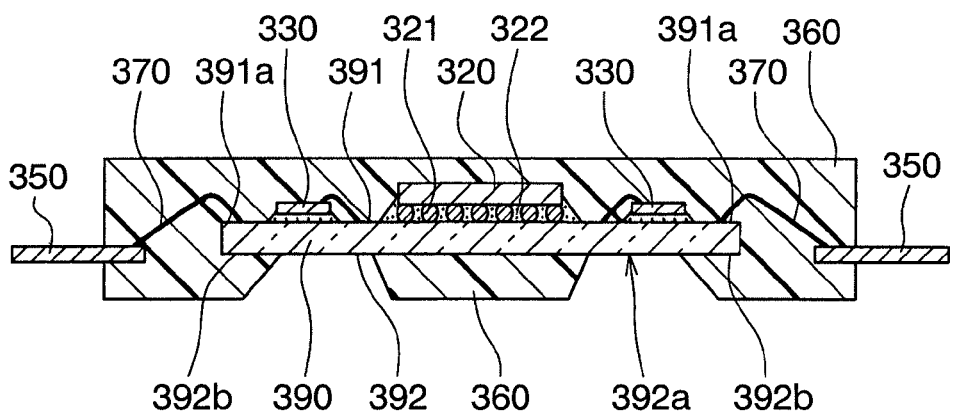
FIG. 41 is a schematic plan view of the electronic device according to a twenty-fifth embodiment.

The following describes differences between the twenty-fifth embodiment and the twenty-fourth embodiment. FIG. 41 is a schematic plan view of the electronic device according to the twenty-fifth embodiment. As shown in FIG. 41, the embodiment also provides the molding resin 360 for the inner edge 392a of the second surface 392 of the ceramic substrate 390. The molding resin 360 is positioned to a portion of the inner edge 392a of the second surface 392 of the ceramic substrate 390 projectively corresponding to the first electronic component 320.

According to this structure, the ceramic substrate 390 is sandwiched between the molding resin 360 on the first surface 391 and the second surface 392 of the ceramic substrate 390 at the inner edge 392a of the second surface 392 of the ceramic substrate 390. A uniform molding pressure is applied to the first surface 391 and the second surface 392 of the ceramic substrate 390. The ceramic substrate 390 is more unlikely deformed.

In particular, the ceramic substrate 390 is sandwiched between the first surface 391 and the second surface 392 of the ceramic substrate 390 at the location of the inner edge 392a of the second surface 392 of the ceramic substrate 390.

It is possible to prevent deformation of the ceramic substrate 390 but also destruction of the first electronic component 320 due to a molding pressure of the molding resin 360.

The shape of the protrusion 387 of the lower mold 381 for the molding apparatus may be changed to provide the molding resin 360 also for the inner edge 392a of the second surface 392 of the ceramic substrate 390.

Twenty-Sixth Embodiment

Figure 42:
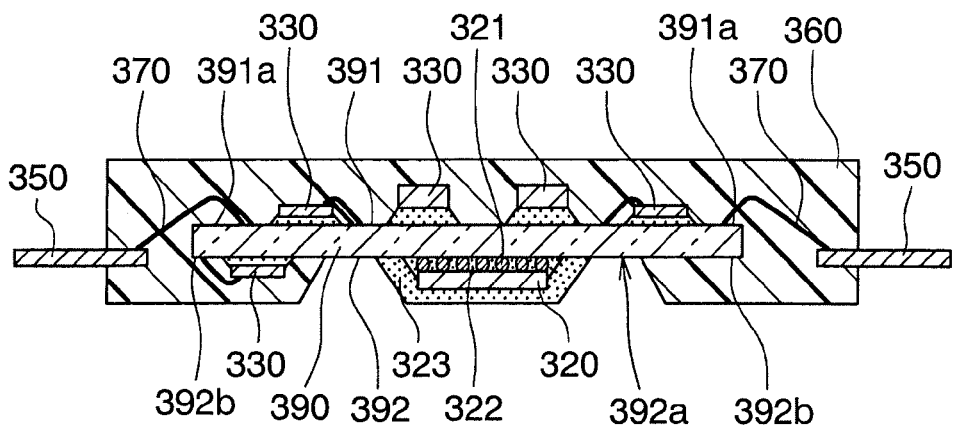
FIG. 42 is a schematic plan view of the electronic device according to a twenty-sixth embodiment.

The following describes differences between the twenty-sixth embodiment and the twenty-fourth and twenty-fifth embodiments. FIG. 42 is a schematic plan view of the electronic device according to the twenty-sixth embodiment. As shown in FIG. 42, only the second electronic component 330 is mounted on the first surface 391 of the ceramic substrate 390. The first electronic component 320 is mounted on the inner edge 392a of the second surface 392 of the ceramic substrate 390.

The first electronic component 320 can be mounted on the ceramic substrate 390 even when a component inappropriate for molding is used as the first electronic component 320. The first electronic component 320 inappropriate for molding includes MEMS, aluminum electrolytic capacitor, tantalum capacitor, and coil component.

Since the first electronic component 320 is mounted on a portion exposed from the molding resin 360, the first electronic component 320 inappropriate for molding is prevented from characteristic degradation or failure due to a molding pressure of the molding resin 360.

In addition, the first electronic component 320 is covered with a protection film 323. The protection film 323 uses resin, for example. The protection film 323 protects the first electronic component 320 independently of the molding resin 360.

As a manufacturing method of the above-mentioned electronic device, the second electronic component 330 is mounted on the first surface 391 of the ceramic substrate 390. As mentioned above, the molding resin 360 seals the electric circuit on the ceramic substrate 390 and the lead frame 350 that are connected with each other through the wire 370.

The first electronic component 320 is mounted on the inner edge 392a of the second surface 392 of the ceramic substrate 390. Finally, the protection film 323 covers the first electronic component 320 to complete the electronic device as shown in FIG. 42.

Other Embodiments

While FIGS. 31A, 31B, 33, and 34 show the structures using multiple metal plates 340, one of the metal plates 340 may have an opening projectively corresponding to the first electronic component 320.

The sixteenth through twenty-third embodiments bond the metal plate 340 to the second surface 312 of the substrate 310. The reason is to transfer the heat of the substrate 310 to the metal plate 340 and dissipate the heat outside. However, the metal plate 340 may not be used when radiation performance of the substrate 310 can be improved using thermal via holes. In this case, the substrate 310 can employ a wiring substrate such as a printed substrate.

The molding resin gate 385 shown in FIGS. 31B, 33, and 34 is positioned to a corner of the electronic device. This is just an example. As another example, the molding resin gate 385 may be positioned to the side of the electronic device.

The twenty-sixth embodiment shows the structure of covering the first electronic component 320 with the protection film 323. The protection film 323 may not be provided.

The above disclosure has the following aspects.

According to a first aspect of the present disclosure, an electronic device includes: a substrate having first and second surfaces, wherein the first surface is opposite to the second surface; a first electronic element mounted on the first surface of the substrate; a second electronic element mounted on the second surface of the substrate; and a resin mold sealing the first electronic element and the first surface of the substrate. The resin mold further seals the second electronic element on the second surface of the substrate. The second surface of the substrate has a portion, which is exposed from the resin mold. The second electronic element is not disposed on the portion of the second surface.

According to this configuration, the resin mold is injected to the portion of the second surface of the substrate corresponding to the second electronic element when the resin mold is used to seal the first and second electronic elements. The configuration decreases a stress of the resin mold on the ceramic substrate from the first surface of the substrate in comparison with a conventional technique that provides sealing by applying an adhesive softer than a molding resin to the second surface of a ceramic substrate. As a result, it is possible to prevent the substrate from cracking during a mold process. Thus, a molding resin stress applied on the substrate from one surface of the substrate during a mold process is reduced. The mold process is used for a half molded electronic device that includes the first electronic element mounted on the first surface of the substrate and the second electronic element mounted on the second surface thereof.

Alternatively, the electronic device may further include: a metal plate bonded to the portion of the second surface of the substrate via an adhesive. The metal plate has a surface opposite to the second surface, and the surface of the metal plate is exposed from the resin mold. In this manner, the radiation performance improves through the metal plate.

Further, the second surface of the substrate may further include a second portion, which is covered with the resin mold. The second electronic element is not disposed on the second portion of the second surface, and the resin mold on the second portion of the second surface protrudes outward from the surface of the metal plate. Furthermore, a periphery of the surface of the metal plate may be sealed with the resin mold. It is possible to decrease a stress on an interface between the metal plate and the resin mold to improve an effect of preventing the resin mold from peeling off the metal plate. Further, the periphery of the surface of the metal plate may include an indentation for preventing the resin mold from peeling off, and the indentation of the metal plate may be sealed with the resin mold. The resin mold can be prevented from peeling off that portion.

Alternatively, the portion of the second surface may be disposed around a center of the substrate, and the second portion of the second surface is disposed on a periphery of the substrate, and the resin mold on the second portion of the second surface may be thicker than the resin mold on the second electronic element. It is expected to prevent the substrate from warping because the electronic device is thicker at the center than at the periphery.

Alternatively, a surface of the resin mold on the second electronic element may be disposed on a same plane as the surface of the metal plate. The metal plate is able to easily contact with an external heat dissipation member.

Alternatively, the substrate may have a square plate shape, and the resin mold on the second electronic element may have a stripe shape extending from one side of the square plate shape to an opposite side. When the resin mold is injected to the second surface of the substrate, the resin mold easily flows from one of the pair of opposite sides to the other on the second surface. It is possible to more efficiently inject the resin mold.

According to a second aspect of the present disclosure, an electronic device includes: a ceramic substrate having first and second surfaces, wherein the first surface is opposite to the second surface; a first electronic element mounted on the first surface of the ceramic substrate; a metal plate bonded to a first portion of the second surface of the ceramic substrate via an adhesive; a second electronic element mounted on a second portion of the second surface of the ceramic substrate; and a resin mold sealing the ceramic substrate and the first and second electronic elements so as to expose the metal plate. The first portion of the second surface is different from the second portion of the second surface.

According to this configuration, the resin mold is injected to the portion of the second surface of the ceramic substrate corresponding to the second electronic element when the resin mold is used to seal the first and second electronic elements. The configuration decreases a stress of the resin mold on the ceramic substrate from the first surface of the substrate in comparison with a conventional technique that provides sealing by applying an adhesive softer than a molding resin to the second surface of a ceramic substrate. As a result, it is possible to prevent the ceramic substrate from cracking during a mold process.

Alternatively, the metal plate may not cover the second electronic element.

Alternatively, the metal plate may cover the second electronic element via the resin mold.

Alternatively, the second portion of the second surface may be a concavity with a bottom, and the second electronic element may be mounted on the bottom of the concavity. It is possible to reduce protrusion of the second electronic element over the second surface of the ceramic substrate and keep the size of the electronic device as small as possible in the thickness direction of the ceramic substrate.

According to a third aspect of the present disclosure, a manufacturing method of an electronic device includes: mounting a first electronic element on a first surface of a ceramic substrate; bonding a metal plate to a first portion of a second surface the ceramic substrate, wherein the second surface is opposite to the first surface; mounting a second electronic element on a second portion of the second surface of the ceramic substrate, wherein the second portion of the second surface is different from the first portion of the second surface; and sealing the ceramic substrate and the first and second electronic elements with a resin mold so as to expose the metal plate. The metal plate is bonded to the ceramic substrate via an adhesive. The second portion of the second surface is different from the first portion of the second surface, and the first and second electronic elements are simultaneously sealed with the resin mold.

According to this configuration, the resin mold is injected to both the first surface and second surface of the ceramic substrate when the resin mold is used to seal the first and second electronic elements. The configuration decreases a stress of the resin mold on the ceramic substrate from the first surface of the substrate in comparison with a conventional technique that provides sealing by applying an adhesive softer than a molding resin to the second surface of a ceramic substrate. As a result, it is possible to prevent the ceramic substrate from cracking during a mold process.

According to a fourth aspect of the present disclosure, a manufacturing method of an electronic device includes: mounting a first electronic element on a first surface of a ceramic substrate; bonding a metal plate to a first portion of a second surface of the ceramic substrate, wherein the second surface is opposite to the first surface; mounting a second electronic element on a second portion of the second surface of the ceramic substrate, wherein the second portion of the second surface is different from the first portion of the second surface; sealing the ceramic substrate and the first electronic element with a first resin mold so as to expose the metal plate; and sealing the second electronic element with a second resin mold at a molding temperature equal to a molding temperature of the first resin mold. The second resin mold has Young's modulus equal to or larger than 100 MPa, and the metal plate is bonded to the ceramic substrate via an adhesive.

According to this configuration, the portion of the second surface of the ceramic substrate corresponding to the second electronic element is provided with the sealing resin mold indicating Young's modulus of 100 MPa or more at a molding temperature of the resin mold for sealing when the resin mold is used to seal the first electronic element. The configuration decreases a stress of the resin mold on the ceramic substrate from the first surface of the substrate in comparison with a conventional technique that provides sealing by applying an adhesive softer than a molding resin to the second surface of a ceramic substrate. As a result, it is possible to prevent the ceramic substrate from cracking during a mold process.

According to a fifth aspect of the present disclosure, a manufacturing method of an electronic device includes: mounting a first electronic element on a first surface of a ceramic substrate; bonding a metal plate to a first portion of a second surface of the ceramic substrate, wherein the second surface is opposite to the first surface; mounting a second electronic element on a second portion of the second surface of the ceramic substrate, wherein the second portion of the second surface is different from the first portion; sealing the ceramic substrate, the metal plate and the first and second electronic elements with a resin mold; and removing a portion of the resin mold to expose the metal plate. The metal plate is bonded to the ceramic substrate via an adhesive.

The configuration decreases a stress of the resin mold on the ceramic substrate from the first surface of the substrate because the resin mold seals the entire of the ceramic substrate. As a result, it is possible to prevent the ceramic substrate from cracking during a mold process.

Alternatively, the manufacturing method may further include: forming a concavity on the second portion of the second surface of the ceramic substrate. The second electronic element is mounted on a bottom of the concavity.

According to a sixth aspect of the present disclosure, an electronic device includes: a substrate that includes a first surface and a second surface opposite to the first surface; an electronic element mounted on a first portion of the first surface of the substrate; a metal plate bonded to the second surface of the substrate so as to expose a second portion of the second surface of the substrate opposite to the electronic element; and a resin mold that seals the first surface of the substrate and seals the second surface of the substrate so as to expose the metal plate. The resin mold sandwiches the first portion of the first surface and the second portion of the second surface of the substrate.

According to the above device, the portion of the substrate for mounting the electronic element is uniformly applied with a molding pressure of the resin mold from both the first surface and the second surface of the substrate. The substrate can be structured to prevent a deflected force from being applied. It is possible to prevent deformation of the substrate and the electronic element. Thus, a structure is provided such that the structure prevents the substrate from being deformed due to a molding pressure of resin mold.

According to a seventh aspect of the present disclosure, an electronic device includes: a substrate that includes a first surface and a second surface opposite to the first surface; an electronic element disposed in the substrate; wherein the first surface includes a first portion corresponding to the electronic element; a metal plate bonded to a second surface of the substrate so as to expose a second portion of the second surface of the substrate opposite to the first portion of the first surface; and a resin mold that seals the first surface of the substrate and seals the second surface of the substrate so as to expose the metal plate. The resin mold sandwiches the first portion of the first surface and the second portion of the second surface of the substrate.

According to the above device, the portion of the substrate for mounting the electronic element is uniformly applied with a molding pressure of the resin mold from both the first surface and the second surface of the substrate. The substrate can be structured to prevent a deflected force from being applied. It is possible to prevent deformation of the substrate and the electronic element. Thus, a structure is provided such that the structure prevents the substrate from being deformed due to a molding pressure of resin mold.

Alternatively, the resin mold may cover an outer edge of the metal plate. It is possible to prevent the resin mold from peeling off the metal plate.

Alternatively, the second surface of the substrate may further include a third portion, which is covered with the resin mold. The metal plate is not disposed on the third portion of the second surface. The metal plate has a first height from the second surface of the substrate. The resin mold disposed on the second portion of the second surface has a second height from the second surface of the substrate. The resin mold disposed on the third portion of the second surface has a third height from the second surface of the substrate. The second height is larger than the first height, and smaller than the third height.

The above structure makes it possible to adjust a speed of injecting the resin mold on the second surface of the substrate during manufacture of the electronic device. A uniform molding pressure can be simultaneously applied to the first surface and the second surface of the substrate during resin seal. The substrate can be structured to prevent a deflected force from being applied.

Alternatively, the second surface of the substrate may further include a third portion, which is covered with the resin mold. The metal plate is not disposed on the third portion of the second surface. The metal plate has a first height from the second surface of the substrate. The resin mold disposed on the second portion of the second surface has a second height from the second surface of the substrate. The resin mold disposed on the third portion of the second surface has a third height from the second surface of the substrate. The first, second and third heights are equal to each other.

The second surface of the substrate ensures the same height and is structured to be flat. The electronic device can be easily mounted to the other members.

According to an eighth aspect of the present disclosure, an electronic device includes; a ceramic substrate having a first surface and a second surface opposite to the first surface; an electronic element is mounted on the first surface; and a resin mold that seals the first surface of the ceramic substrate and seals the second surface of the ceramic substrate so as to expose an inner portion of the second surface. The first surface has an outer edge, and the second surface has an outer edge, and the resin mold sandwiches the outer edge of the first surface and the outer edge of the second surface.

According to the above structure, a molding pressure of the resin mold is uniformly applied from both the first surface and the second surface of the ceramic substrate at outer edges of the ceramic substrate. The structure can prevent a deflected force from being applied to the outer edges of the ceramic substrate where the outer edges easily warp. It is possible to prevent deformation of the ceramic substrate and the electronic element.

Alternatively, the inner portion of the second surface may include a portion, on which the resin mold covers.

According to this structure, the ceramic substrate is sandwiched between the resin mold on the first surface and the resin mold on the second surface of the ceramic substrate. A uniform molding pressure is applied to the first surface and the second surface of the ceramic substrate at the inner portion on the second surface of the ceramic substrate.

In particular, the portion of the ceramic substrate for mounting the electronic element is sandwiched between the resin mold on the first surface and the second surface. It is possible to prevent the electronic element from being destroyed by a molding pressure of the resin mold.

According to a ninth aspect of the present disclosure, an electronic device includes: a ceramic substrate having a first surface and a second surface opposite to the first surface; an electronic element mounted on an inner portion of the second surface; and a resin mold that seals the first surface of the ceramic substrate and seals the second surface of the ceramic substrate so as to expose the electronic element and the inner portion of the second surface. The first surface has an outer edge (391*a*), and the second surface has an outer edge (392*b*), and the resin mold sandwiches the outer edge of the first surface and the outer edge of the second surface.

The above structure can uniformly apply a molding pressure of the resin mold from both the first surface and the second surface of the ceramic substrate at the outer edges of the ceramic substrate. The electronic element inappropriate for molding can be prevented from characteristic degradation or failure due to a molding pressure of the resin mold.

Alternatively, the electronic element may be covered with a protection film. The electronic element can be protected independently of the resin mold.

According to a tenth aspect of the present disclosure, a manufacturing method of an electronic device includes: mounting an electronic element on a first portion of a first surface of a substrate; bonding a metal plate on a second surface of the substrate so as to expose a second portion of the second surface of the substrate opposite to the electronic element; wherein the second surface is opposite to the first surface; and sealing the first surface of the substrate and the second surface of the substrate with a resin mold so as to expose the metal plate. The resin mold sandwiches the first portion of the first surface and the second portion of the second surface of the substrate.

According to the above method, a molding pressure of the resin mold can be applied to the portion of the substrate for mounting the electronic element from both the first surface and the second surface of the substrate. The structure can prevent a deflected force from being applied to the substrate and prevent deformation of the substrate and the electronic element.

According to an eleventh aspect of the present disclosure, a manufacturing method of an electronic device includes: forming an electronic element in a substrate; wherein the substrate includes a first surface and a second surface opposite to the first surface; and the first surface includes a first portion corresponding to the electronic element; bonding a metal plate to the second surface of the substrate so as to expose a second portion of the second surface of the substrate opposite to the first portion of the first surface; and sealing the first surface of the substrate and the second surface of the substrate with a resin mold so as to expose the metal plate. The resin mold sandwiches the first portion of the first surface and the second portion of the second surface of the substrate.

According to the above method, a molding pressure of the resin mold can be applied to the portion of the substrate for mounting the electronic element from both the first surface and the second surface of the substrate. The structure can prevent a deflected force from being applied to the substrate and prevent deformation of the substrate and the electronic element.

According to a twelfth aspect of the present disclosure, a manufacturing method of an electronic device includes: mounting an electronic element on a first surface of a ceramic substrate; wherein the ceramic substrate has the first surface and a second surface opposite to the first surface; and sealing the first surface of the ceramic substrate and the second surface of the ceramic substrate with a resin mold so as to expose an inner portion of the second surface. The first surface has an outer edge (391a), and the second surface has an outer edge (392b), and the resin mold sandwiches the outer edge of the first surface and the outer edge of the second surface.

According to the structure, a molding pressure of the resin mold is uniformly applied from both the first surface and the second surface of the ceramic substrate at outer edges of the ceramic substrate. The structure can prevent a deflected force from being applied to the outer edges of the ceramic substrate where the outer edges easily warp. It is possible to prevent deformation of the ceramic substrate and the electronic element.

According to a thirteenth aspect of the present disclosure, a manufacturing method of an electronic device includes: mounting an electronic element on an inner portion of a second surface of a ceramic substrate; wherein the ceramic substrate has a first surface and the second surface opposite to the first surface; sealing the first surface of the ceramic substrate and the second surface of the ceramic substrate with a resin mold so as to expose the electronic element and the inner portion of the second surface. The first surface has an outer edge (391a), and the second surface has an outer edge (392b), and the resin mold sandwiches the outer edge of the first surface and the outer edge of the second surface.

A molding pressure of the resin mold can be uniformly applied to the outer edges from both the first surface and the second surface of the ceramic substrate. Accordingly, the ceramic substrate can be prevented from deformation. Since the electronic element inappropriate for molding is not sealed with the resin mold, it is possible to prevent the electronic element from characteristic degradation or failure due to a molding pressure of the resin mold.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. An electronic device comprising:
    a substrate that includes a first surface and a second surface opposite to the first surface;
    an electronic element mounted on a first portion of the first surface of the substrate;
    a metal plate bonded to the second surface of the substrate so as to expose a second portion of the second surface of the substrate opposite to the electronic element; and
    a resin mold that seals the first surface of the substrate and seals the second surface of the substrate so as to expose the metal plate,
    wherein the resin mold sandwiches the first portion of the first surface and the second portion of the second surface of the substrate,
    wherein the resin mold seals entire area of the second portion of the second surface of the substrate,
    wherein the resin mold on the second portion of the second surface is the same as the resin mold on the first surface,
    wherein the resin mold covers an outer periphery of the metal plate, and
    wherein a thickness of the resin mold on the second portion of the second surface of the substrate is larger than a thickness of the metal plate on the second surface of the substrate.

2. The electronic device of claim 1,
    wherein the resin mold covers an outer edge of the metal plate.

3. The electronic device of claim 1,
    wherein the second surface of the substrate further includes a third portion, which is covered with the resin mold,
    wherein the metal plate is not disposed on the third portion of the second surface,
    wherein the metal plate has a first height from the second surface of the substrate,
    wherein the resin mold disposed on the second portion of the second surface has a second height from the second surface of the substrate,
    wherein the resin mold disposed on the third portion of the second surface has a third height from the second surface of the substrate, and
    wherein the second height is larger than the first height, and smaller than the third height.

4. The electronic device of claim 1,
    wherein the second surface of the substrate further includes a third portion, which is covered with the resin mold,
    wherein the metal plate is not disposed on the third portion of the second surface,
    wherein the metal plate has a first height from the second surface of the substrate,
    wherein the resin mold disposed on the second portion of the second surface has a second height from the second surface of the substrate,
    wherein the resin mold disposed on the third portion of the second surface has a third height from the second surface of the substrate, and
    wherein the first, second and third heights are equal to each other.

5. A manufacturing method of an electronic device comprising:
    mounting an electronic element on a first portion of a first surface of a substrate;
    bonding a metal plate on a second surface of the substrate so as to expose a second portion of the second surface of the substrate opposite to the electronic element, wherein the second surface is opposite to the first surface; and sealing the first surface of the substrate and the second surface of the substrate with a resin mold so as to expose the metal plate, wherein the resin mold sandwiches the first portion of the first surface and the second portion of the second surface of the substrate, wherein the resin mold seals an entire area of the second portion of the second surface of the substrate, wherein the resin mold on the second portion of the second surface is the same as the resin mold on the first surface, wherein the resin mold covers an outer periphery of the metal plate, and wherein a thickness of the resin mold on the second portion of the second surface of the substrate is larger than a thickness of the metal plate on the second surface of the substrate.

6. The manufacturing method of claim 5, wherein, in the sealing the first surface of the substrate and the second surface of the substrate, the resin mold covers an outer edge of the metal plate.

7. The manufacturing method of claim 5, wherein the second surface of the substrate further includes a third portion, which is covered with the resin mold, wherein the metal plate is not disposed on the third portion of the second surface, wherein the metal plate has a first height from the second surface of the substrate, wherein the resin mold disposed on the second portion of the second surface has a second height from the second surface of the substrate, wherein the resin mold disposed on the third portion of the second surface has a third height from the second surface of the substrate, and wherein the second height is larger than the first height, and smaller than the third height.

8. The manufacturing method of claim 5, wherein the second surface of the substrate further includes a third portion, which is covered with the resin mold, wherein the metal plate is not disposed on the third portion of the second surface, wherein the metal plate has a first height from the second surface of the substrate, wherein the resin mold disposed on the second portion of the second surface has a second height from the second surface of the substrate, wherein the resin mold disposed on the third portion of the second surface has a third height from the second surface of the substrate, and wherein the first, second and third heights are equal to each other.

9. The electronic device of claim 1, wherein the resin mold is a single body.

* * * * *